United States Patent
Chae et al.

(10) Patent No.: US 7,368,753 B2
(45) Date of Patent: May 6, 2008

(54) THIN FILM TRANSISTOR ARRAY SUBSTRATE AND FABRICATING METHOD THEREOF

(75) Inventors: Gee Sung Chae, Incheon (KR); Woo Hyun Kim, Seoul (KR); Yong Bum Kim, Seoul (KR); Jin Wuk Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 30 days.

(21) Appl. No.: 11/019,946

(22) Filed: Dec. 23, 2004
(Under 37 CFR 1.47)

(65) Prior Publication Data
US 2005/0253978 A1  Nov. 17, 2005

(30) Foreign Application Priority Data
Dec. 27, 2003  (KR)  ........................ 10-2003-0098102

(51) Int. Cl.
*H01L 29/04* (2006.01)
*H01L 31/036* (2006.01)
*G02F 1/1343* (2006.01)

(52) U.S. Cl. .................. 257/72; 257/59; 257/E21.414; 349/141

(58) Field of Classification Search ................... 438/30, 438/155, 158, 164, 942, 945; 257/59, 72, 257/E21.414; 349/140–141, 143
See application file for complete search history.

(56) References Cited

U.S. PATENT DOCUMENTS

| | | | | |
|---|---|---|---|---|
| 5,772,905 A | * | 6/1998 | Chou | 216/44 |
| 6,517,995 B1 | * | 2/2003 | Jacobson et al. | 430/320 |
| 6,642,071 B2 | * | 11/2003 | Cheng | 438/22 |
| 6,908,861 B2 | * | 6/2005 | Sreenivasan et al. | 438/694 |
| 6,911,385 B1 | * | 6/2005 | Haubrich et al. | 438/610 |
| 6,936,181 B2 | * | 8/2005 | Bulthaup et al. | 216/44 |
| 7,001,541 B2 | * | 2/2006 | Dhar | 264/1.27 |
| 2001/0013914 A1 | * | 8/2001 | Lee | 349/141 |
| 2002/0030782 A1 | * | 3/2002 | Lee | 349/143 |
| 2002/0167633 A1 | * | 11/2002 | Park et al. | 349/141 |
| 2003/0085406 A1 | * | 5/2003 | Cheng | 257/72 |

* cited by examiner

*Primary Examiner*—Shouxiang Hu
(74) *Attorney, Agent, or Firm*—Morgan, Lewis & Bockius LLP

(57) ABSTRACT

A thin film transistor array substrate includes a first conductive pattern group including a gate electrode of a thin film transistor and a gate line connected to the gate electrode; a semiconductor pattern defining a channel of the thin film transistor; a second conductive pattern group including source and drain electrodes of the thin film transistor and a data line crossing the gate line, a pixel area being defined by the data line crossing the gate line; a third conductive pattern group having a pixel electrode connected to the thin film transistor; and at least one dummy pattern disposed between at least one of the first to third conductive pattern groups and an adjacent one of the semiconductor patterns.

7 Claims, 73 Drawing Sheets

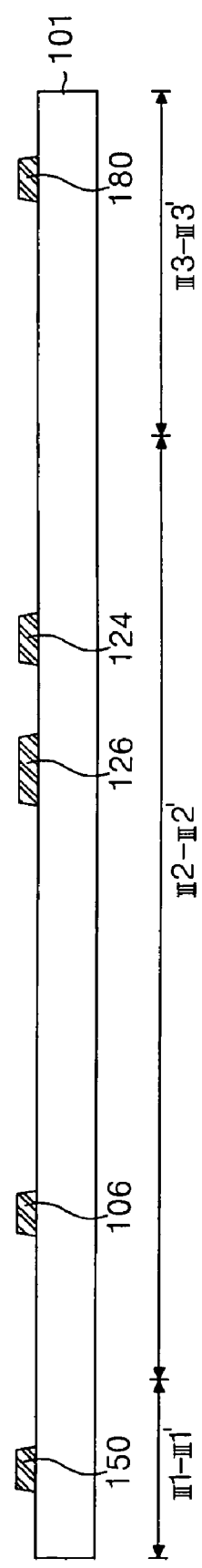

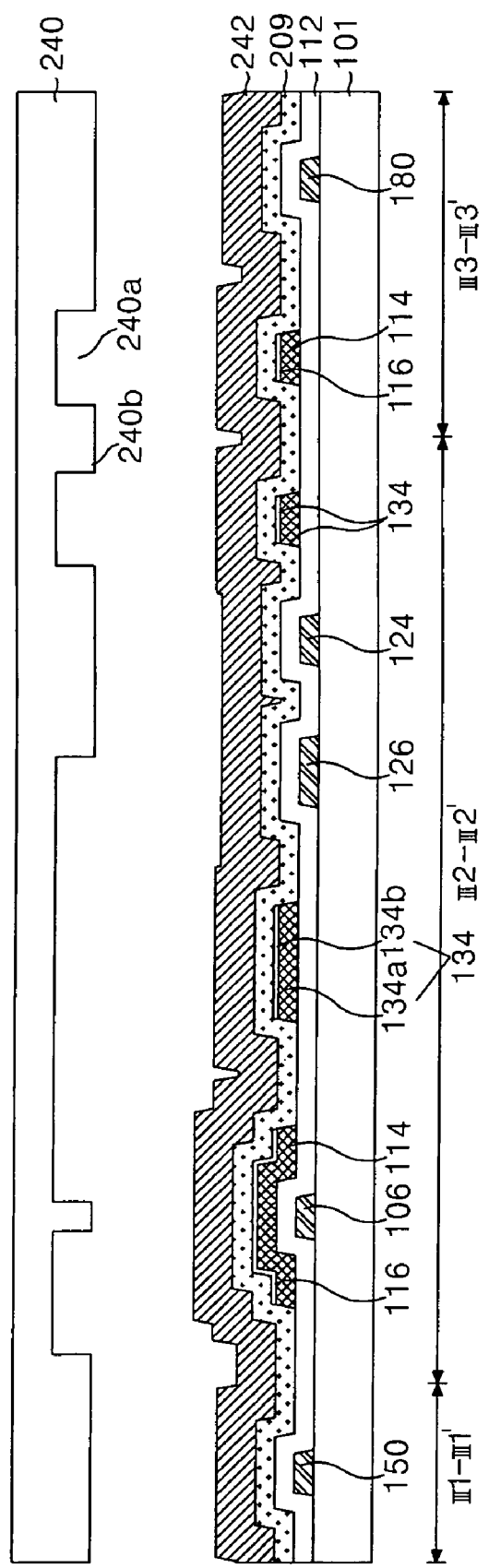

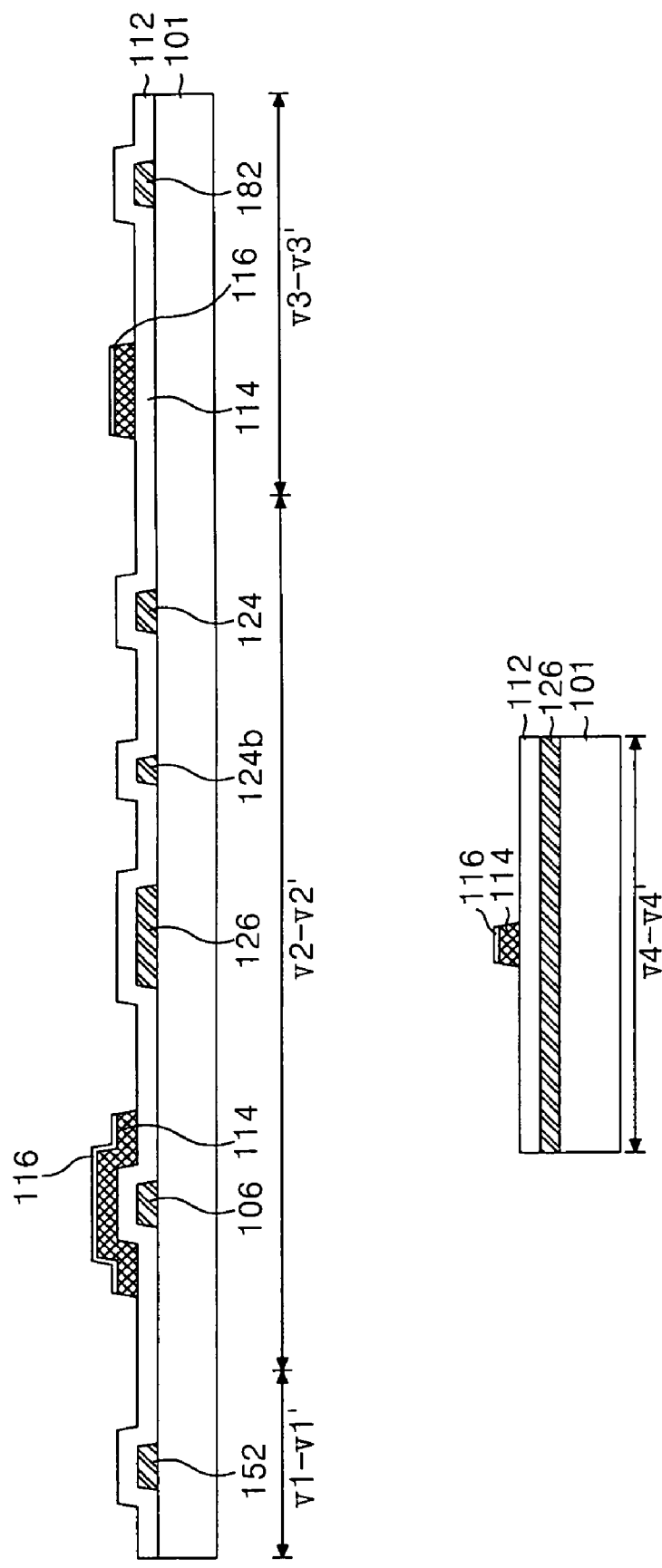

THIN FILM TRANSISTOR ARRAY SUBSTRATE AND FABRICATING METHOD THEREOF

This application claims the benefit of Korean Patent Application No. 2003-98102 filed in Korea on Dec. 27, 2003, which is hereby incorporated by reference.

BACKGROUND OF THE INVENTION

1. Field of the Invention

The present invention relates to a liquid crystal display panel using a horizontal electric field, and more particularly, to a thin film transistor array substrate of such a liquid crystal display panel and a fabricating method thereof.

2. Description of the Related Art

Generally, liquid crystal displays (LCD's) control light transmittance of liquid crystal using an electric field, thereby displaying a picture. Liquid crystal displays are largely classified into a vertical electric field type and a horizontal electric field type depending upon the direction of the electric field driving the liquid crystal. The liquid crystal display of vertical electric field applying type drives a liquid crystal in a twisted nematic (TN) mode with a vertical electric field formed between a pixel electrode and a common electrode arranged in opposition to each other on the upper and lower substrate. The liquid crystal display of vertical electric field type has an advantage of a large aperture ratio while having a drawback of a narrow viewing angle of about 90°. The liquid crystal display of the horizontal electric field applying type drives a liquid crystal in an in plane switch (IPS) mode with a horizontal electric field between the pixel electrode and the common electrode arranged parallel to each other on the lower substrate. The liquid crystal display of a horizontal electric field type has an advantage of a wide viewing angle (i.e., up to about 160°).

Hereinafter, the liquid crystal display of horizontal electric field type will be described in detail. The liquid crystal display of the horizontal electric field type includes a thin film transistor array substrate and a color filter array substrate joined to each other, a spacer for uniformly maintaining a cell gap between two substrates, and a liquid crystal filled into a liquid crystal space defined by the spacer. The thin film transistor array substrate comprises a plurality of signal lines for forming a horizontal electric field in each pixel, a plurality of thin film transistors, and an alignment film coated thereon to align the liquid crystal. The color filter array substrate includes a color filter for implementing a color, a black matrix for preventing a light leakage, and an alignment film coated thereon to align the liquid crystal.

FIG. 1 is a plan view showing a structure of a thin film transistor array substrate of a related art liquid crystal display of horizontal electric type, and FIG. 2 is a cross-sectional view of the thin film transistor array substrate taken along line I-I' of FIG. 1. Referring to FIG. 1 and FIG. 2, the thin film transistor array substrate of the related art liquid crystal display of horizontal electric field type includes a gate line 2 and a data line 4, which intersect each other provided on a lower substrate 1, a thin film transistor 30 provided at each intersection, a pixel electrode 22 and a common electrode 24 provided in a pixel area defined by the intersecting gate and data lines, and a common line 26 connected to the common electrode 24. Further, the thin film transistor array substrate includes a storage capacitor 40 provided at an overlapped portion between the pixel electrode 22 and the common line 26, a gate pad 50 connected to the gate line 2, a data pad 60 connected to the data line 4 and a common pad 80 connected to the common line 26.

The thin film transistor 30 allows a pixel signal of the data line 4 to be charged and maintained on the pixel electrode 22 in response to a gate signal of the gate line 2. To this end, the thin film transistor 30 includes a gate electrode 6 connected to the gate line 2, a source electrode 8 connected to the data line 4, and a drain electrode 10 connected to the pixel electrode 22. Further, the thin film transistor 30 includes an active layer 14 overlapping the gate electrode 6 with a gate insulating film 12 therebetween to define a channel between the source electrode 8 and the drain electrode 10. The active layer 14 also overlaps the data line 4, a lower data pad electrode 62 and a storage electrode 28. On the active layer 14, ohmic contact layer 16 for making an ohmic contact with the data line 4, the source electrode 8, the drain electrode 10, the lower data pad electrode 62 and the storage electrode 28 are further provided.

The pixel electrode 22 is connected via a first contact hole 32 going through a protective film 18, to the drain electrode 10 of the thin film transistor 30 and is provided in the pixel area. Particularly, the pixel electrode 22 includes a first horizontal portion 22a connected to the drain electrode 10 and provided parallel with adjacent gate lines 2, a second horizontal portion 22c overlapping with the common line 26, and a finger portion 22b provided in parallel to the common electrode 24 between the first and second horizontal portions 22a and 22b. The common electrode 24 is connected to the common line 26 and is provided at the pixel area. Specifically, the common electrode 24 is provided parallel to the finger portion 22b of the pixel electrode 22 in the pixel area. Accordingly, a horizontal electric field is formed between the pixel electrode 22 to which a pixel signal is supplied via the thin film transistor 30 and the common electrode 24 to which a reference voltage is supplied via the common line 26. More specially, the horizontal electric field is formed between the finger portion 22b of the pixel electrode 22 and the common electrode 24. Liquid crystal molecules arranged in the horizontal direction between the thin film transistor array substrate and the color filter array substrate by such a horizontal electric field are rotated due to a dielectric anisotropy. Transmittance of a light transmitting the pixel area is differentiated depending upon a rotation extent of the liquid crystal molecules, thereby implementing a gray level scale.

The storage capacitor 40 consists of the gate line 2, the storage electrode 28 overlapping the gate line 2 having the gate insulating film 12, the active layer 14 and the ohmic contact layer 16 therebetween, and the pixel electrode 22 connected, via a second contact hole 34 going through the protective film 18, to the storage electrode 28. The storage capacitor 40 allows a pixel signal charged on the pixel electrode 22 to be stably maintained until the next pixel signal is charged. The gate line 2 is connected, via the gate pad 50, to a gate driver (not shown). The gate pad 50 consists of a lower gate pad electrode 52 extended from the gate line 2, and an upper gate pad electrode 58 connected, via a third contact hole 54 going through the gate insulating film 12 and the protective film 18, to the lower gate pad electrode 52. The data line 4 is connected, via the data pad 60, to the data driver (not shown). The data pad 60 consists of a lower data pad electrode 62 extended from the data line 4, and an upper data pad electrode 68 connected, via a fourth contact hole 64 going through the protective film 18, to the lower data pad electrode 62. The common line 26 receives a reference voltage from an external reference voltage source (not shown) through the common pad 80. The common pad 80 consists of a lower common pad electrode 82 extended from the common line 86, and an upper common pad electrode 88 connected, via a fifth contact hole 84 going through the gate insulating film 12 and the protective film 18, to the lower common pad electrode 82.

A method of fabricating the thin film transistor array substrate having the above-mentioned structure will be described in detail with reference to FIGS. 3A to 3J. First, as shown in FIG. 3A, a gate metal layer 5 is formed on the lower substrate 1 by a deposition technique, such as sputtering. Then, a photo-resist pattern 72 is formed by photolithography, including exposure and development processes using a first mask 70 defining a shielding area S2 and an exposure area S1. The gate metal layer 5 is patterned by an etching process using the photo-resist pattern 72, thereby providing a first conductive pattern group including the gate line 2, the gate electrode 6, the lower gate pad electrode 52, the common line 26, the common electrode 24 and the lower common pad electrode 82 on the lower substrate 1 as shown in FIG. 3B.

As shown in FIG. 3C, the gate insulating film 12, an amorphous silicon layer 13 and an n+ amorphous silicon layer 15 are sequentially formed on the lower substrate 1 by a deposition technique, such as PECVD or sputtering, etc. Then, a photo-resist pattern 76 is formed by the photolithography including exposure and development process using a second mask 74 defining a shielding area S2 and an exposure area S1. The amorphous silicon layer 13 and the n+ amorphous silicon layer 15 are patterned by an etching process using the photo-resist pattern 76, thereby providing a semiconductor pattern including the active layer 14 and the ohmic contact layer 16 on the lower substrate 1, as shown in FIG. 3D.

As shown in FIG. 3E, a data metal layer 9 is formed on the gate insulating film 12 provided with the semiconductor pattern by a deposition technique, such as sputtering, etc. Then, a photo-resist pattern 90 is formed by photolithography including exposure and development process using a third mask 78 defining a shielding area S2 and an exposure area S1. The data metal layer 9 is patterned by the etching process using the photo-resist pattern 90, thereby providing a second conductive pattern group including the data line 4, the source electrode 8, the drain electrode 10, the storage electrode 28 and the lower data pad electrode 62 on the lower substrate 1, as shown in FIG. 3F. Subsequently, the exposed ohmic contact layer 16 between the source electrode 8 and the drain electrode 10 are etched by utilizing the source electrode 8 and the drain electrode 10 as a mask. Thus, the active layer 14 at the channel portion of the thin film transistor 30 is exposed.

As shown in FIG. 3G, the protective film 18 is entirely formed on the gate insulating film 12 provided with the second conductive pattern by a deposition technique such as PECVD, etc. Then, a photo-resist pattern 94 is formed by the photolithography including exposure and development process using a fourth mask 2 defining a shielding area S2 and an exposure area S1. The protective film 18 is patterned by an etching process using the photo-resist pattern 94, thereby providing the first to fifth contact holes 32, 34, 54, 64 and 84 as shown in FIG. 3H. As shown in FIG. 3I, a transparent conductive film 21 is coated onto the protective film 18 having the first to fifth contact holes 32, 34, 54, 64 and 84 by a deposition technique such as the sputtering, etc. Then, a photo-resist pattern 98 is formed by photolithography including exposure and development process using a fifth mask 96 defining a shielding area S2 and an exposure area S1. The transparent conductive film 21 is patterned by an etching process using the photo-resist pattern 98 to thereby provide a third conductive pattern group including the pixel electrode 22, the upper gate pad electrode 58, the upper data pad electrode 68 and the upper common pad electrode 88, as shown in FIG. 3J.

As described above, in the related art thin film transistor array substrate and a fabricating method thereof, the photolithography process is a series of processes including photo-resist coating, mask alignment, light-exposure, development and stripping, etc. Such photolithography process has the problems of a long process requirement time, a large waste of a stripper liquid for removing the photo-resist and the photo-resist pattern and expensive equipment such as an exposure device, etc. Particularly, as a dimension of the substrate is made larger and a size of the pattern becomes smaller, the cost of the exposure device increases.

SUMMARY OF THE INVENTION

Accordingly, the present invention is directed to a thin film transistor array substrate and fabricating method thereof that substantially obviates one or more of the problems due to limitations and disadvantages of the related art.

An object of the present invention is to provide a thin film transistor array substrate and a fabricating method thereof that are capable of performing a patterning process without any photolithography process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor array substrate comprises a first conductive pattern group including a gate electrode of a thin film transistor and a gate line connected to the gate electrode; a semiconductor pattern defining a channel of the thin film transistor; a second conductive pattern group including source and drain electrodes of the thin film transistor and a data line crossing the gate line, a pixel area being defined by the data line crossing the gate line; a third conductive pattern group having a pixel electrode connected to the thin film transistor; and at least one dummy pattern disposed between at least one of the first to third conductive pattern groups and an adjacent one of the semiconductor patterns.

In another aspect, a thin film transistor array substrate comprises a plurality of pixel electrodes and a plurality of common electrodes disposed parallel to each other for every pixel cell, wherein at least one of the pixel electrodes and the common electrodes has an upper portion commonly connected via a first horizontal portion and a lower portion commonly connected via a second horizontal portion.

In another aspect, a method of fabricating a thin film transistor array substrate, comprises the steps of forming a first conductive pattern group including a gate electrode of a thin film transistor and a gate line connected to the gate electrode; forming a semiconductor pattern defining a channel of the thin film transistor and at least one of dummy pattern positioned between adjacent semiconductor patterns; and forming a second conductive pattern group including source and drain electrodes of the thin film transistor, a data line crossing the gate line, and a pixel electrode connected to the drain electrode, a pixel area being defined by the data line crossing the gate line, wherein any at least one of the first conductive pattern group, the semiconductor pattern, the dummy pattern, the second conductive pattern group and the third conductive pattern group is formed using an etch resist and a soft mold.

In another aspect, a method of fabricating a thin film transistor array substrate comprises the steps of forming a first conductive pattern group including a gate electrode of a thin film transistor and a gate line connected to the gate electrode on a substrate surface; forming a semiconductor pattern defining a channel of the thin film transistor and at least one dummy pattern positioned between adjacent semiconductor patterns; forming a second conductive pattern group including source and drain electrodes of the thin film transistor, a data line crossing the gate line, and at least one first pixel electrode positioned between adjacent data lines, a pixel area being defined by the data line crossing the gate line; and forming a third conductive pattern group having a second pixel electrode connected to the drain electrode, wherein at least one of the first conductive pattern group, the semiconductor pattern, the dummy pattern, the second conductive pattern group, and the third conductive pattern group is formed using an etch resist and a soft mold.

In another aspect, a method of fabricating a thin film transistor array substrate, comprises the step of forming a plurality of pixel electrodes and a plurality of common electrodes parallel to each other in every pixel cell, wherein at least one of the pixel electrodes and the common electrodes has an upper portion commonly connected via a first horizontal portion and a lower portion commonly connected via a second horizontal portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 13A to FIG. 13C are cross-sectional views for specifically explaining the first soft molding process in the method of fabricating the thin film transistor array substrate according to the second embodiment of the present invention, FIG. 17A to FIG. 17C are cross-sectional views for specifically explaining the third soft molding process in the method of fabricating the thin film transistor array substrate according to the second embodiment of the present invention.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of the present invention will be described in detail with reference to FIGS. 4 to 34B.

Figure 4:
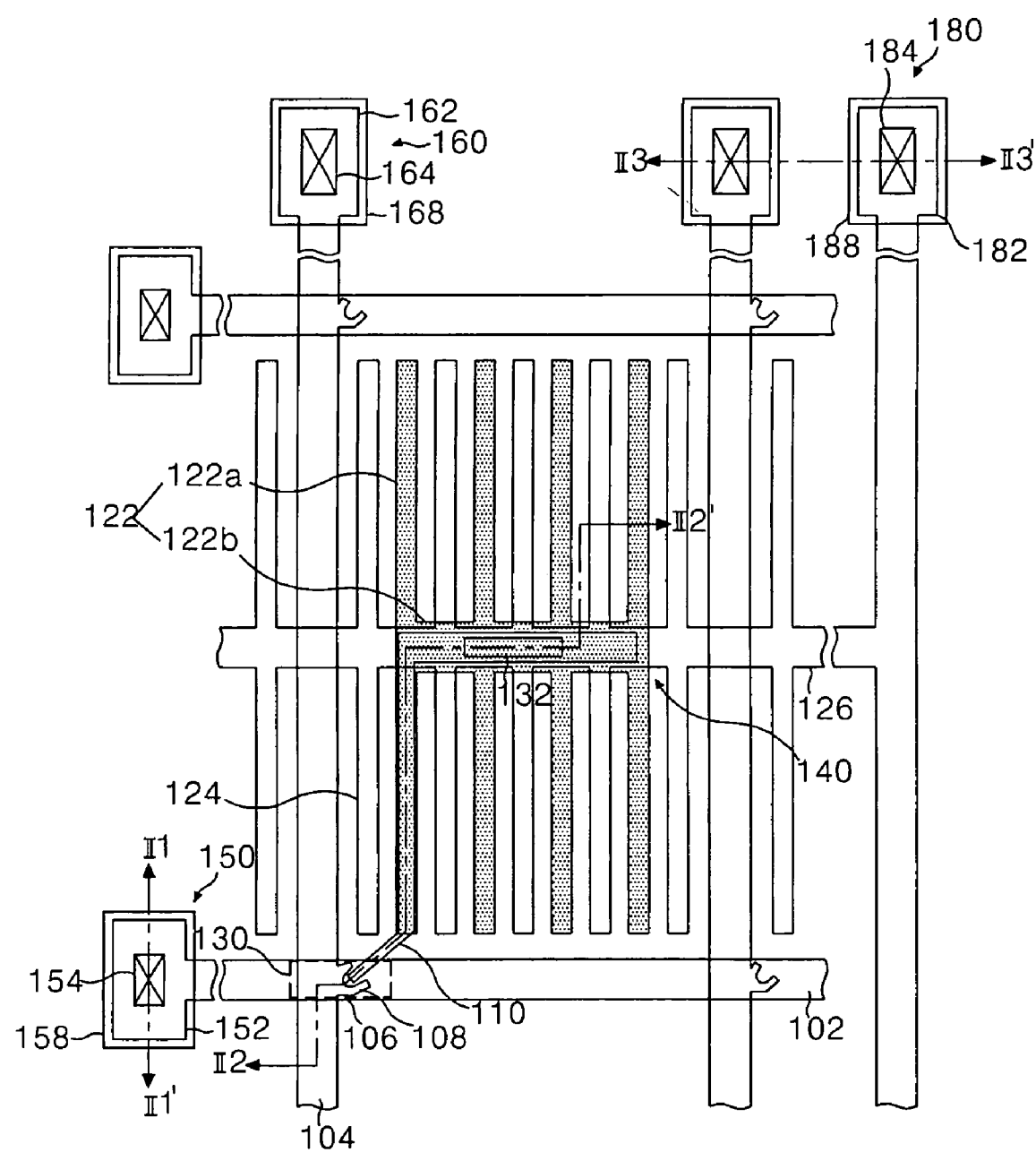
FIG. 4 is a plan view showing a structure of a thin film transistor array substrate in a liquid crystal display panel of horizontal electric field type according to a first exemplary embodiment of the present invention.
Figure 5:
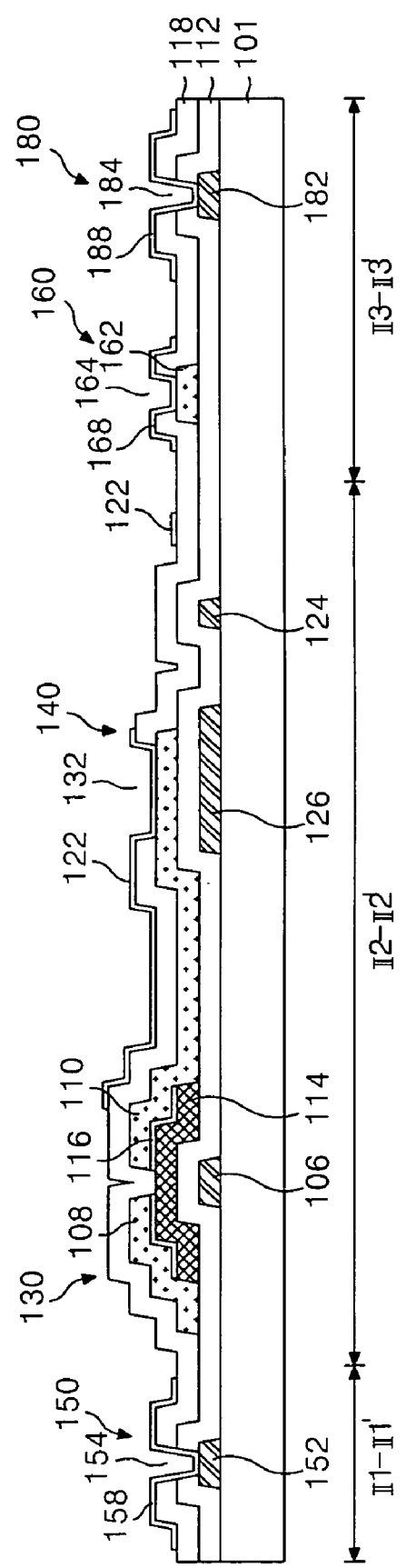
FIG. 5 is a cross-sectional view of the thin film transistor array substrate taken along lines II1-II1', II2-II2' and II3-II3' of FIG. 4, and FIG. 6A to FIG. 6E are plan views for explaining a method of fabricating the thin film transistor array substrate according to the first embodiment of the present invention.

FIG. 4 is a plan view showing a structure of a thin film transistor array substrate in a liquid crystal display panel of horizontal electric field type according to a first exemplary embodiment of the present invention, and FIG. 5 is a cross-sectional view of the thin film transistor array substrate taken along lines II1-II1', II2-II2' and II3-II3' of FIG. 4.

Referring to FIG. 4 and FIG. 5, the thin film transistor array substrate of the liquid crystal display panel includes a gate line 102 and a data line 104 provided on a lower substrate 101 intersecting each other with a gate insulating pattern 112 therebetween, a thin film transistor 130 provided at each intersection, a pixel electrode 122 and a common electrode 124 provided in a pixel area defined by the gate and data lines, and a common line 126 for supplying a reference voltage to the common electrode 124. Further, the thin film transistor array substrate includes a storage capacitor 140 provided at an overlapped portion between the pixel electrode 122 and the common line 126, a gate pad 150 extended from the gate line 102, and a data pad 160 extended from the data line 104 and a common pad 180 extended from the common line 126. The gate line 102 is for supplying a gate signal and the data line 104 is for supplying a data signal. The common line 126 for supplying a reference voltage for driving a liquid crystal is provided across the pixel area in a direction parallel to the gate line 102.

The thin film transistor 130 allows a pixel signal of the data line 104 to be charged and maintained on the pixel electrode 122 in response to the gate signal of the gate line 102. To this end, the thin film transistor 130 includes a gate electrode 106 included in the gate line 102, a source electrode 108 connected to the data line 104 and having at least two protrusions, and a drain electrode 110 connected to the pixel electrode 122. Further, the thin film transistor 130 includes an active layer 114 overlapping the gate electrode 106 with a gate insulating pattern 112 therebetween. A channel is defined in the active layer 114 between the source electrode 108 and the drain electrode 110. The active layer 114 also overlaps the data line 104. On the active layer 114, an ohmic contact layers 116 for making an ohmic contact with the drain electrode 110 and the data line 104 are further provided.

The pixel electrode 122 is connected, via a first contact hole 132, to the drain electrode 110 of the thin film transistor 130 and is provided in the pixel area. The pixel electrode 122 includes a vertical portion 122a provided in parallel to the data line 104, and a horizontal portion 122b connected to the vertical portion 122a and provided in parallel to the gate line 102. The common electrode 124 is connected to the common line 126 and is provided in the pixel area. Particularly, the common electrode 124 is arranged in parallel with the vertical portions 122a of the pixel electrode 122. Accordingly, a horizontal electric field is formed between the pixel electrode 122 to which a pixel signal is supplied via the thin film transistor 130 and the common electrode 124 to which a reference voltage is supplied via the common line 126. Liquid crystal molecules arranged in the horizontal direction between the thin film transistor array substrate and the color filter array substrate by the horizontal electric field are rotated due to a dielectric anisotropy. Transmittance of a light through the pixel area is differentiated depending upon a rotation extent of the liquid crystal molecules, thereby implementing a gray level scale.

The storage capacitor 140 is defined by the common line 126, the drain electrode 110 overlapping the common line 126 with the gate insulating film therebetween, and the pixel electrode 122 connected, via a first contact hole 132 defined at the protective film 118, to the drain electrode 110. The storage capacitor 140 allows a pixel signal charged on the pixel electrode 122 to be maintained stably until the next pixel signal is charged. The gate pad 150 is connected to a gate driver (not shown) to apply a gate signal from the gate driver to the gate line 102. The gate pad 150 comprises a lower gate pad electrode 152 extended from the gate line 102, and an upper gate pad electrode 158 connected, via a second contact hole 154 passing through the gate insulating film 112 and the protective film 118, to the lower gate pad electrode 152. The data pad 160 is connected to a data driver (not shown) to apply a data signal from the data driver to the data line 104. The data pad 160 comprises a lower data pad electrode 162 extended from the data line 104, and an upper data pad electrode 168 connected, via a third contact hole 164 passing through the protective film 118, to the lower data pad electrode 162. The common pad 180 receives a reference voltage from an external reference voltage source (not shown) to apply it to the common line 126. The common pad 180 comprises a lower common pad electrode 182 extended from the common line 126, and an upper common pad electrode 188 connected, via a fourth contact hole 184 passing through the gate insulating film 112 and the protective film 118, to the lower common pad electrode 182.

FIG. 6A to FIG. 6E are plan views for explaining a method of fabricating the thin film transistor array substrate shown in FIG. 4 and FIG. 5.

Figure 6A:
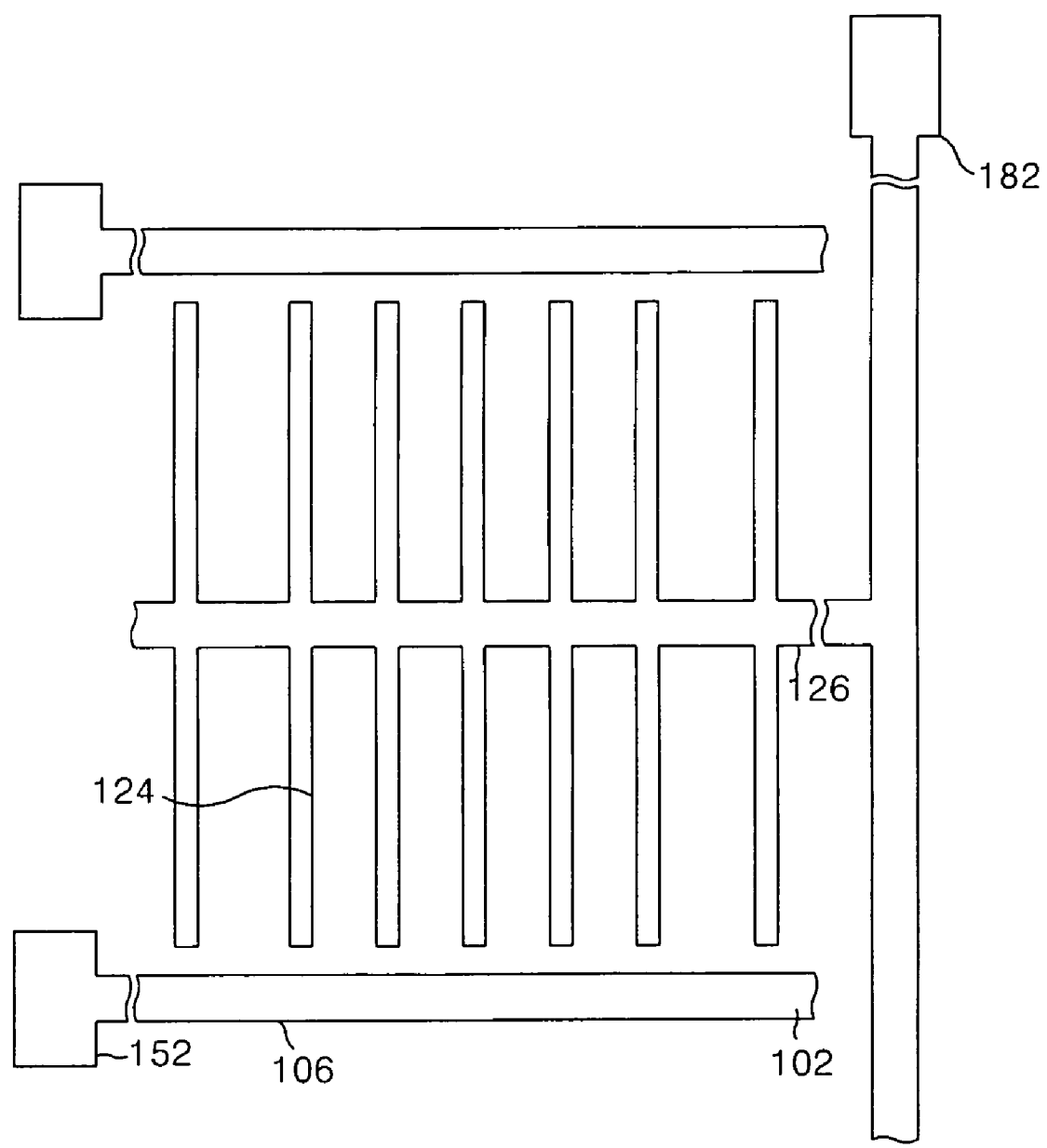

First, a gate metal layer is deposited onto the substrate and then the gate metal layer is patterned by the pressing process and the etching process using a first soft mold, thereby providing a first conductive pattern group including the gate electrode 106, the gate line 102, the lower gate pad electrode 152, the common electrode 124, the common line 126 and the lower common pad electrode 182 on the substrate as shown in FIG. 6A.

Figure 6B:
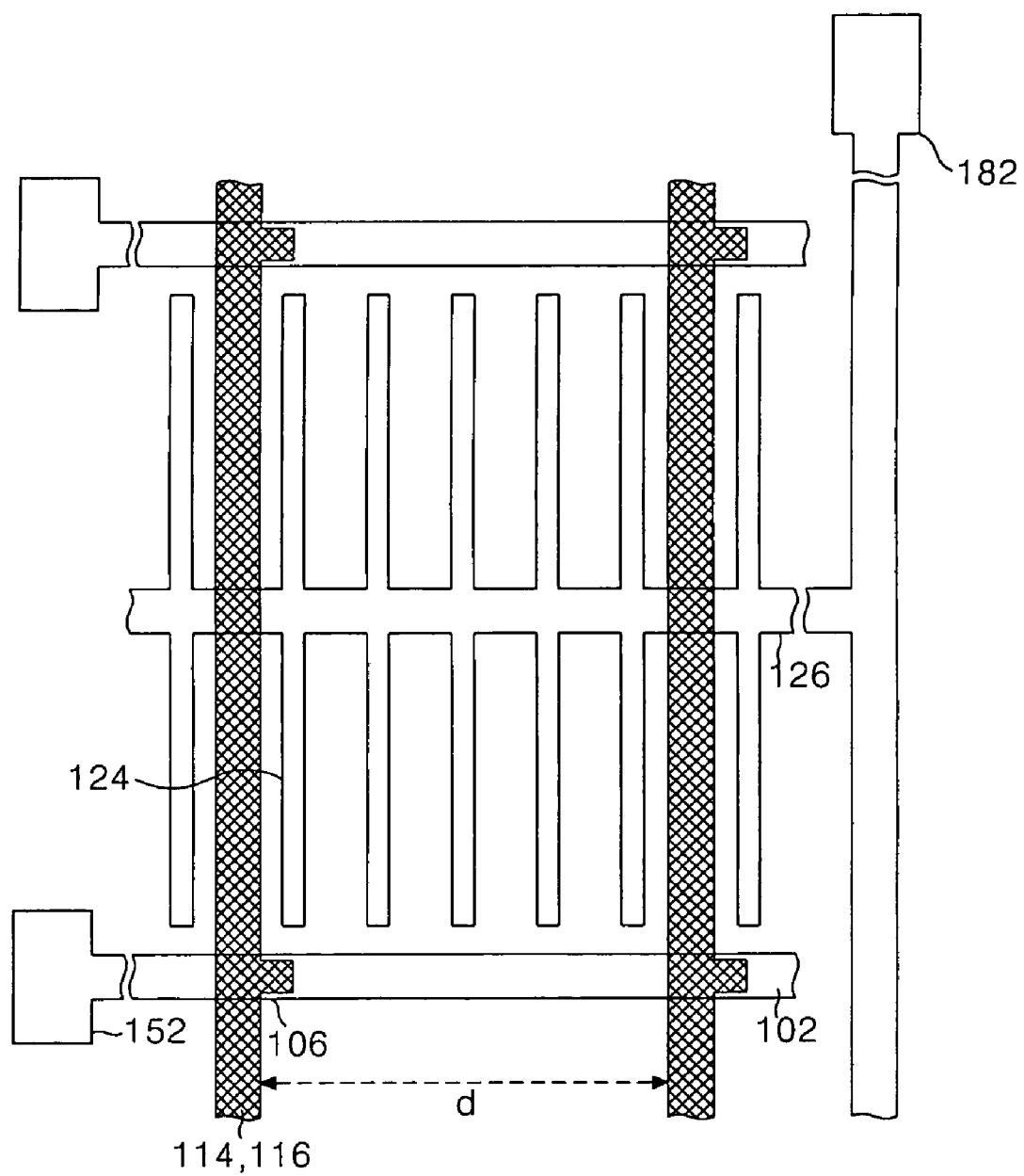

A gate insulating film, an amorphous silicon layer and an n$^+$ amorphous silicon layer are sequentially formed on the lower substrate 101 provided with the first conductive pattern group by a deposition technique, such as PECVD. Then, the amorphous silicon layer and the n$^+$ amorphous silicon layer are patterned by the pressing process and the etching process using a second soft mold, thereby providing a semiconductor pattern including the active layer 114 and the ohmic contact layer 116 on the gate insulating film, as shown in FIG. 6B.

Figure 6C:
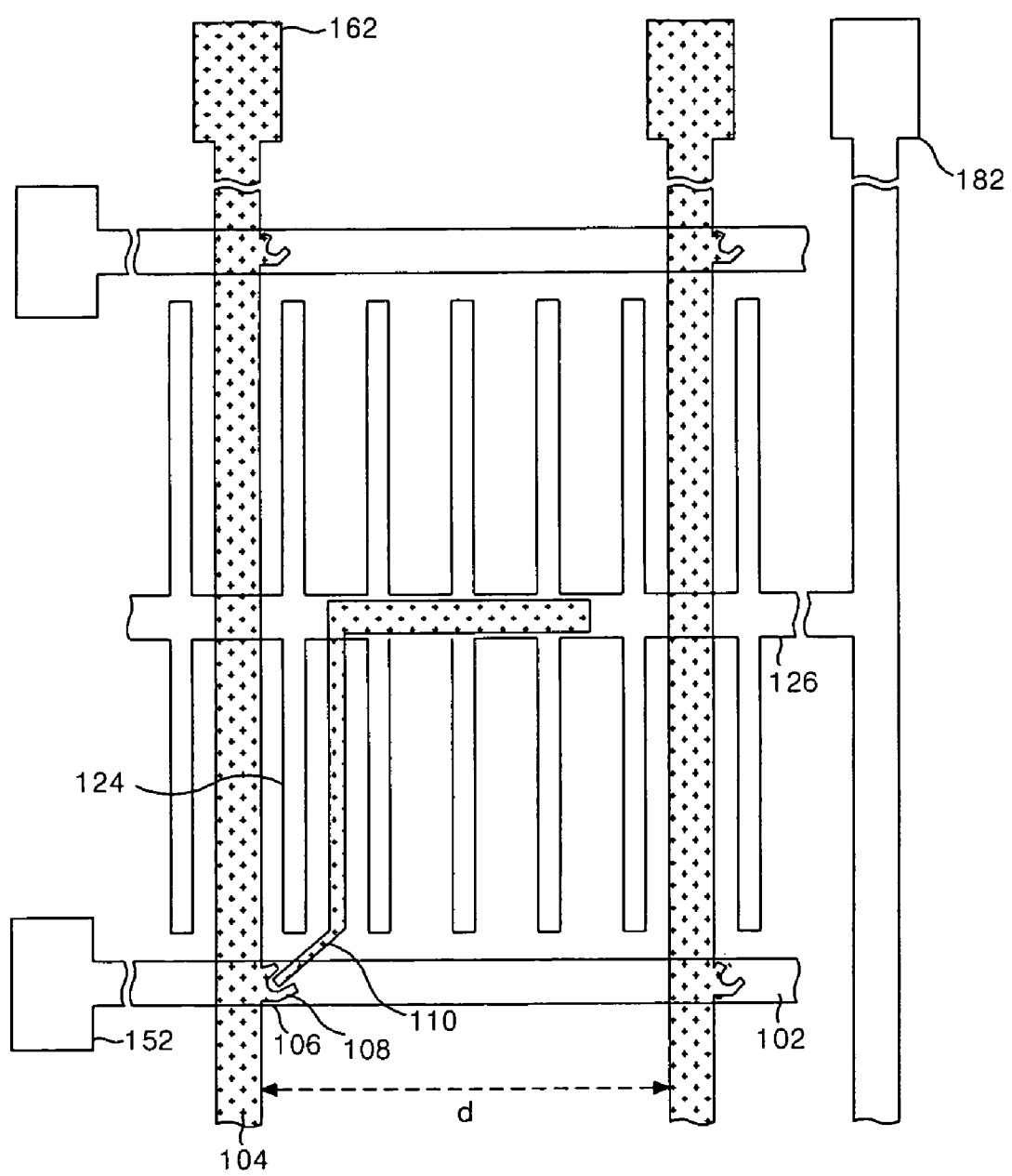

A data metal layer is formed on the gate insulating film provided with the semiconductor pattern by a deposition technique, such as sputtering. Then, the data metal layer is patterned by a pressurizing process and an etching process using a third soft mold, thereby providing a second conductive pattern group including the data line 104, the source electrode 108, the drain electrode 110 and the lower data pad electrode 162, as shown in FIG. 6C. Subsequently, the exposed ohmic contact layer 116 between the source electrode 108 and the drain electrode 110 is etched using the source electrode 108 and the drain electrode 110 as a mask. Thus, the active layer 114 at the channel portion of the thin film transistor is exposed.

Figure 6D:
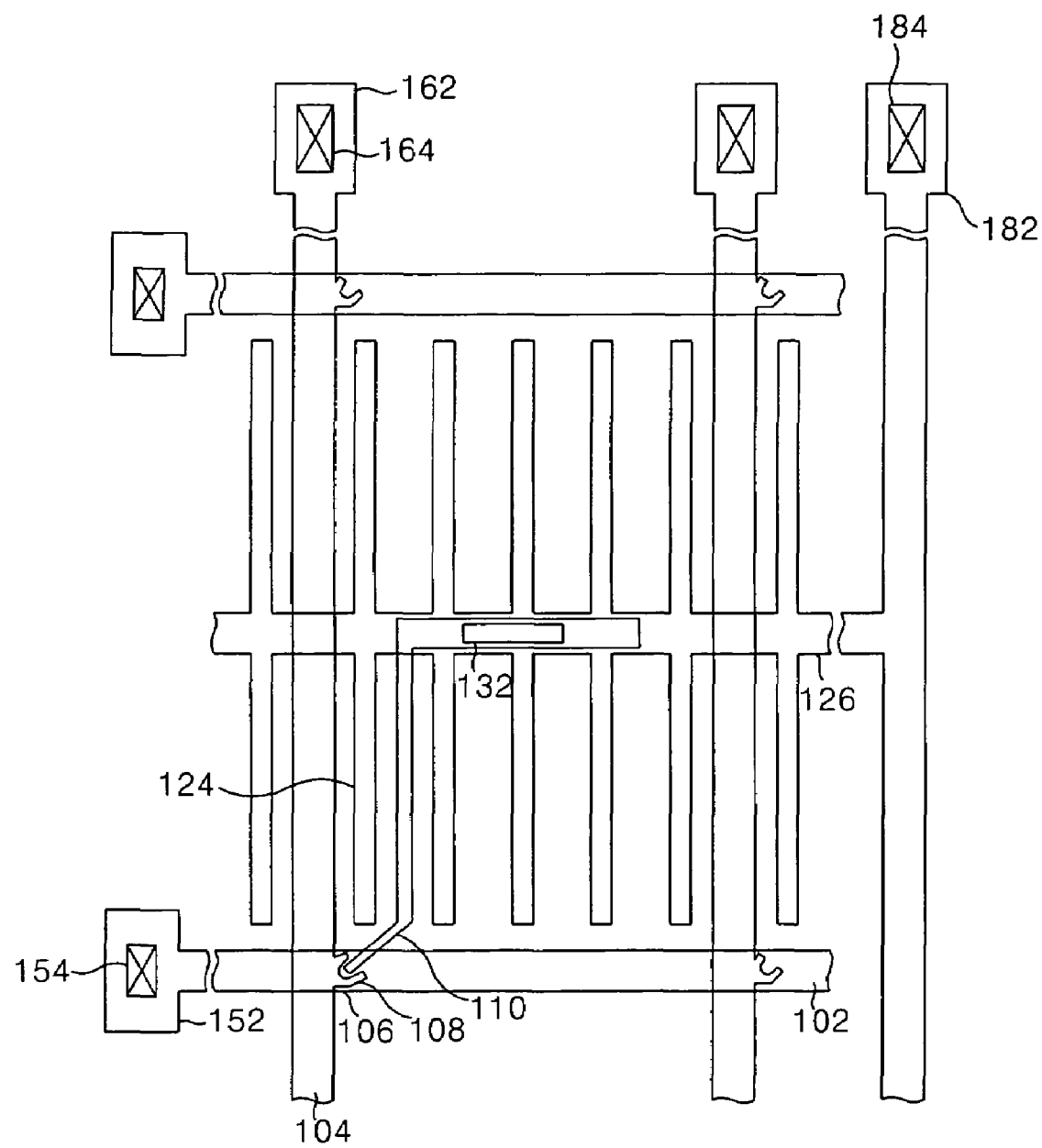

A protective film is entirely formed on the gate insulating film provided with the second conductive pattern group by a deposition technique, such as PECVD. Then, the protective film is patterned by the pressing process and the etching process using a fourth soft mold, thereby providing the first to fourth contact holes 132, 154, 164 and 184, as shown in FIG. 6D.

Figure 6E:
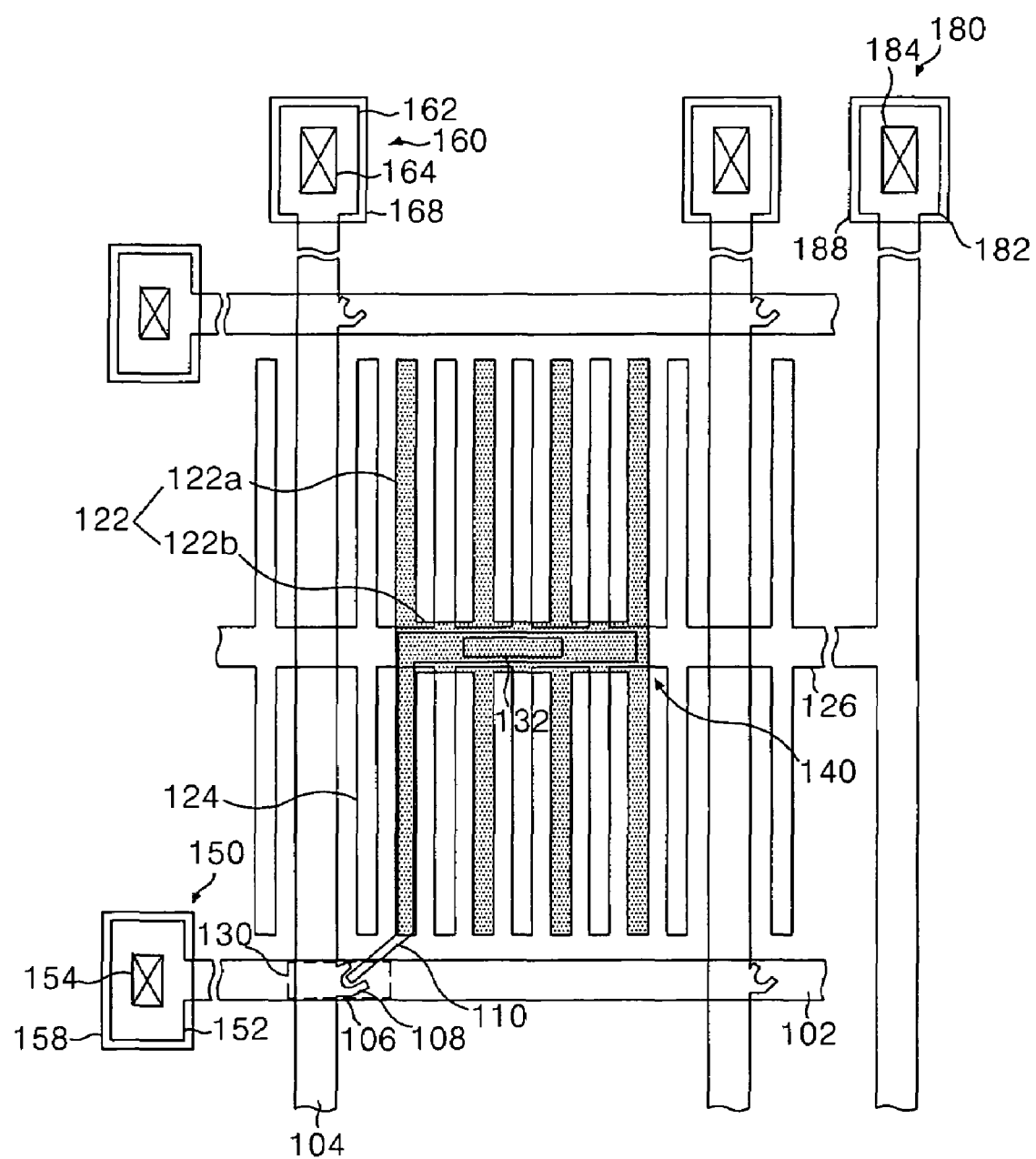

A transparent conductive film is coated onto the protective film having the first to fourth contact holes 132, 154, 164 and 184 by a deposition technique, such as sputtering. Then, the transparent conductive film is patterned by a pressing process and an etching process using a fifth soft mold, thereby providing a third conductive pattern group including the pixel electrode 122, the upper gate pad electrode 158, the upper data pad electrode 168 and the upper common pad electrode 188 as shown in FIG. 6E.

Each soft molding process shown in FIG. 6A to FIG. 6E will be described in conjunction with FIG. 7A to FIG. 7C below.

Figure 7A:
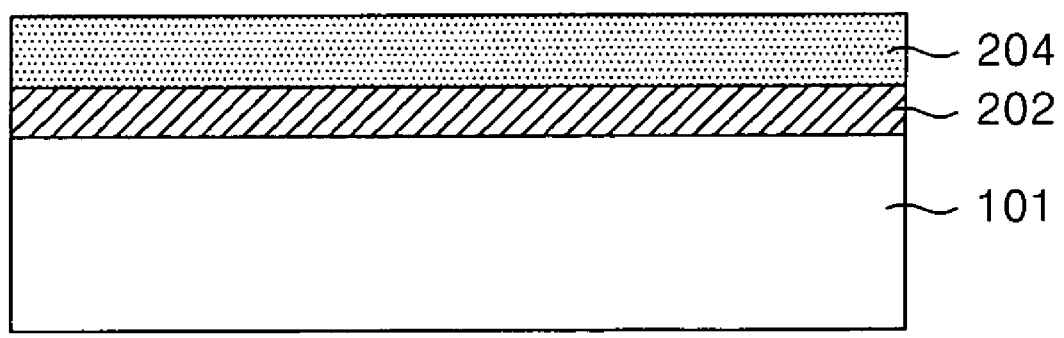
FIG. 7A to FIG. 7C are cross-sectional views for specifically explaining each soft molding process shown in FIG. 6A to FIG. 6D, FIG. 8A to FIG. 8C illustrate a movement of an etching resist liquid when the soft mold is in contact with the substrate in the course of the process of FIG. 7.

First, as shown in FIG. 7A, at least one of thin film 202, (e.g., a conductive layer, a semiconductor layer and/or an insulating layer) is provided on the substrate 101. Here, the conductive layer can be at least one of the gate metal layer, the data metal layer and the transparent conductive film for forming any at least one of the first to third conductive pattern group; the semiconductor layer can be at least one of the amorphous silicon layer and the n$^+$ amorphous silicon layer for forming at least one of the active layer and the ohmic contact layer; and the insulating layer can be at least one of an inorganic insulating material and an organic insulating material for forming any at least one of the protective film and the gate insulating film.

Figure 7B:
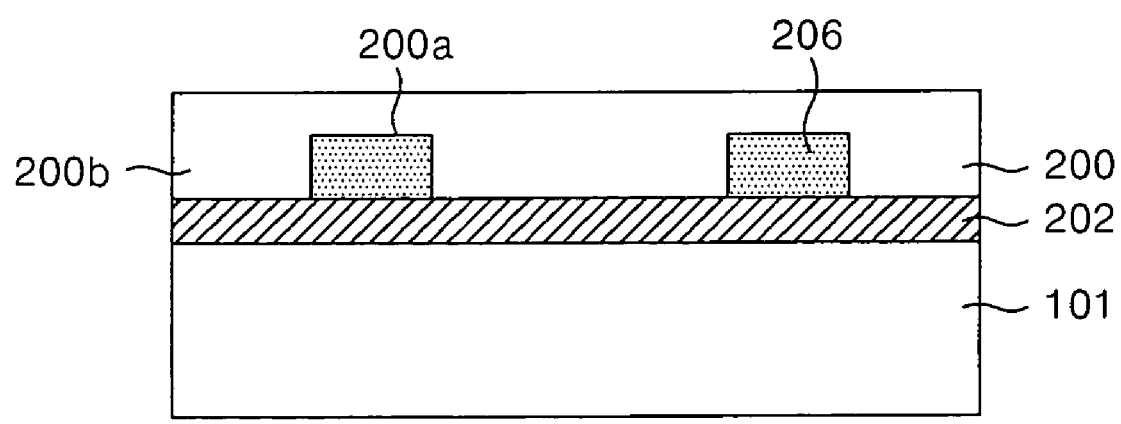
Figure 7C:
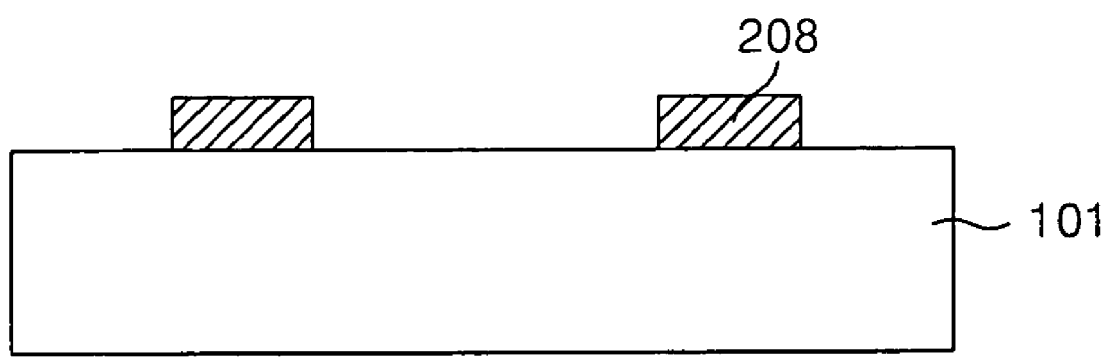

An etch resist 204 is coated onto the thin film 202, and thereafter, a soft mold 200 is pressed onto the etch resist 204 such that the surface of a protrusion 200b of the soft mold 200 is in contact with the thin film 202, thereby providing an etch resist pattern 206, as shown in FIG. 7B. The etch resist pattern 206 is formed in a pattern shape transcribed on an inversion basis with respect to a hole 200a of the soft mold 200. The thin film 202 is etched by utilizing the etch resist pattern 206 as a mask to thereby provide any at least one thin film pattern 208 of a conductive pattern, a semiconductor pattern and an insulating pattern as shown in FIG. 7C.

Figure 8A:
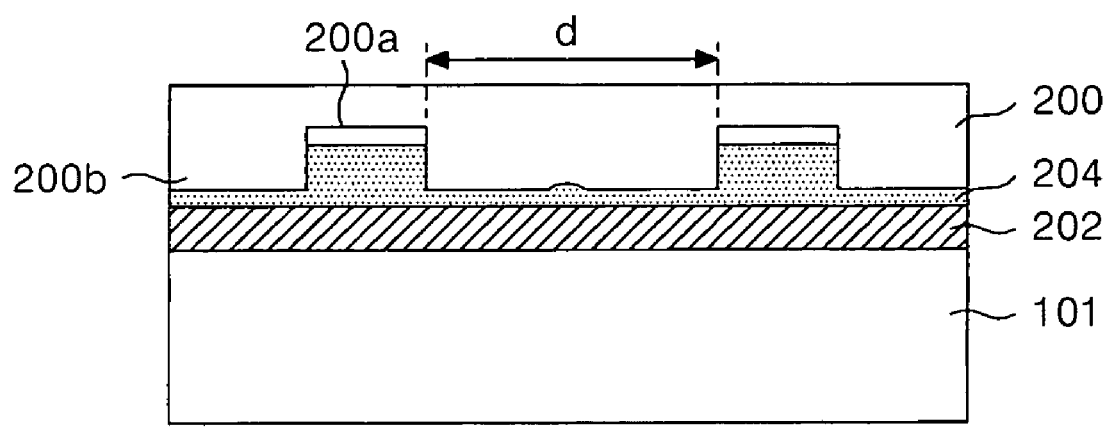
Figure 8B:
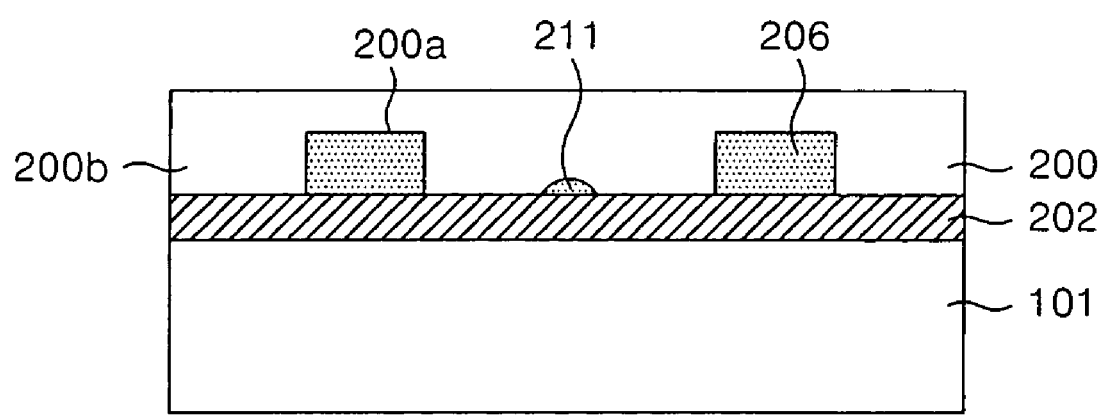
Figure 8C:
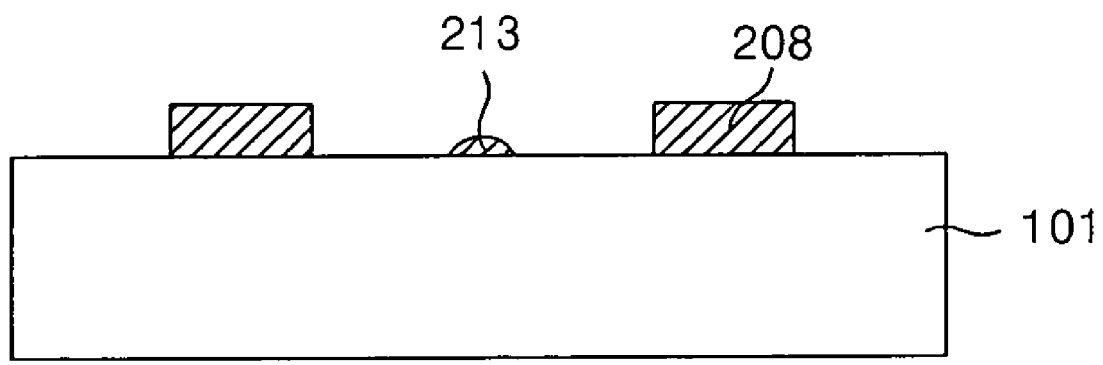

Meanwhile, if the soft mold 200 is pressed onto the etch resist 204, then the etch resist 204 is moved into the hole 200a of the soft mold 200 by a capillary force and a repulsive force between the soft mold 200 and the etch resist 204. However, when a distance between the thin film patterns to be formed on the substrate 101 is relatively far beyond a limit in a movement ability of the etch resist 204, that is, when a distance d between the holes 200a of the soft mold 200 is far, the etch resist 204 fails to be moved into the hole 200a of the soft mold 200 such that it is left into a bad etch resist pattern 211 between the etch resist patterns 206, as shown in FIG. 8A and FIG. 8B. The thin film is etched using the etch resist patterns 206 as masks, thereby providing thin film patterns 208, as shown in FIG. 8C, and at the same time, a residual film 213 is provided between the thin film patterns 208 by the bad etch resist pattern 211 to cause a pattern defect. Particularly, such a residual film 213 emerges distinctly between the semiconductor pattern and the second conductive pattern group in which the distance (d) between the patterns is relatively far as shown in FIG. 6B and FIG. 6C. Also, the residual film 213 largely occurs due to a pitch per pixel which is enlarged as the panel dimension increases.

Figure 9:
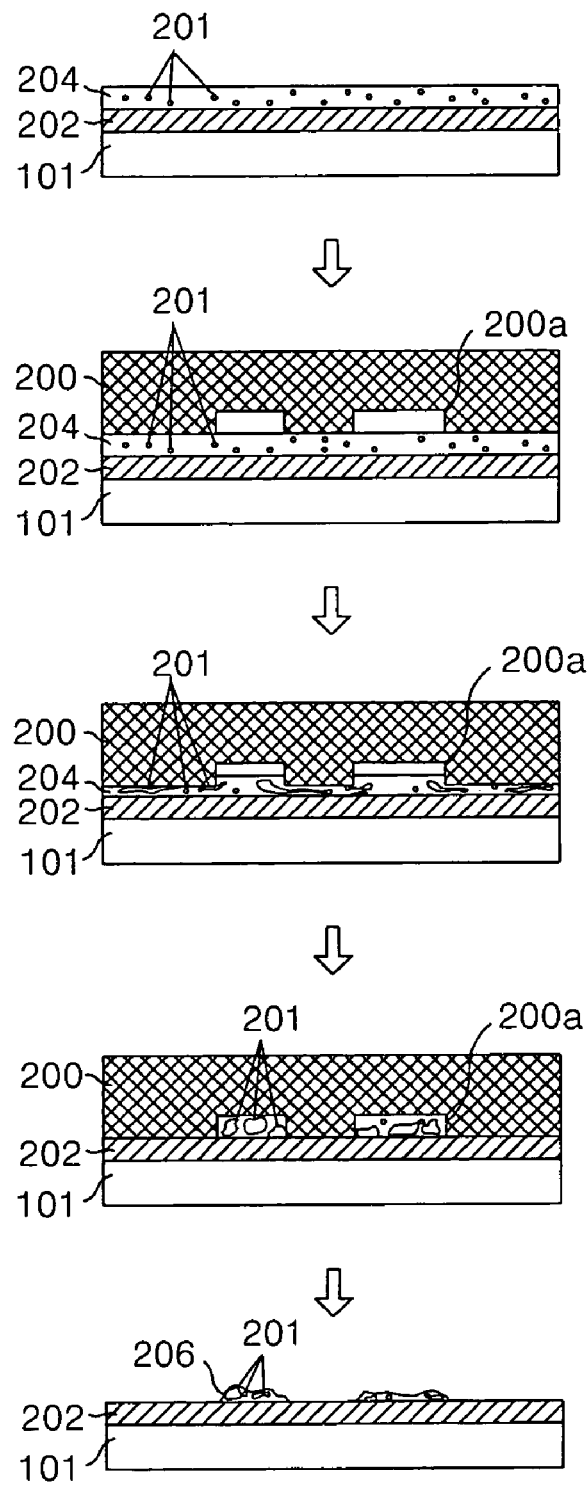
FIG. 9 is a cross-sectional view showing an air bubble generated in the course of the process of FIG. 7 and a pattern defect of the etching resist caused by the air bubble.

Further, air bubbles may be generated within an etch resist liquid 204 coated onto the thin film 202 by an out-gassing caused by a volatile solvent within the etch resist liquid 204 and an external air flown into the etch resist liquid 204. In other words, as shown in FIG. 9, minute bubbles 201 exist within the etch resist liquid 204 and an air of the atmosphere is flown and mingled into the etch resist liquid 204 when the soft mold 200 becomes in contact with the etch resist liquid 204. The air bubbles within the etch resist liquid 204 are increased by the pressurizing process and the baking process of the soft mold 200 and act as a cause of depression or loss of the etch resist pattern 206. The air bubbles generated in the course of the etch resist pattern process are left within the etch resist liquid 204 because a vaporization speed of the solvent within the etch resist liquid 204 is faster than an ability of solidifying the soft mold 200 while absorbing the solvent, thereby causing a pattern detect in the etch resist pattern 206, for example, a breakage badness. Particularly, if the thin film pattern is the pixel electrode and the common electrode having a narrow width, then an undesired opening occurs due to a pattern badness of the etch resist pattern 206.

Figure 10:
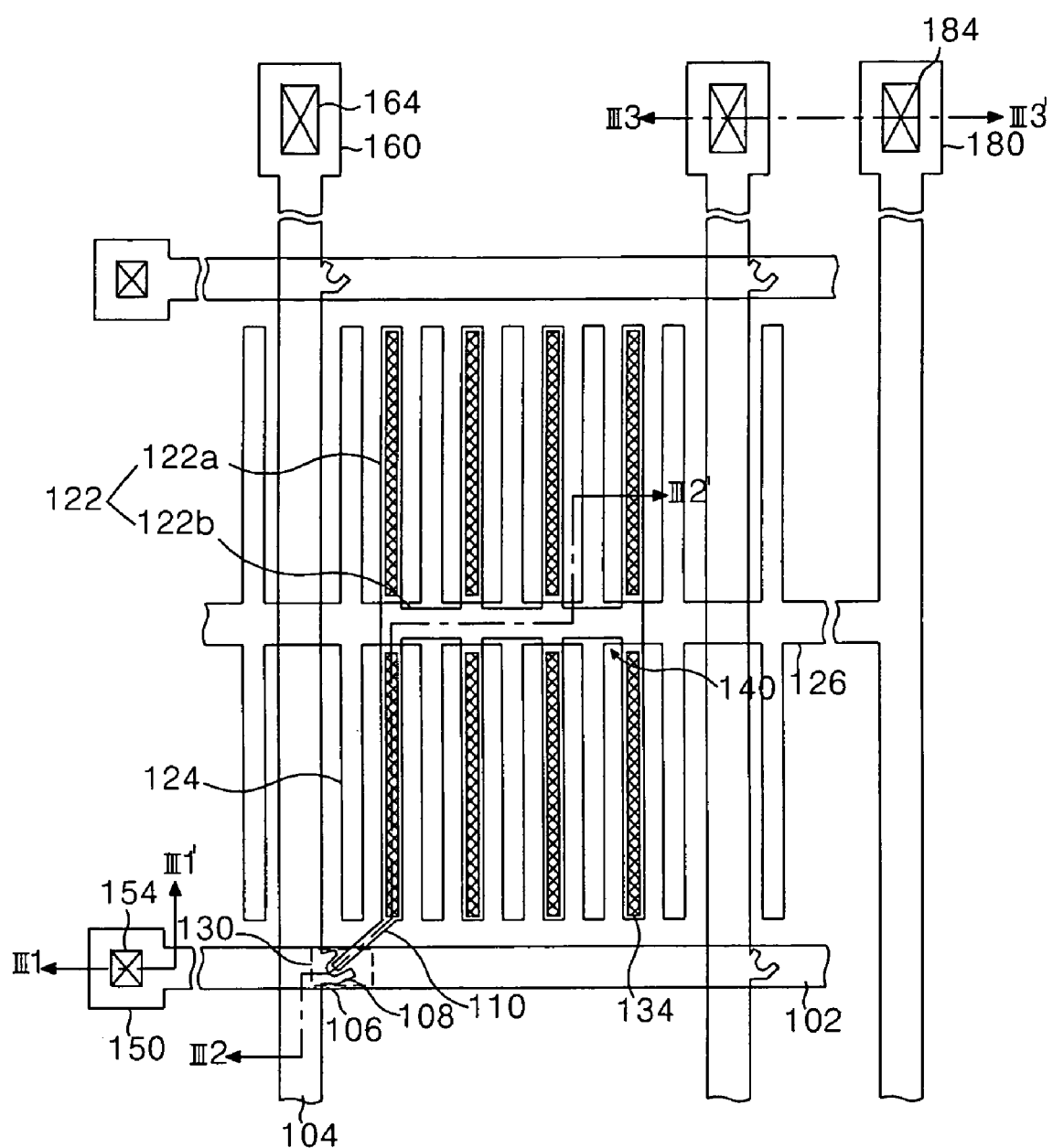
FIG. 10 is a plan view showing a structure of a thin film transistor array substrate in a liquid crystal display panel of horizontal electric field type according to a second exemplary embodiment of the present invention.
Figure 11:
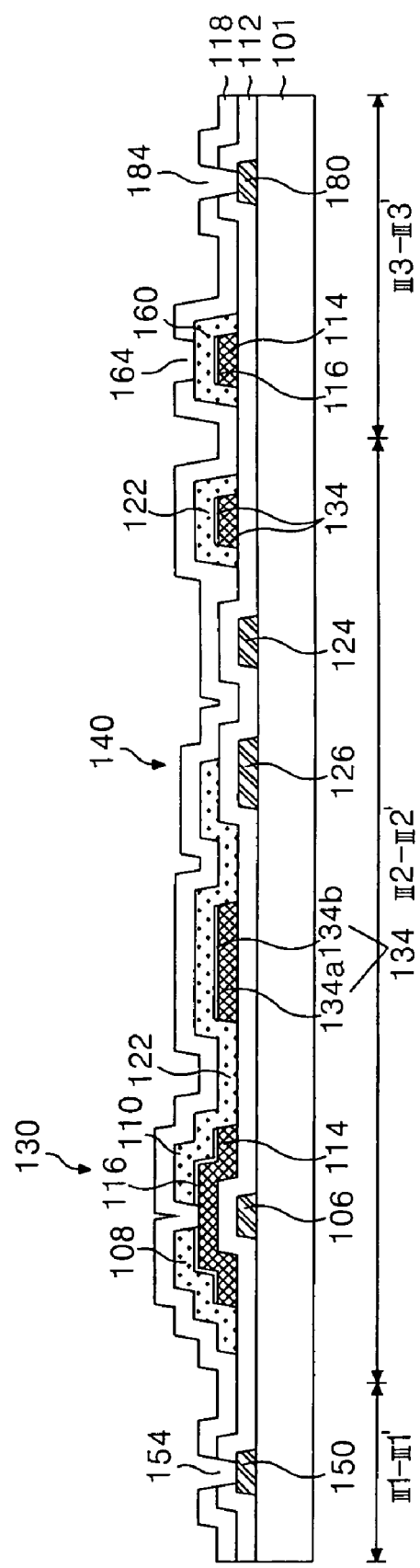
FIG. 11 is a cross-sectional view of the thin film transistor array substrate taken along lines III1-III1', III2-III2' and III3-III3' of FIG. 10, FIG. 12A and FIG. 12B are respectively a plan view and a cross-sectional view representing a semiconductor pattern formed by a first soft molding process in the method of fabricating the thin film transistor array substrate according to the second embodiment of the present invention.

FIG. 10 is a plan view showing a structure of a thin film transistor array substrate in a liquid crystal display panel of horizontal electric field type according to a second exemplary embodiment of the present invention, and FIG. 11 is a cross-sectional view of the thin film transistor array substrate taken along lines III1-III1', III2-III2' and III3-III3' of FIG. 10. Referring to FIG. 9 and FIG. 10, the thin film transistor array substrate according to the second embodiment of the present invention includes a gate line 102 and a data line 104 provided on a lower substrate 101 intersecting each other with a gate insulating pattern 112 therebetween, a thin film transistor 130 provided at each intersection, a pixel electrode 122 and a common electrode 124 provided at a pixel area defined by the intersection structure to form a horizontal field, and a common line 126 to supply a reference voltage to the common electrode 124. Further, the thin film transistor array substrate includes a storage capacitor 140 provided at an overlapped portion between the pixel electrode 122 and the common line 126, a gate pad 150 extended from the gate line 102, and a data pad 160 extended from the data line 104 and a common pad 180 extended from the common line 126. The thin film transistor 130 allows a pixel signal of the data line 104 to be charged and maintained in the pixel electrode 122 in response to the gate signal of the gate line 102. To this end, the thin film transistor 130 includes a gate electrode 106 included in the gate line 102, a source electrode 108 connected to the data line 104 and having at least two protrusions, and a drain electrode 110 connected to the pixel electrode 122. Further, the thin film transistor 130 includes an active layer 114 overlapping the gate electrode 106 with the gate insulating pattern 112 therebetween. The active layer 114 includes a channel between the source electrode 108 and the drain electrode 110. The active layer 114 also overlaps the data line 104 and the data pad 160. On the active layer 114, ohmic contact layers 116 for making an ohmic contact with the data line 104, the drain electrode, the storage electrode 128 and the data pad 160 are further provided.

A dummy semiconductor pattern 134 comprises first and second semiconductor layers 134a and 134b sequentially formed from the same materials as the active layer 114 and the ohmic contact layers 116, respectively. The dummy semiconductor pattern 134 overlaps at least one of the pixel electrodes 122 within the pixel area and has a width narrower than or equal to the overlapped pixel electrode 122. A distance between the semiconductor patterns is narrower than a distance between the related art semiconductor patterns including the active layer and the ohmic contact layer owing to the dummy semiconductor pattern 134 so that a residual film phenomenon caused by a far spaced distance between the semiconductor patterns in the related art can be prevented.

The pixel electrode 122 is integral to the drain electrode of the thin film transistor 130 and is formed from the same metal as the drain electrode 110 at the pixel area. The pixel electrode 122 includes a vertical portion 122a provided parallel to the data line 104, and a horizontal portion 122b connected to the vertical portion 122a and provided in parallel to the gate line 102. The pixel electrode 122 is formed from the same metal as the data line 104 simultaneously with the data line 104 such that a distance between the second conductive pattern groups, each of which includes the pixel electrode 122 and the data line 104, etc., can be narrowed, thereby preventing a residual film phenomenon caused by a far distance between the second conductive pattern groups in the related art. The common electrode 124 is connected to the common line 126 and is provided in the pixel area. Particularly, the common electrode 124 is provided parallel to the vertical portions 122a of the pixel electrode 122 between them. Accordingly, a horizontal electric field is formed between the pixel electrode 122 to which a pixel signal is supplied via the thin film transistor 130 and the common electrode 124 to which a reference voltage is supplied via the common line 126. Liquid crystal molecules arranged in the horizontal direction between the thin film transistor array substrate and the color filter array substrate by the horizontal electric field are rotated due to a dielectric anisotropy. Transmittance of a light through the pixel area is differentiated depending upon a rotation extent of the liquid crystal molecules, thereby implementing a gray level scale.

The storage capacitor 140 is defined by the common line 126, and the pixel electrode 122 overlapping the common line 126 with the gate insulating film therebetween. The storage capacitor 140 allows a pixel signal charged on the pixel electrode 122 to be stably maintained until the next pixel signal is charged. The gate pad 150 is connected to a gate driver (not shown) to apply a gate signal from the gate driver to the gate line 102. The gate pad 150 is extended from the gate line 102, and is exposed through a second contact hole 154 passing through the gate insulating film 112 and the protective film 118. The data pad 160 is connected to a data driver (not shown) to apply a data signal from the data driver to the data line 104. The data pad 160 is extended from the data line 104, and is exposed through a third contact hole 164 passing through the protective film 118. The common pad 180 receives a reference voltage from an external reference voltage source (not shown) to apply it to the common line 126. The common pad 180 is extended from the common line 126, and is exposed through a fourth contact hole 184 passing through the gate insulating film 112 and the protective film 118.

Figure 12A:
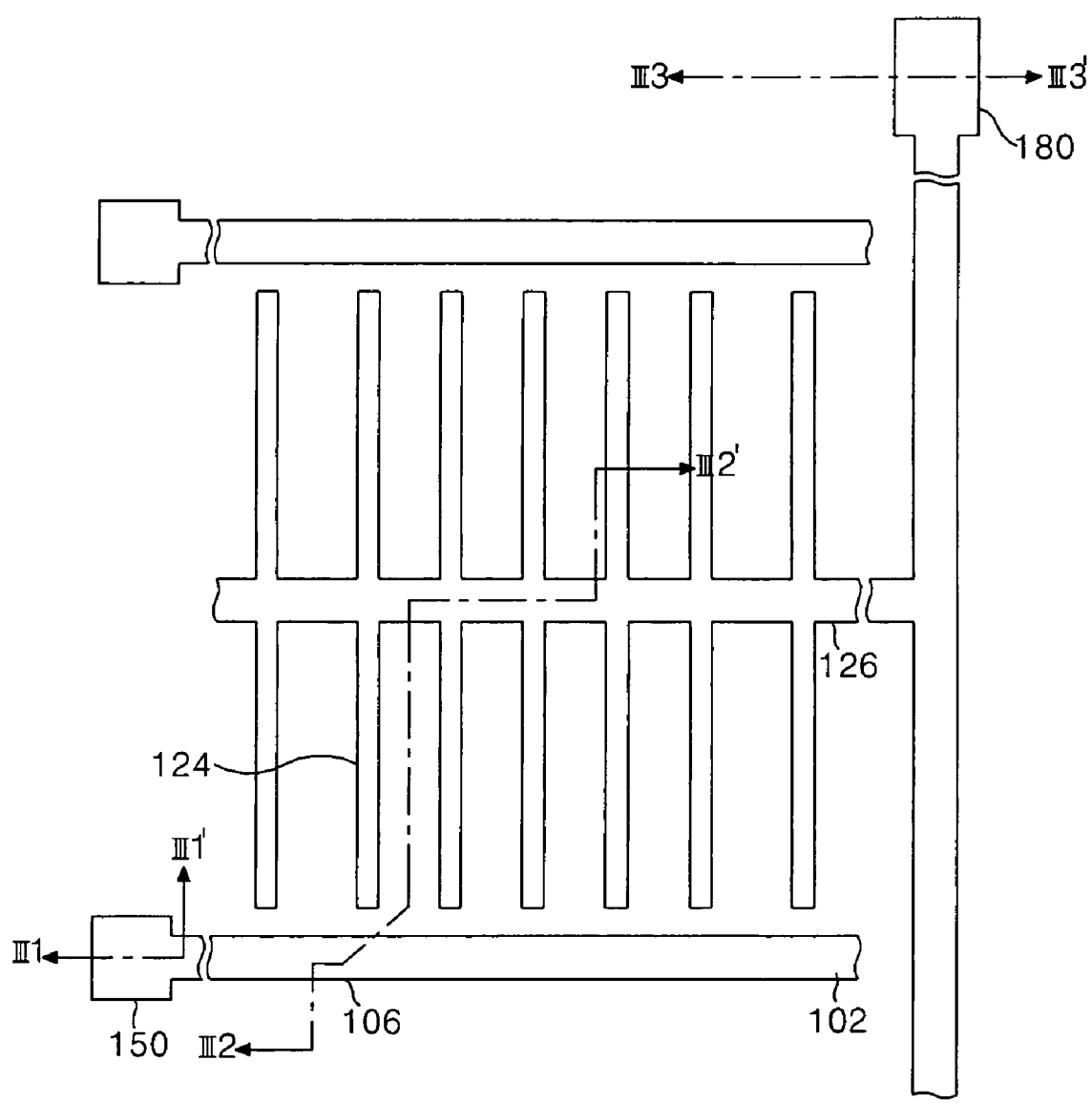
Figure 12B:
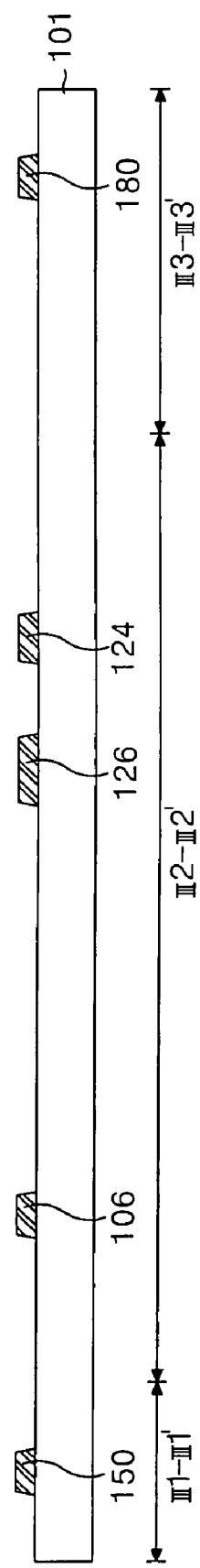

FIG. 12A and FIG. 12B are a plan view and a cross-sectional view for explaining a first soft molding process in the method of fabricating the thin film transistor array substrate according to the second embodiment of the present invention, respectively. As shown in FIG. 12A and FIG. 12B, a first conductive pattern group including the gate electrode 106, the gate line 102, the gate pad 150, the common electrode 124, the common line 126 and the common pad 180 is provided on the substrate 101.

Figure 13A:
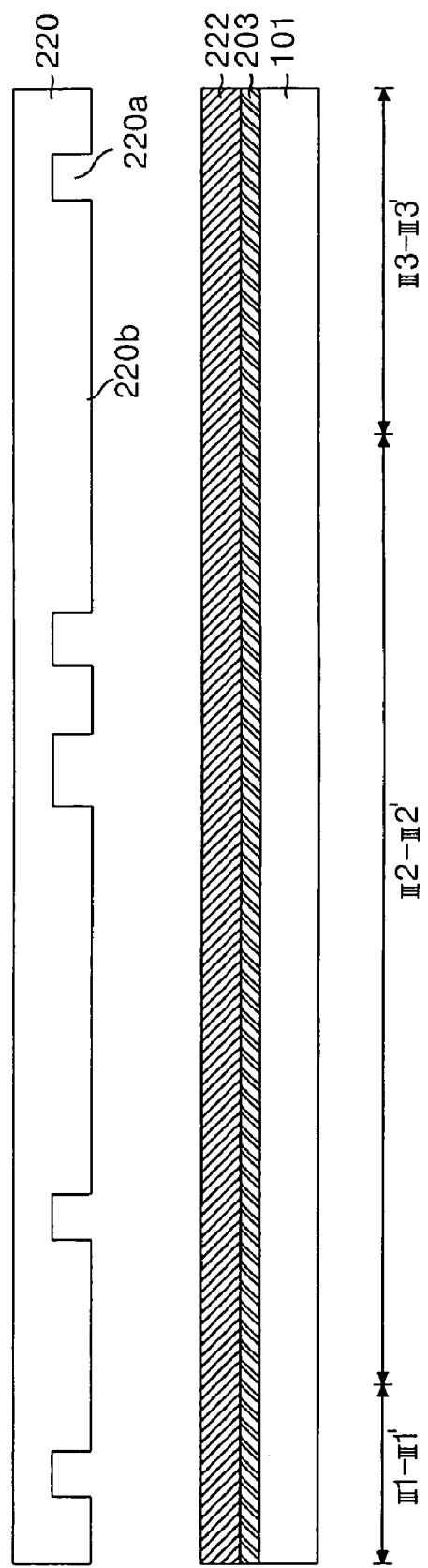

To this end, as shown in FIG. 13A, a gate metal film 203 is formed on the lower substrate 101 by a deposition technique, such as sputtering, and an etch resist liquid 222 is formed on the gate metal film 203 by a coating process such as a nozzle injection or a spin coating. Herein, the gate metal film 203 is made from a metal, such as an aluminum group metal including AlNd, molybdenum (Mo), copper (Cu), chrome (Cr), tantalum (Ta), and a titanium (Ti). The etch resist liquid 222 is formed from a material having a thermal resistance and a medicine resistance, for example, a solution in which Novolac resin of about 5 to 30 wt % is added to an ethanol solvent. Subsequently, the first soft mold 220 having the hole 220a and the protrusion 220b is aligned at the upper portion of the etch resist liquid 222. The hole 220a of the first soft mold corresponds to an area to be provided with the first conductive pattern group. The first soft mold 220 is formed from a large elastic rubber material, for example, polydimethylsiloxane (PDMS), polyurethane or cross-linked novolac resin, etc.

Figure 13B:
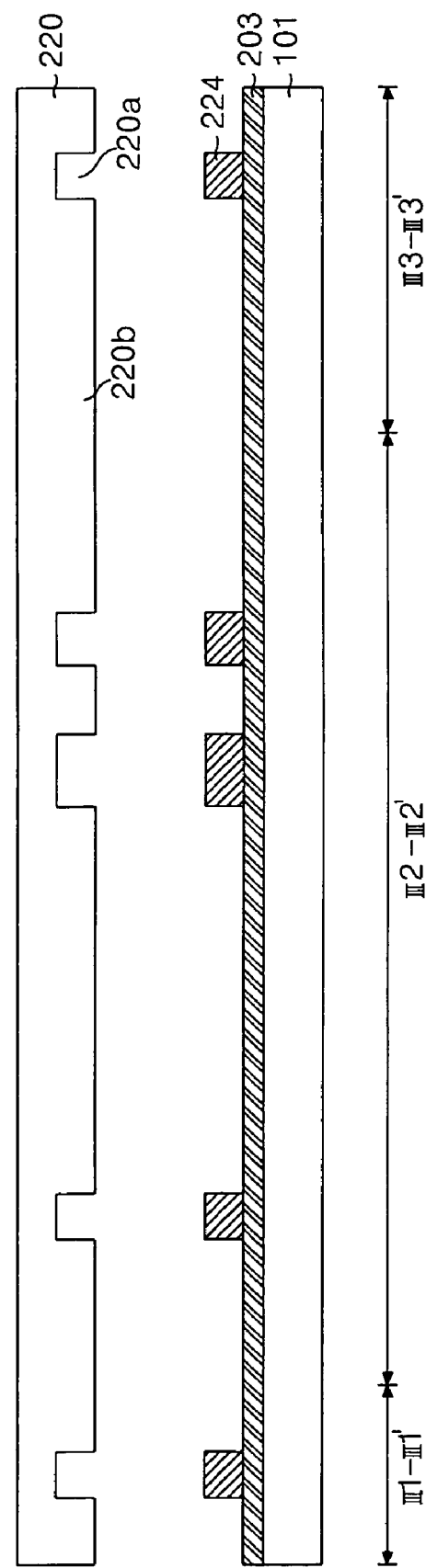

The first soft mold 220 is pressurized on the etch resist liquid 222 during a desired time, for example, for about ten minutes to two hours such that the surface of the protrusion 220b of the first soft mold 220 becomes in contact with the gate metal film 203 by its self-weight. At this time, the substrate 101 is baked at a temperature less than about 130° C. Then, the etch resist liquid 222 is moved into the hole 220a of the first soft mold 220 by a capillary force generated by a pressure between the first soft mold 220 and the substrate 101 and a repulsive force between the first soft mold 220 and the etch resist liquid 222. As a result, an etch resist pattern 224 having a pattern shape inversion-transcribed with respect to the hole 220a of the first soft mold 220, as shown in FIG. 13B is provided.

Subsequently, the first soft mold 220 is separated from the substrate 101 and thereafter the gate metal layer 203 is patterned by an etching process using the etch resist pattern 224 as a mask, thereby providing the first conductive pattern group including the gate line 102, the gate electrode 106, the gate pad 150, the common line 126, the common electrode 124 and the common pad 180 as shown in FIG. 13C. Finally, the etch resist pattern 224 left on the first conductive pattern group is removed by a stripping process using a stripping liquid of a pro-environmental alcohol group.

Figure 14A:
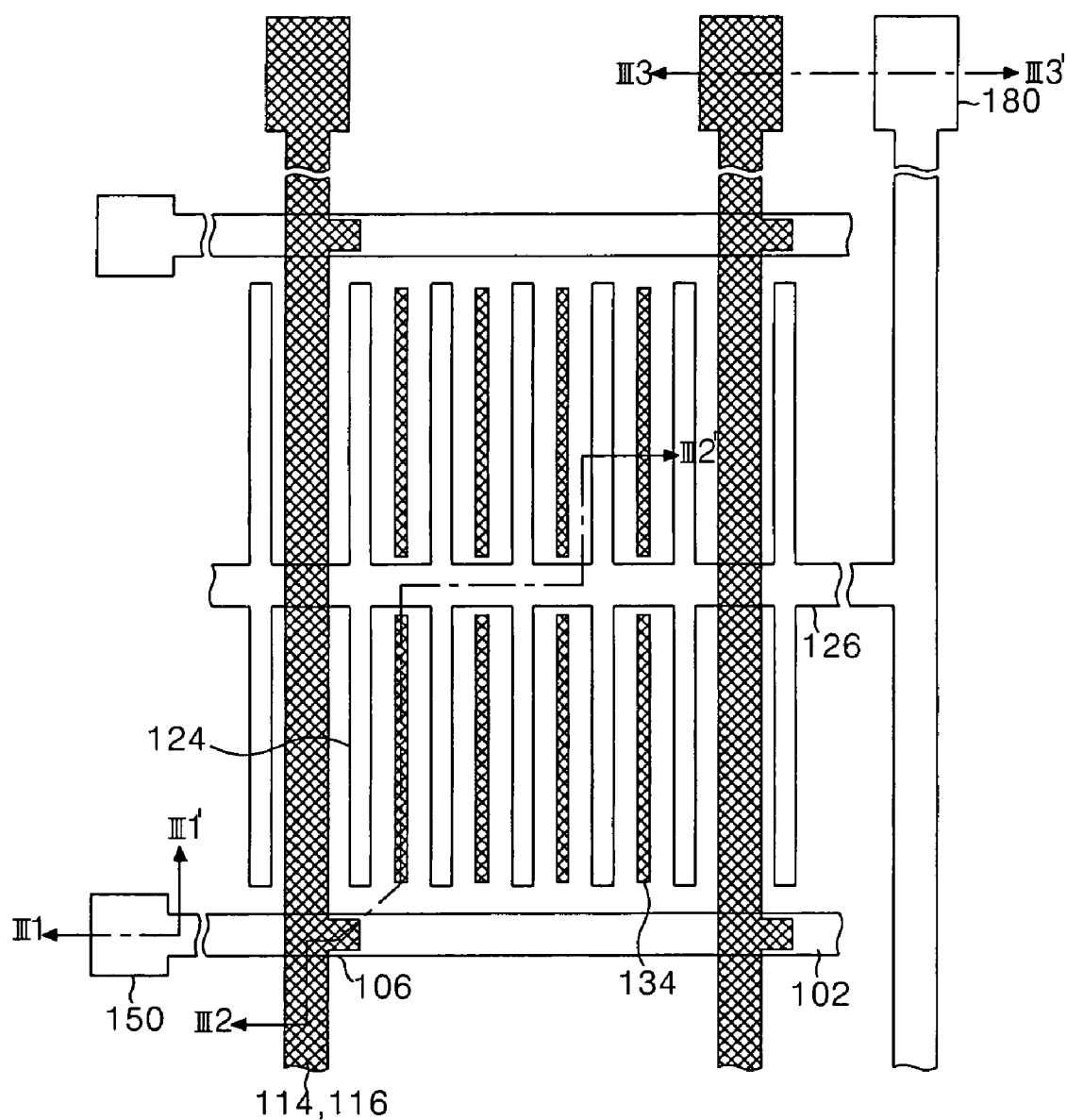
FIG. 14A and FIG. 14B are respectively a plan view and a cross-sectional view representing a semiconductor pattern formed by a second soft molding process in the method of fabricating the thin film transistor array substrate according to the second embodiment of the present invention.
Figure 14B:
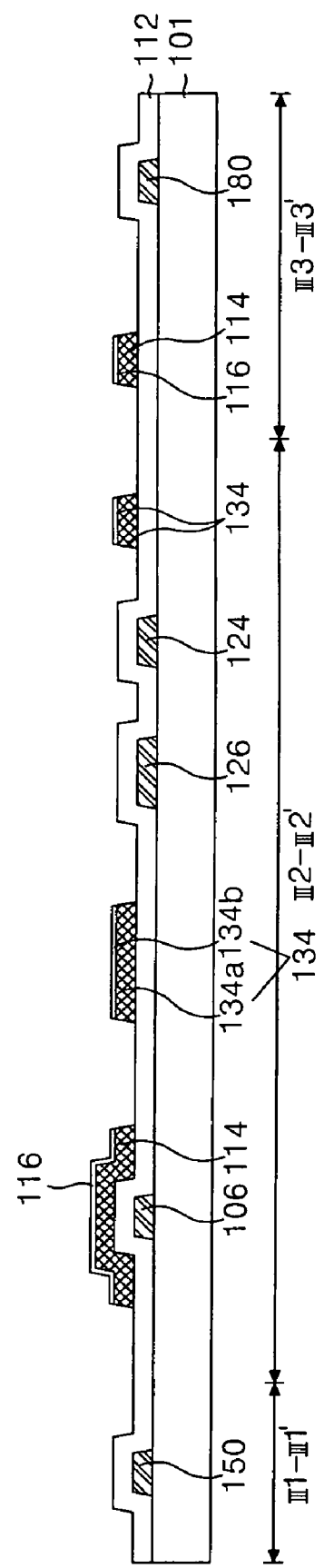

FIG. 14A and FIG. 14B are a plan view and a cross-sectional view for explaining a second soft molding process in the method of fabricating the thin film transistor array substrate according to the second embodiment of the present invention, respectively. As shown in FIG. 14A and FIG. 14B, the semiconductor pattern including the active layer 114 and the ohmic contact layer 116 disposed on the gate insulating film 112; and the dummy semiconductor pattern 134 positioned between the common electrodes 124 at the pixel area are provided.

Figure 15A:
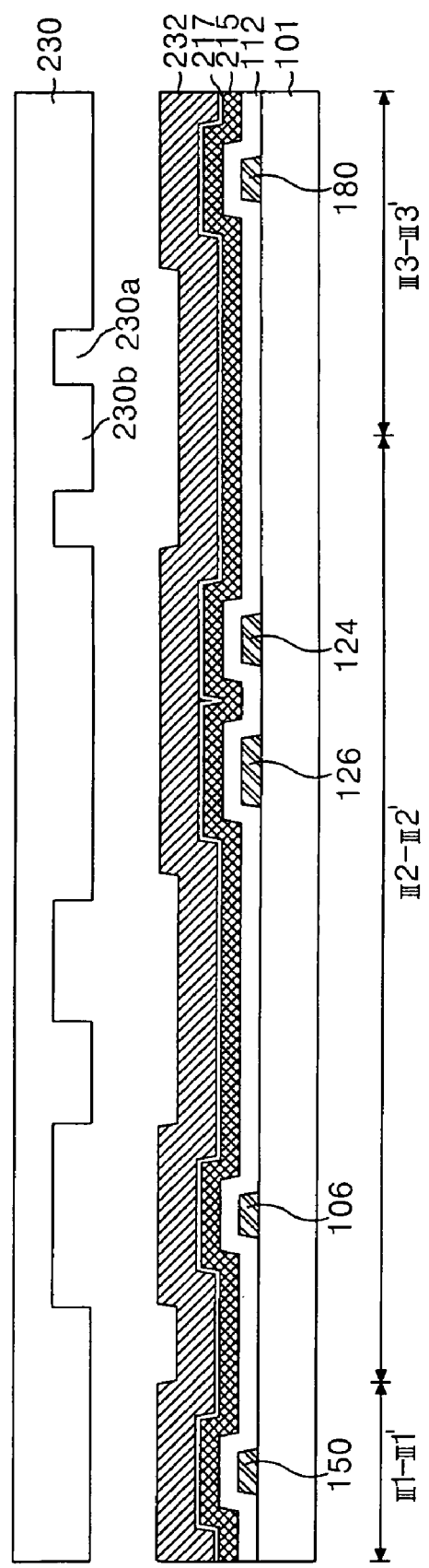
FIG. 15A to FIG. 15C are cross-sectional views for specifically explaining the second soft molding process in the method of fabricating the thin film transistor array substrate according to the second embodiment of the present invention.
Figure 15B:
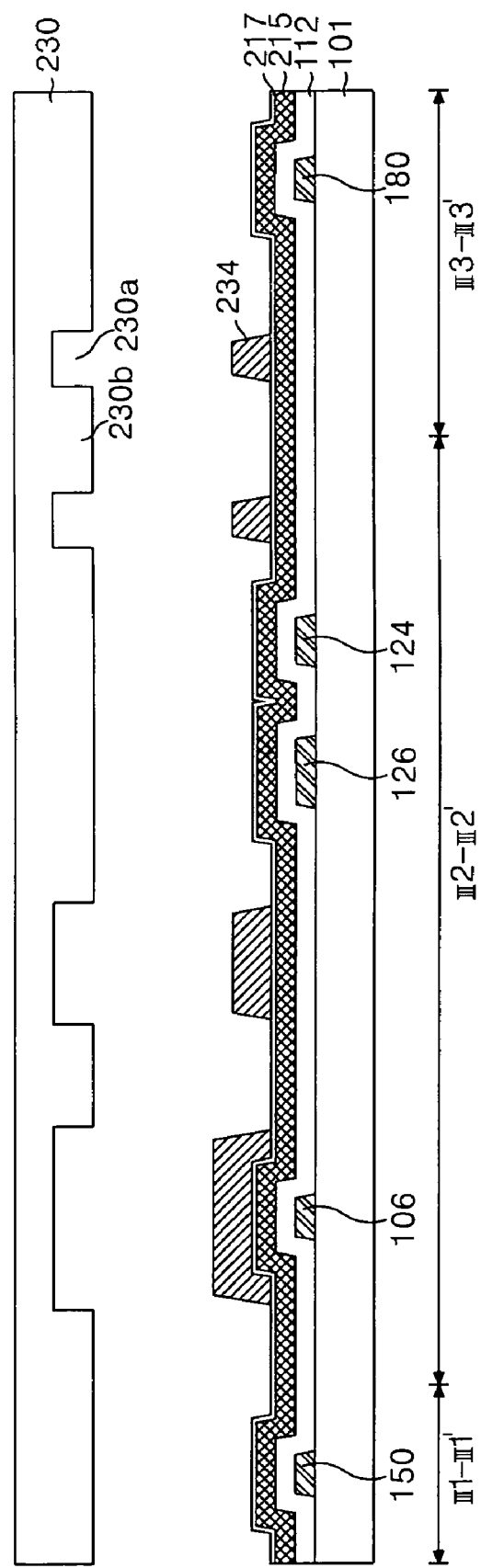

More specifically, the gate insulating film 112 and the first and second semiconductor layers 215 and 217 are sequentially formed on the lower substrate 101 provided with the first conductive pattern group by a deposition technique, such as PEVD or sputtering, as shown in FIG. 15A. Herein, the gate insulating film 112 is formed from an inorganic insulating material, such as silicon oxide (SiOx) or silicon nitride (SiNx); the first semiconductor layer 215 is formed from amorphous silicon being not doped with an impurity; and the second semiconductor layer 217 is formed from amorphous silicon doped with an N-type or P-type impurity. Then, an etch resist liquid 232 containing a material having a thermal resistance and a medicine resistance, for example, a solution in which Novolac resin of about 5 to 30 wt % is added to an ethanol solvent is coated onto the second semiconductor layer 217. The second soft mold 230 having the hole 230a and the protrusion 230b is aligned at the upper portion of the etch resist liquid 232. The second soft mold 230 is pressed on the etch resist liquid 232 during a desired time and at a desired temperature such that the surface of the protrusion 230b of the second soft mold 230 becomes in contact with the second semiconductor layer 217 by its own weight. Then, the etch resist liquid 232 is moved into the hole 230a of the second soft mold 230, thereby providing the etch resist pattern 234 having a pattern shape inversion-transcribed with respect to the hole 230a of the second soft mold 230, as shown in FIG. 15B.

Figure 15C:
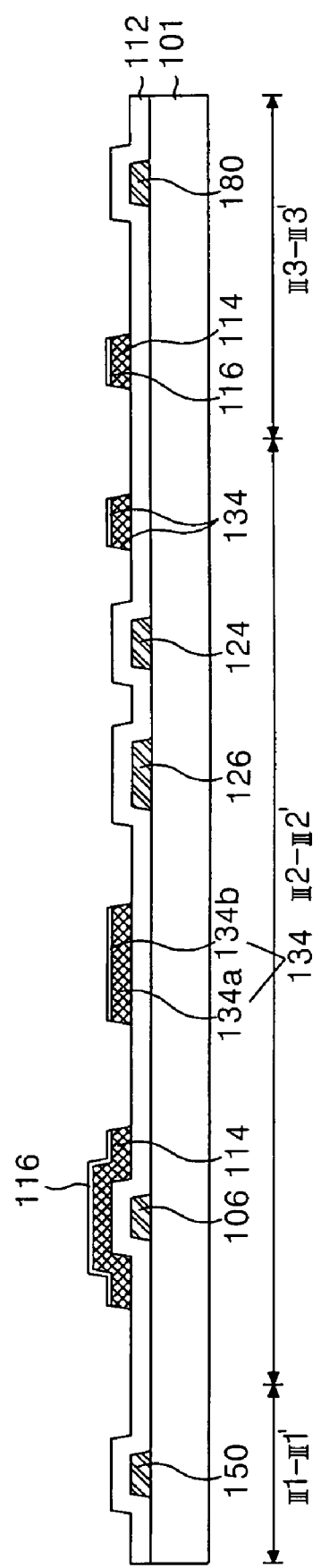

Subsequently, the second soft mold 230 is separated from the substrate 101 and thereafter the first and second semiconductor layers 215 and 217 are patterned by an etching process using the etch resist pattern 234 as a mask, thereby providing the semiconductor pattern including the active layer 114 and the ohmic contact layer 116 and the dummy semiconductor pattern 134 including a dummy active layer 134a and a dummy ohmic contact layer 134b as shown in FIG. 15C. Finally, the etch resist pattern 234 left on the semiconductor patterns 114 and 116 and the dummy semiconductor pattern 134 are removed by a stripping process using a stripping liquid of a pro-environmental alcohol group.

As described above, the dummy semiconductor pattern 134 is provided between the common electrodes 124 within the pixel area to narrow a distance between the holes 230a of the second soft mold 230 for forming the semiconductor patterns 114 and 116 and the dummy semiconductor pattern 134, thereby shortening a movement distance of the etch resist liquid 232. Thus, a movement of the etch resist liquid 232 can be smoothed to prevent a residual film phenomenon occurring between the semiconductor patterns.

Figure 16A:
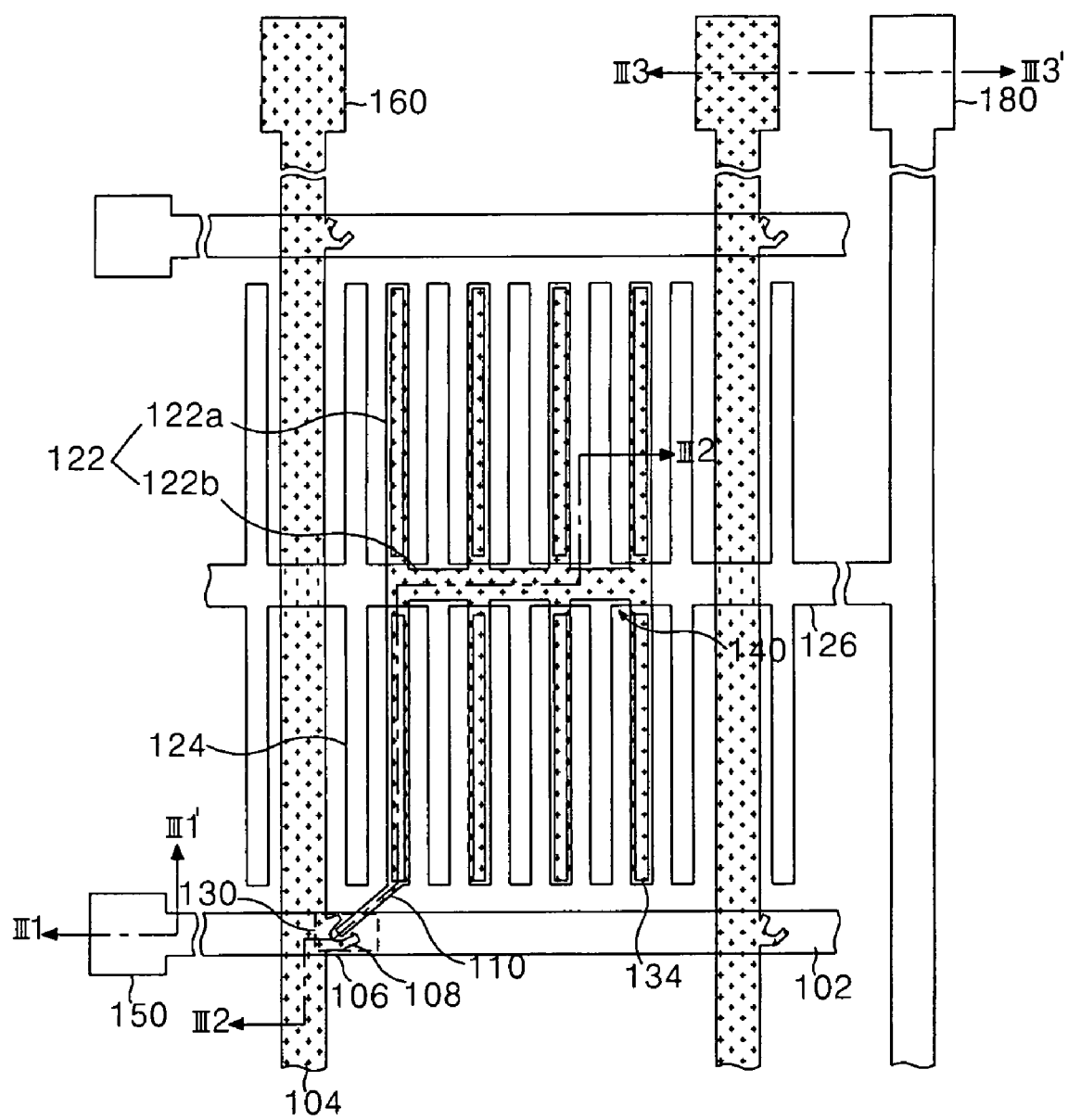
FIG. 16A and FIG. 16B are respectively a plan view and a cross-sectional view representing a second conductive pattern group formed by a third soft molding process in the method of fabricating the thin film transistor array substrate according to the second embodiment of the present invention.
Figure 16B:
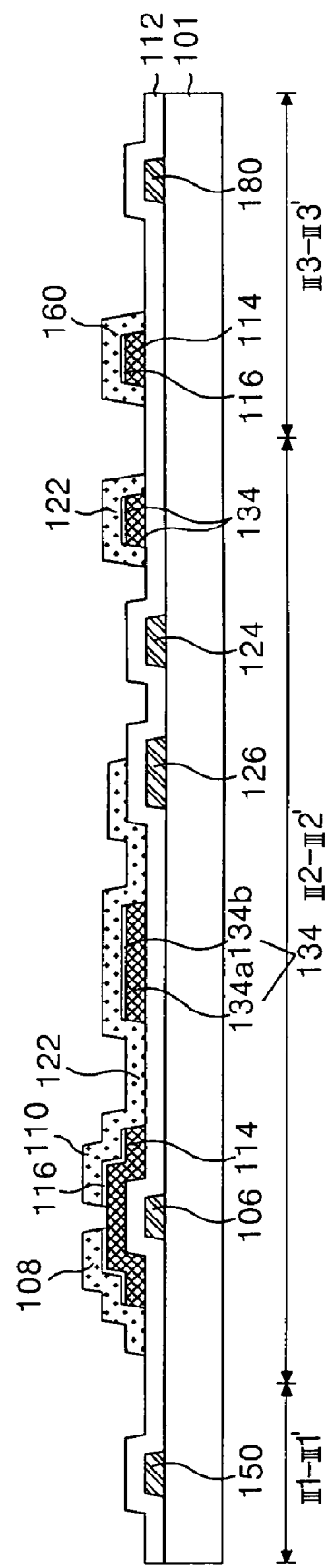

FIG. 16A and FIG. 16B are a plan view and a cross-sectional view for explaining a third soft molding process in the method of fabricating the thin film transistor array substrate according to the second embodiment of the present invention, respectively. As shown in FIG. 16A and FIG. 16B, the second semiconductor pattern group including the data line 104, the source electrode 108, the drain electrode 110, the data pad 180 and the pixel electrode 122 is formed on the gate insulating film 112 provided with the semiconductor patterns 114 and 116 and the dummy semiconductor pattern 134.

Figure 17B:
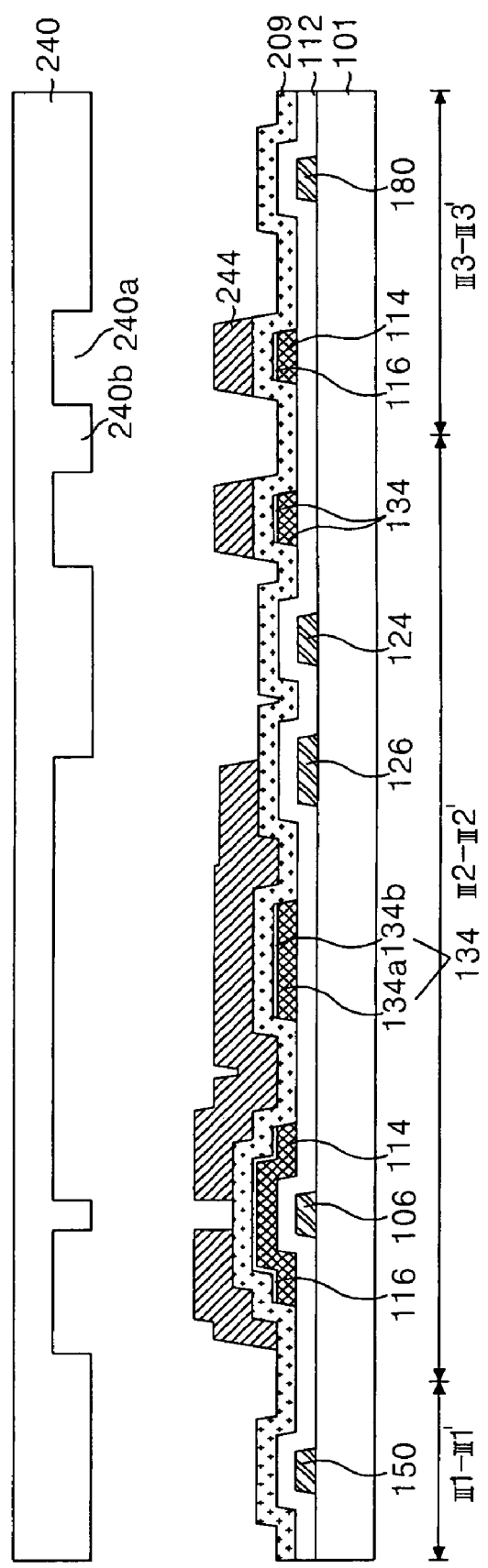

More specifically, the data metal layer 209 made from a metal, such as aluminum group metal, molybdenum (Mo), or copper (Cu), is formed on the gate insulating film 112 provided with the semiconductor patterns 114 and 116 and the dummy semiconductor pattern 134 by a deposition technique, such as PECVD or the sputtering, as shown in FIG. 17A. Then, an etch resist liquid 242 is coated onto the data metal layer 209 by a coating process such as a nozzle injection or a spin coating. A third soft mold 240 made from the same material as the first soft mold 220 is aligned on the etch resist liquid 242. The third soft mold 240 is pressed on the etch resist liquid 242 for a desired time and at a desired temperature such that the surface of the protrusion 240b of the third soft mold 240 becomes in contact with the data metal layer 209 by its own weight. Then, the etch resist liquid 242 is moved into the hole 240a of the third soft mold 240, thereby providing the etch resist pattern 244 having a pattern shape inversion-transcribed with respect to the hole 240a of the third soft mold 240, as shown in FIG. 17B.

Figure 17C:
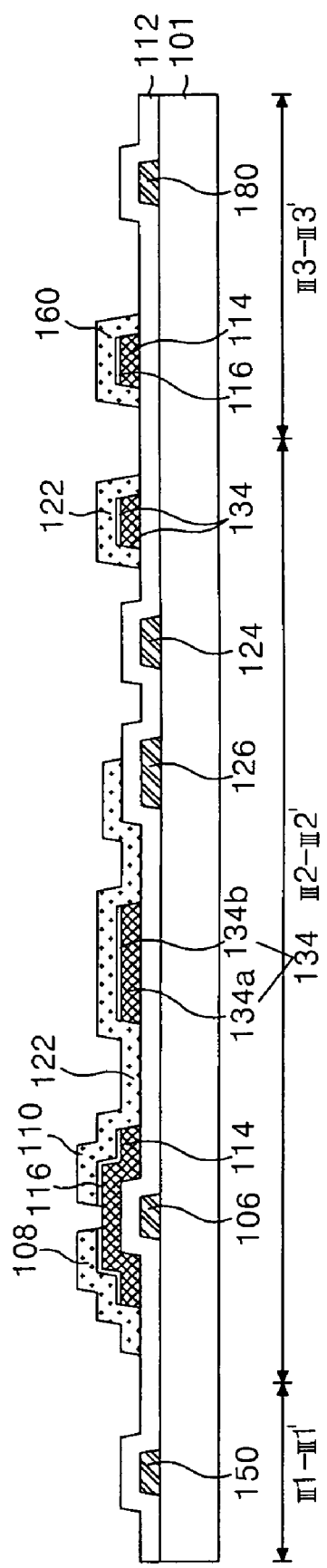

Subsequently, the third soft mold 240 is separated from the substrate 101 and thereafter the data metal layer 209 is patterned by an etching process using the etch resist pattern 244 as a mask, thereby providing the second conductive pattern group including the data line 104, the source electrode 108, the drain electrode 110 and the data pad 160 and the pixel electrode 122, as shown in FIG. 17C. Finally, the etch resist pattern 244 left on the second conductive pattern group and the pixel electrode 122 is removed by a stripping process using a stripping liquid of a pro-environmental alcohol group. As described above, the pixel electrode 122 is formed from the same data metal layer as the second conductive pattern group simultaneously with the second conductive pattern group to narrow a distance between the holes 240a of the third soft mold 240 for forming the pixel electrode 122 and the second conductive pattern group, thereby shortening a movement distance of the etch resist liquid 242. Thus, a movement of the etch resist liquid 242 can be smoothed to prevent a residual film phenomenon occurring between the second conductive pattern groups.

Figure 18A:
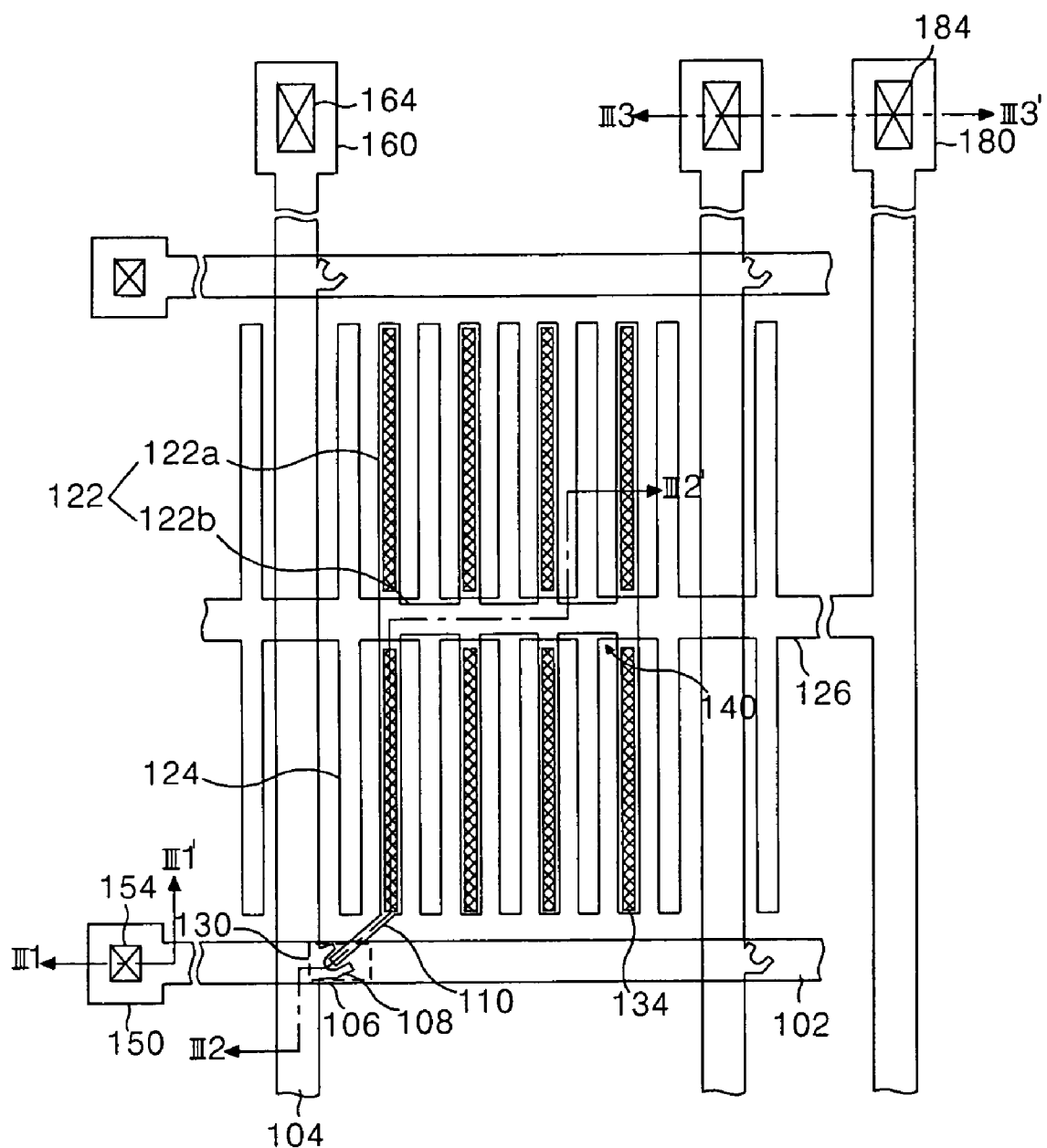
FIG. 18A and FIG. 18B are respectively a plan view and a cross-sectional view representing a protective film having contact holes formed by a fourth soft molding process in the method of fabricating the thin film transistor array substrate according to the second embodiment of the present invention.
Figure 18B:
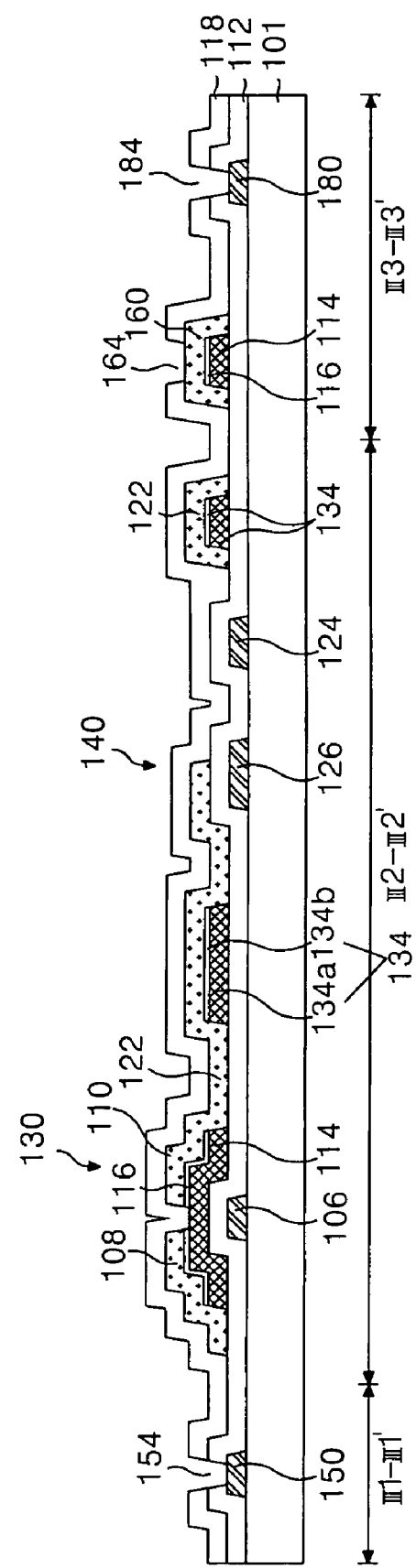

FIG. 18A and FIG. 18B are a plan view and a cross-sectional view for explaining a fourth soft molding process in the method of fabricating the thin film transistor array substrate according to the second embodiment of the present invention, respectively. As shown in FIG. 18A and FIG. 18B, the protective film 118 having the first to third contact holes 154, 164 and 184 is formed on the gate insulating film 112 provided with the second conductive pattern group and the pixel electrode 122.

Figure 19A:
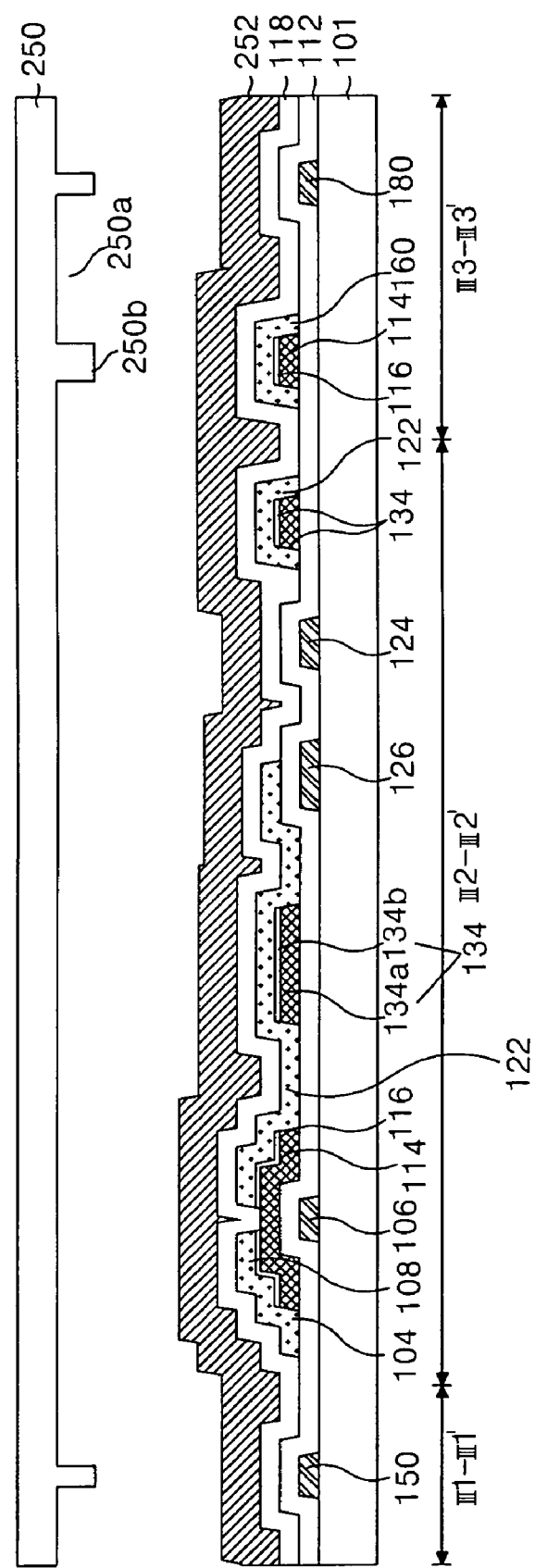
FIG. 19A to FIG. 19C are cross-sectional views for specifically explaining the fourth soft molding process in the method of fabricating the thin film transistor array substrate according to the second embodiment of the present invention.
Figure 19B:
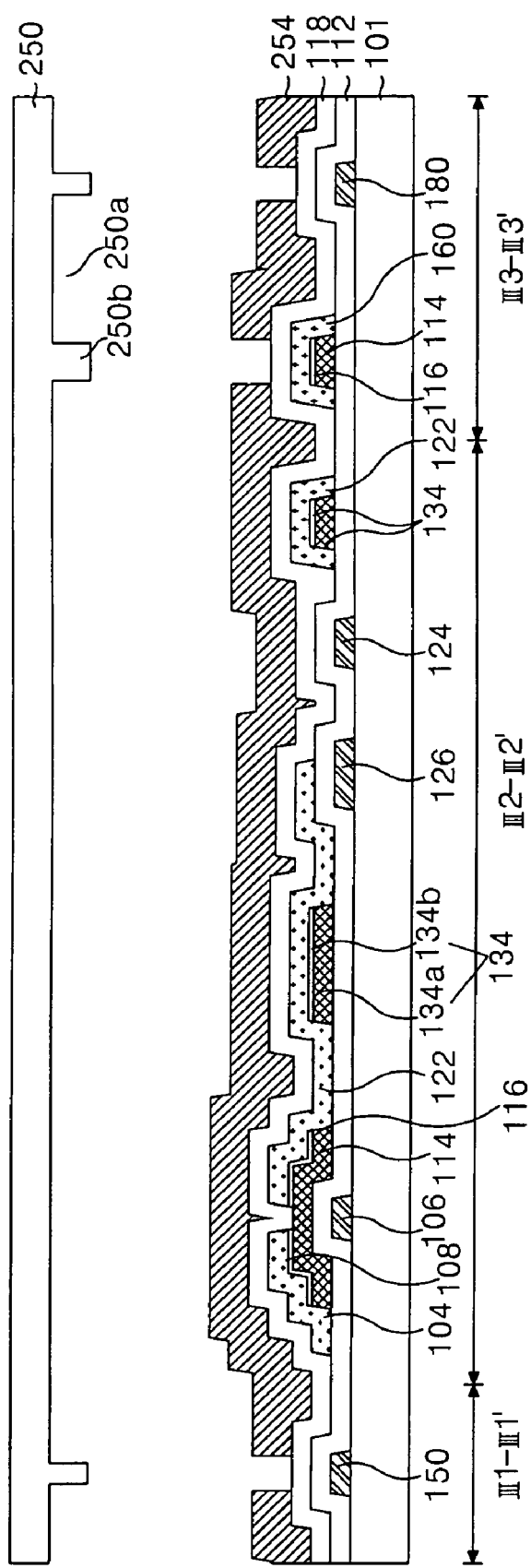

To this end, as shown in FIG. 19A, the protective film 118 is formed on the gate insulating film 112 by a deposition technique, such as PECVD or sputtering, and an etch resist liquid 252 is formed on the protective film 118 by a coating process, such as the nozzle injection or the spin coating. Herein, the protective film 118 is made from an inorganic insulating material identical to the gate insulating film 112, or an organic insulating material such as an acrylic organic compound having a small dielectric constant, BCB or PFCB. Then, a fourth soft mold 250 made from the same material as the first soft mold 220 is aligned on the etch resist liquid 252. The fourth soft mold 250 is pressed on the etch resist liquid 252 during a desired time and at a desired temperature such that the surface of the protrusion 250b of the fourth soft mold 250 becomes in contact with the protective film 118 by its own weight. Then, the etch resist liquid 252 is moved into the hole 250a of the fourth soft mold 250, thereby providing the etch resist pattern 254 having a pattern shape inversion-transcribed with respect to the hole 250a of the fourth soft mold 250, as shown in FIG. 19B.

Figure 19C:
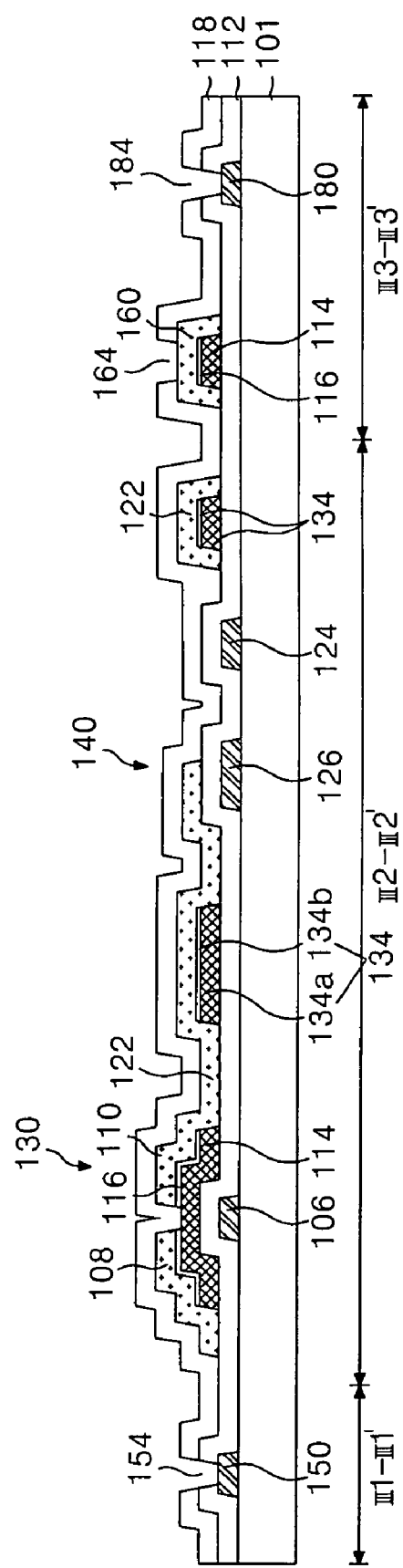

Subsequently, the fourth soft mold 250 is separated from the substrate 101 and thereafter the protective film 118 is patterned by an etching process using the etch resist pattern 254 as a mask, thereby providing the first to third contact holes 154, 164 and 184, as shown in FIG. 19C. Finally, the etch resist pattern 254 left on the protective film 118 is removed by a stripping process using a stripping liquid of a pro-environmental alcohol group. Alternatively, in the thin film transistor array substrate according to the second embodiment of the present invention, the first to third contact holes 154, 164 and 184 may be provided by a pad opening process instead of the fourth soft molding process. In other words, the thin film transistor array substrate and the color filter array substrate entirely provided with the protective film 118 are joined with each other. The protective film 118 and the gate insulating film 112 at the pad area exposed by utilizing the color filter array substrate as a mask are removed to expose the gate pad 150, the data pad 160 and the common pad 180. Accordingly, it becomes possible to reduce the number of total soft molding processes.

Meanwhile, in the thin film transistor array substrate according to the second embodiment of the present invention, an alignment of the liquid crystal positioned at an area between the common electrode 124 adjacent to the data line 104 and the pixel electrode 122 is influenced by a data signal to change transmittance at this area, thereby causing a vertical cross talk. To prevent this cross talk, a width of the common electrode 124 adjacent to the data line 104 is widely set to shield the data signal making an affect to an electric field between the pixel electrode 122 and the common electrode 124. In this case, an aperture ratio is more reduced by the enlarged width of the common electrode 124.

Figure 20:
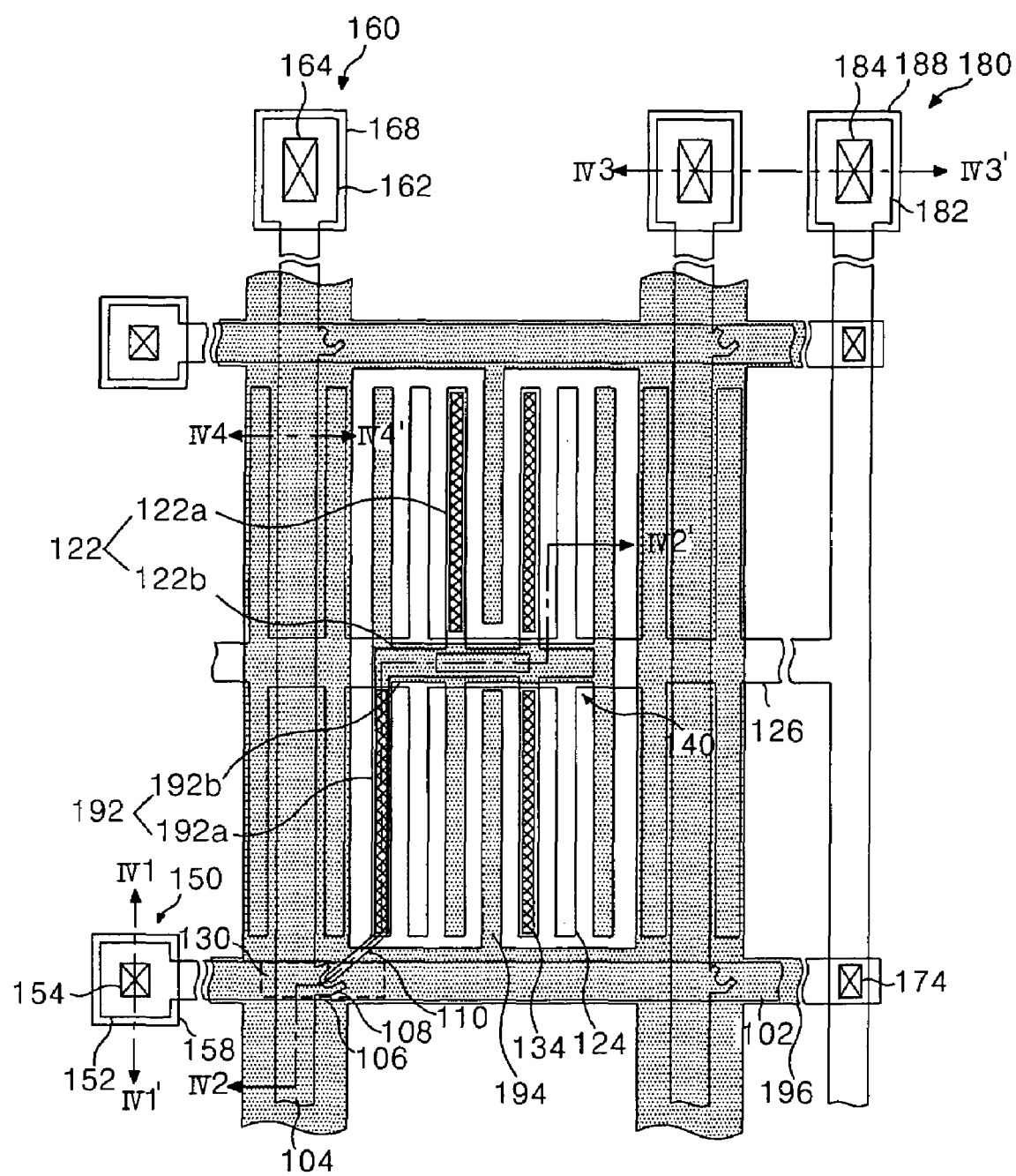
FIG. 20 is a plan view showing a structure of a thin film transistor array substrate in a liquid crystal display panel of horizontal electric field type according to a third exemplary embodiment of the present invention.
Figure 21:
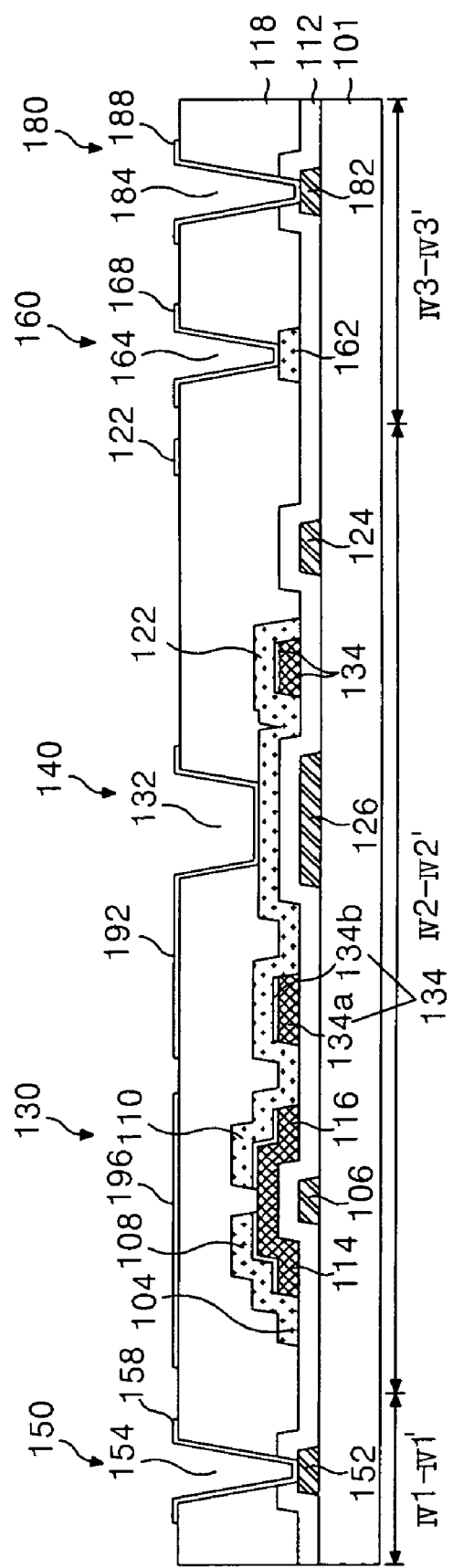
FIG. 21 is a cross-sectional view of the thin film transistor array substrate taken along lines IV1-IV1', IV2-IV2' and IV3-IV3' of FIG. 20.

FIG. 20 is a plan view showing a structure of a thin film transistor array substrate in a liquid crystal display panel of horizontal electric field type according to a third exemplary embodiment of the present invention, and FIG. 21 is a cross-sectional view of the thin film transistor array substrate taken along the IV1-IV1', IV2-IV2' and IV3-IV3' lines in FIG. 20. The thin film transistor array substrate shown in FIG. 20 and FIG. 21 has the same elements as the thin film transistor array substrate shown in FIG. 4 and FIG. 5 except that it further includes dummy conductor patterns 134 provided at the pixel area and each of the pixel electrode 122 and the common electrode 124 is formed from a different metal on a different plane. Therefore, a detailed explanation as to the same elements will be omitted.

The thin film transistor 130 allows a pixel signal of the data line 104 to be charged and maintained in the pixel electrode 122 in response to the gate signal of the gate line 102. To this end, the thin film transistor 130 includes a gate electrode 106 included in the gate line 102, a source electrode 108 connected to the data line 104 and having at least two protrusions, and a drain electrode 110 connected to the pixel electrode 122. Further, the thin film transistor 130 includes an active layer 114 overlapping the gate electrode 106 with having the gate insulating pattern 112 therebetween. The active layer 114 includes a channel between the source electrode 108 and the drain electrode 110. The active layer 114 also overlaps the data line 104. On the active layer 114, an ohmic contact layer 116 for making an ohmic contact with the data line 104, the source electrode 108 and the drain electrode 110 is further provided.

A semiconductor pattern including the active layer 114 and the ohmic contact layer 116 is provided adjacent to a dummy semiconductor pattern 134 positioned in the pixel area. This dummy pattern 134 includes first and second semiconductor layers 134a and 134b sequentially formed from the same material as each of the active layer 114 and the ohmic contact layer 116. The dummy semiconductor pattern 134 overlaps at least one of the pixel electrode 122 and a transparent electrode pattern 192 at the pixel area, and is provided with a width narrower than or equal to the overlapped pixel electrode 122 and transparent electrode pattern 192. A distance between the semiconductor patterns is more narrow than a distance between the related art semiconductor patterns including the active layer and the ohmic contact layer owing to the dummy semiconductor pattern 134 to prevent a residual film phenomenon caused by a far spaced distance between the semiconductor patterns in the related art.

Figure 22:
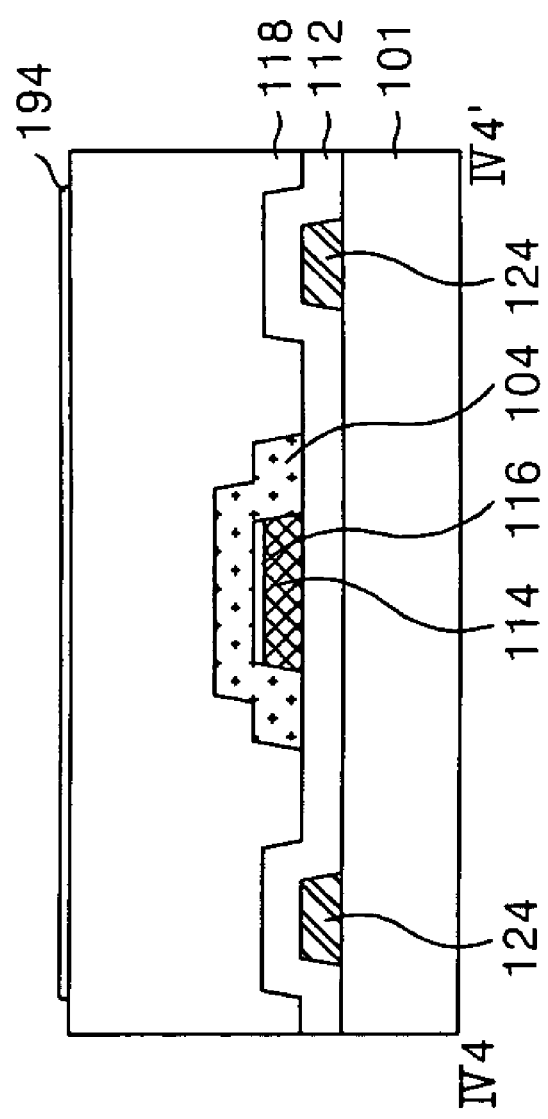
FIG. 22 is a cross-sectional view of the thin film transistor array substrate taken along line IV4-IV4' of FIG. 20, FIG. 23A and FIG. 23B are respectively a plan view and a cross-sectional view representing a first conductive pattern group formed by a first soft molding process in the method of fabricating the thin film transistor array substrate according to the third embodiment of the present invention.

The protective film 118 made from an organic insulating material having a low dielectric constant is provided on the lower substrate 101 to protect the thin film transistor 130. In this case, as shown in FIG. 22, the data line 104 overlaps a first common electrode 124 with the gate insulating film 112 therebetween while also overlapping a second common electrode 194 with having the protective film 118 therebetween. Due to the first and second common electrodes 124 and 194 overlapping the data line (or gate line) with the gate insulating film 112 or the protective film 118 therebetween, first and second common lines 126 and 196 under the influence of a gate signal and a data signal make an electric field between the common electrodes 124 and 194 and the pixel electrodes 122 and 192 positioned in the pixel area. Accordingly, the common electrode 124 adjacent to the data line 104 is provided to overlap the data line 104, thereby improving an aperture ratio by an area occupied by the common electrode 124 at the pixel area. Also, the second common electrode 194 and the second pixel electrode 192 are formed from a transparent conductive material, thereby improving aperture ratio.

The pixel electrode includes a first pixel electrode 122 which is integral to the drain electrode 110 of the thin film transistor 130, and a second pixel electrode 192 connected to the first pixel electrode 122. The first pixel electrode 122 is formed from the same metal as the drain electrode 110 of the thin film transistor 130 on the gate insulating film 112. The first pixel electrode 122 includes a first vertical portion 122a provided parallel to the data line 104, and a first horizontal portion 122b provided parallel to the gate line 102 connected to the first vertical portion 122a. The second pixel electrode 192 is connected, via a first contact hole 132, to the first pixel electrode 122, and is formed from a transparent conductive material on the protective film 118. The second pixel electrode 192 includes a second vertical portion 192a provided parallel to the data line 104, and a second horizontal portion 192b provided parallel to the gate line 102. The second horizontal portion 192b and the first horizontal portion 122b are provided overlapping each other, whereas the second vertical portion 192a and the first vertical portion 122a are provided not overlapping each other.

The common electrode 124 includes a first common electrode 124 connected to the first common line 126, and a second common electrode 194 connected to the second common line 196 contacting the first common line 126 via a fifth contact hole 174. The first common electrode 124 protrudes in a direction parallel to the data line 104 from the first common line 126 provided crossing the pixel area in a direction parallel to the gate line 102. The first common electrode 124 and the first common line 126 are formed from the same metal as the gate line 102 on the same plane. The second common electrode 194 is protrudes in a direction parallel to the data line 104 from the second common line 196 overlapping the gate line 102. The second common electrode 194 and the second common line 196 are formed from the same metal as the second pixel electrode 192 on the same plane. The first and second common electrodes 124 and 194 are provided parallel to the first and second vertical portions 122a and 192a of the first and second pixel electrodes 122 and 192 between them.

Accordingly, a horizontal electric field is formed between the first and second pixel electrodes 122a and 192a to which a pixel signal is supplied via the thin film transistor 130 and the first and second common electrodes 124 and 194 to which a reference voltage is supplied via the first and second common lines 126 and 196. Liquid crystal molecules arranged in the horizontal direction between the thin film transistor array substrate and the color filter array substrate by such a horizontal electric field are rotated due to a dielectric anisotropy. Transmittance of a light through the pixel area 5 is differentiated depending upon a rotation extent of the liquid crystal molecules, thereby implementing a gray level scale. The storage capacitor 140 is defined by the first common line 126, and the first pixel electrode 122 overlapping the first common line 126 with the gate insulating film therebetween. The storage capacitor 140 allows a pixel signal charged in the pixel electrode to be stably maintained until the next pixel signal is charged.

FIG. 23A to FIG. 27B are a plan view and a section view showing a method of fabricating the thin film transistor array substrate shown in FIG. 19 and FIG. 20.

Figure 23A:
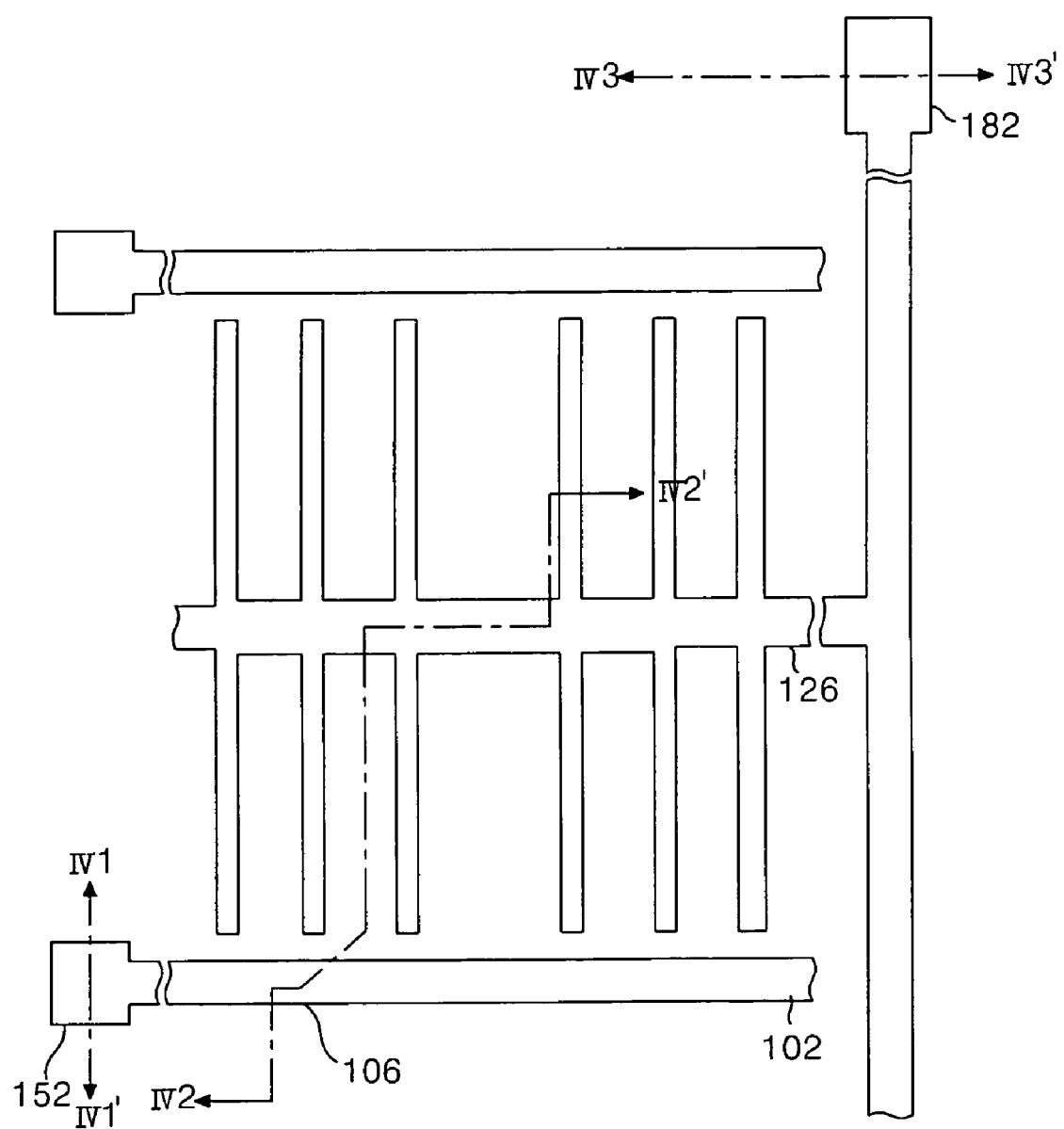
Figure 23B:
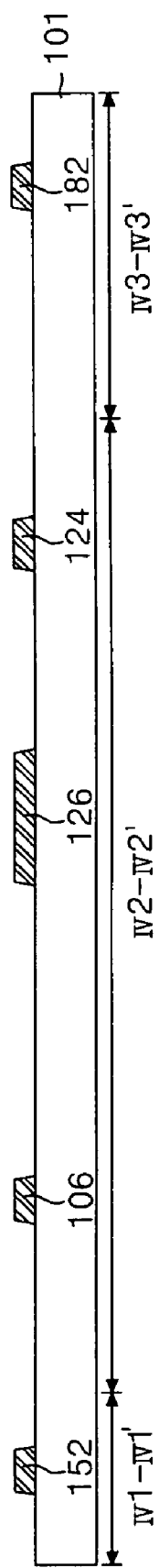

First, a gate metal film is formed on the lower substrate 101 by a deposition technique, such as sputtering. An etch resist is coated onto the gate metal film and a first soft mold is pressed on the etch resist, thereby providing an etch resist pattern. The gate metal film is etched using the etch resist pattern as a mask, thereby forming a first conductive pattern group including the gate electrode 106, the gate line 102, the lower gate pad electrode 152, the first common electrode 124, the first common line 126 and the lower common pad electrode 182 on the substrate, as shown in FIG. 23A and FIG. 23B.

Figure 24A:
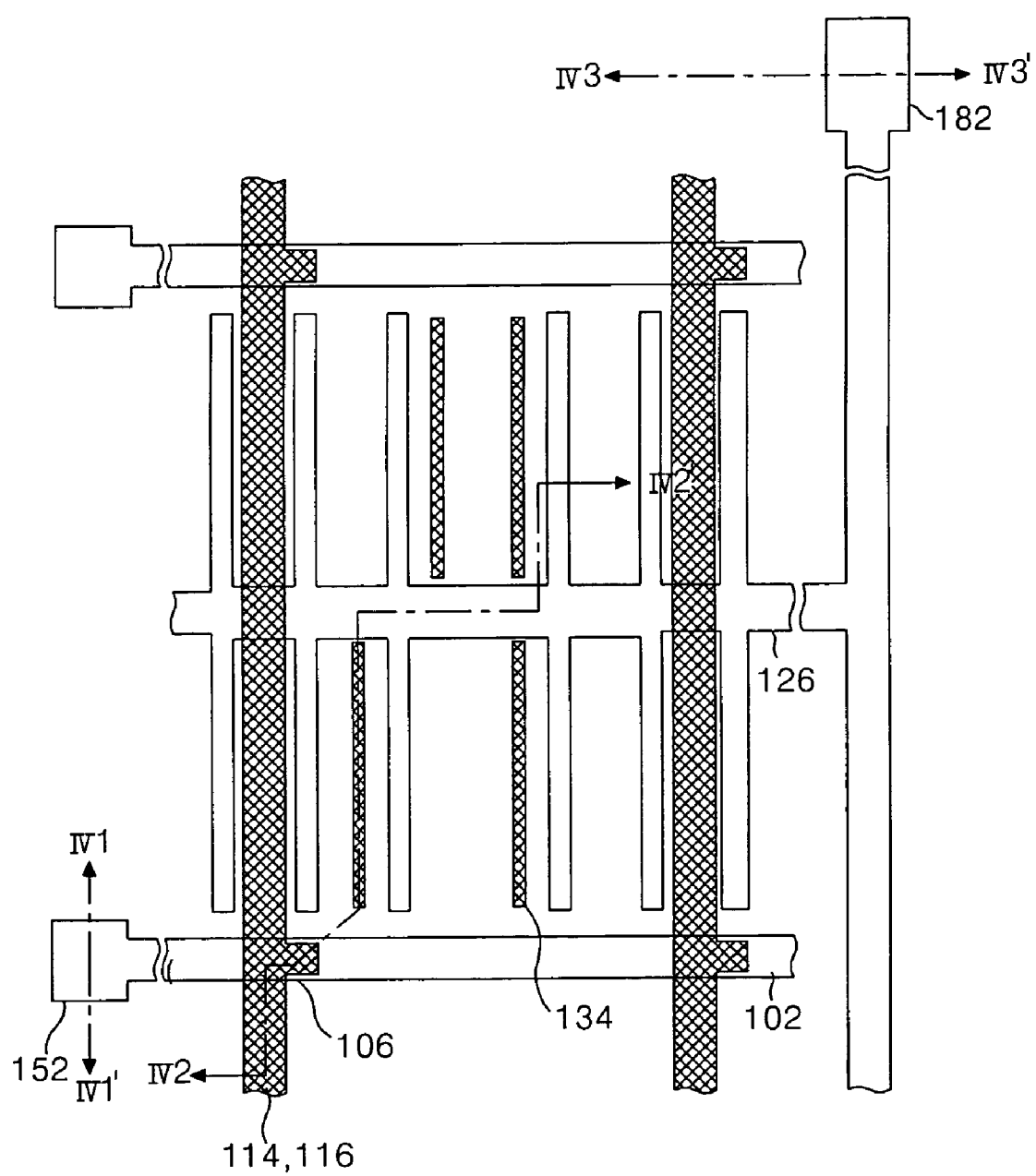
FIG. 24A and FIG. 24B are respectively a plan view and a cross-sectional view representing a semiconductor pattern formed by a second soft molding process in the method of fabricating the thin film transistor array substrate according to the third embodiment of the present invention.
Figure 24B:
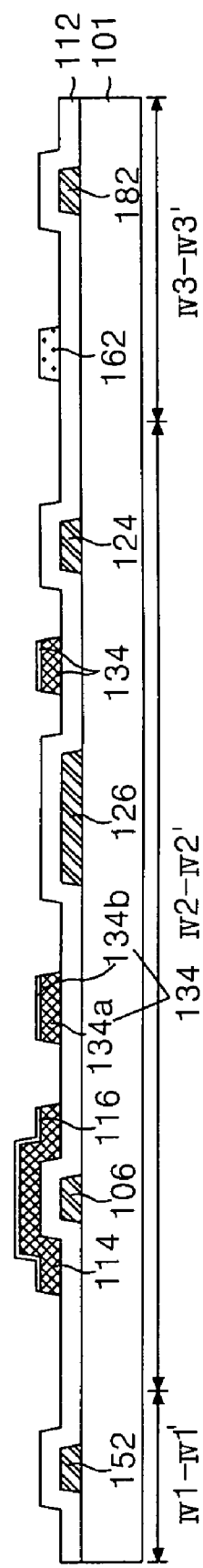

A gate insulating film 112, an amorphous silicon layer and an $n^+$ amorphous silicon layer are sequentially formed on the lower substrate 101 provided with the first conductive pattern group by a deposition technique, such as PECVD. Then, the etch resist is coated onto the $n^+$ amorphous silicon layer and a second soft mold is pressed on the etch resist to thereby provide an etch resist pattern. The amorphous silicon layer and the $n^+$ amorphous silicon layer are etched by utilizing the etch resist pattern as a mask, thereby providing a semiconductor pattern including the active layer 114 and the ohmic contact layer 116 on the gate insulating film and a dummy semiconductor pattern 134 positioned within the pixel area on the gate insulating film 112, as shown in FIG. 24A and FIG. 24B. As mentioned above, the dummy semiconductor pattern 134 is provided between the first common electrodes 124 within the pixel area to narrow a distance between the holes of the second soft mold for forming the semiconductor patterns 114 and 116 and the dummy semiconductor pattern 134, thereby shortening a movement distance of an etch resist liquid. Accordingly, movement of the etch resist liquid can be smoothed to prevent a residual film phenomenon caused by the semiconductor patterns.

Figure 25A:
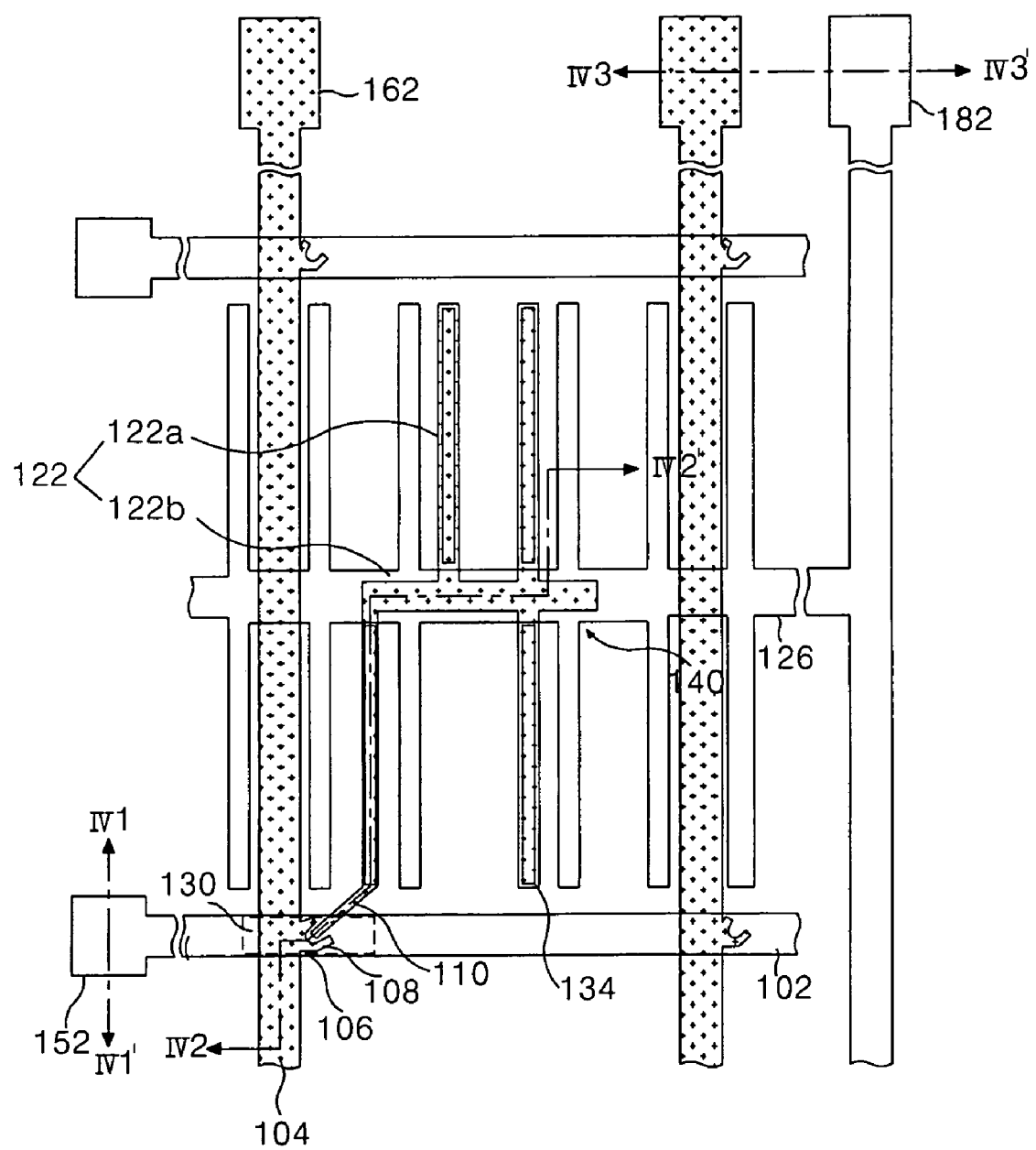
FIG. 25A and FIG. 25B are respectively a plan view and a cross-sectional view representing a second conductive pattern group formed by a third soft molding process in the method of fabricating the thin film transistor array substrate according to the third embodiment of the present invention.
Figure 25B:
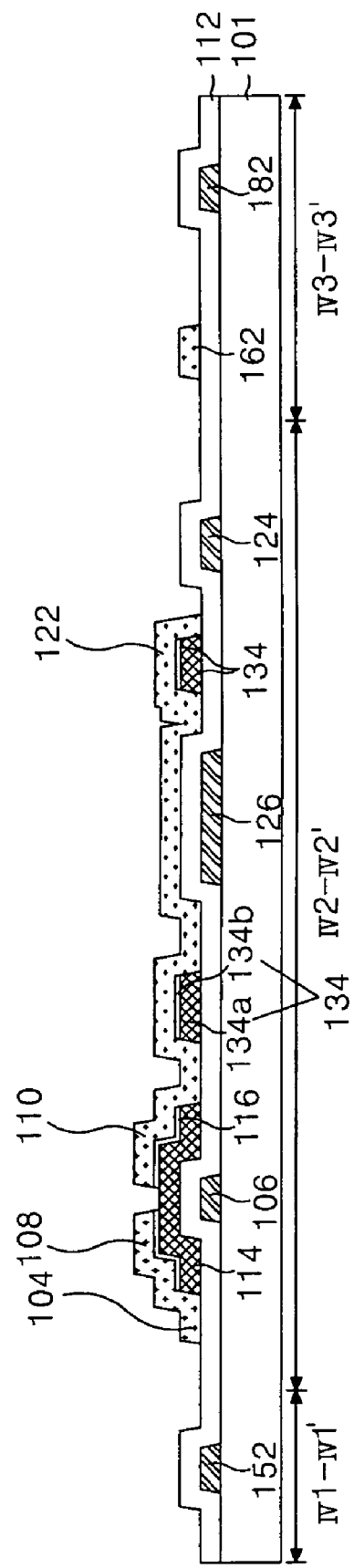

A data metal layer is formed on the gate insulating film 112 provided with the semiconductor patterns 114 and 116 and the dummy semiconductor pattern 134 by a deposition technique, such as sputtering. Then, an etch resist is coated onto the data metal layer and a third soft mold is pressurized on the etch resist, thereby providing an etch resist pattern. The data metal layer is etched using the etch resist pattern as a mask, thereby forming a second conductive pattern group including the data line 104, the source electrode 108, the drain electrode 110, the lower data pad electrode 162 and the first pixel electrode 122, as shown in FIG. 25A and FIG. 25B. Subsequently, the exposed ohmic contact layer 116 between the source electrode 108 and the drain electrode 110 is etched using the source electrode 108 and the drain electrode 110 as a mask. Thus, the active layer 114 at the channel portion of the thin film transistor is exposed. As mentioned above, the first pixel electrode 122 is formed from the data metal layer to narrow a distance between the holes of the third soft mold for forming the second conductive pattern group including the first pixel electrode 122, thereby shortening a movement distance of an etch resist liquid. Accordingly, a movement of the etch resist liquid can be smoothed to prevent a residual film phenomenon caused by the second conductive pattern groups.

Figure 26A:
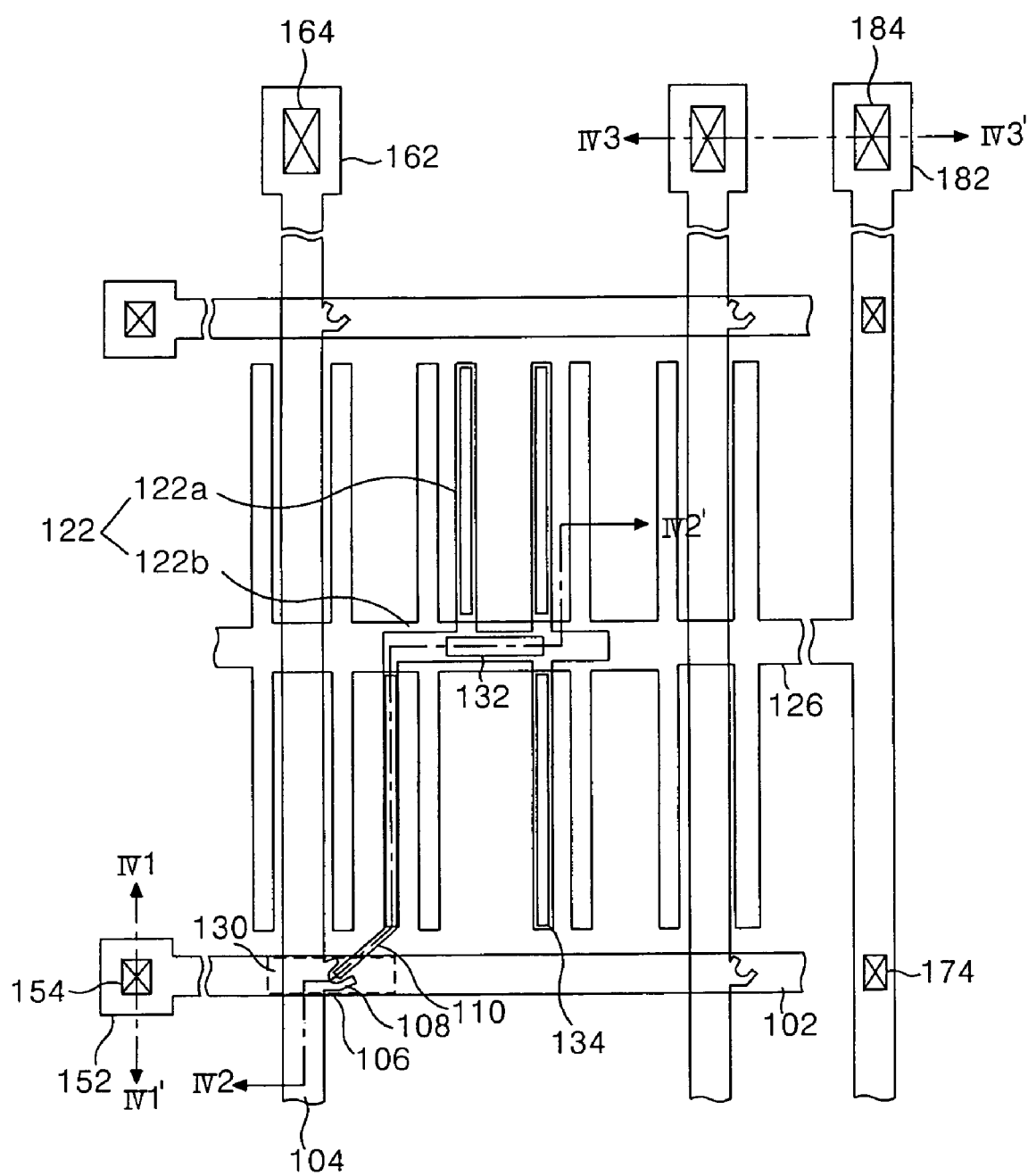
FIG. 26A and FIG. 26B are respectively a plan view and a cross-sectional view representing a protective film having contact holes formed by a fourth soft molding process in the method of fabricating the thin film transistor array substrate according to the third embodiment of the present invention.
Figure 26B:
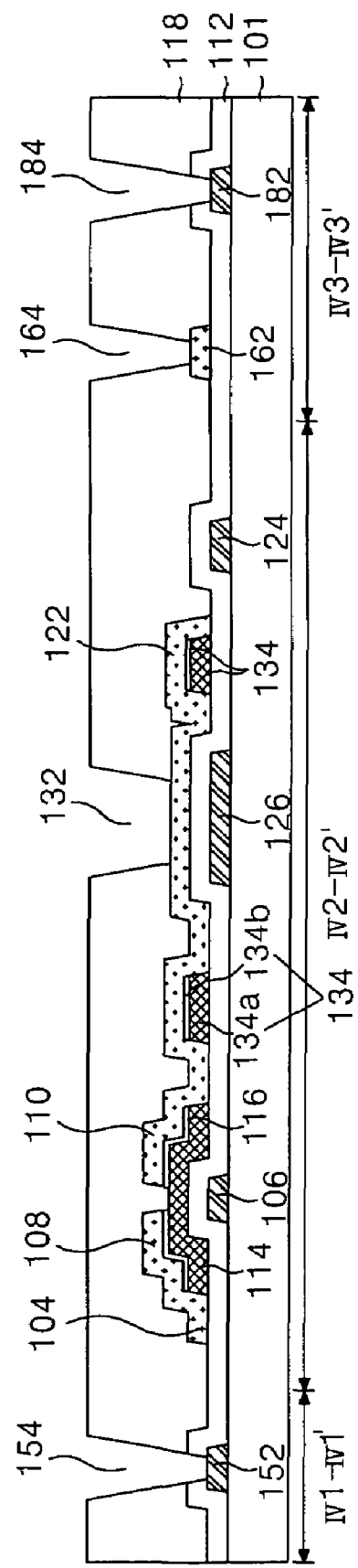

The protective film 118 made from an organic insulating material is entirely formed on the gate insulating film 112 provided with the second conductive pattern group. Then, an etch resist is coated onto the protective film 118 and a fourth soft mold is pressurized on the etch resist, thereby providing an etch resist pattern. The protective film 118 is etched using the etch resist pattern as a mask, thereby providing first to fifth contact holes 132, 154, 164, 184 and 174, as shown in FIG. 26A and FIG. 26B.

Figure 27A:
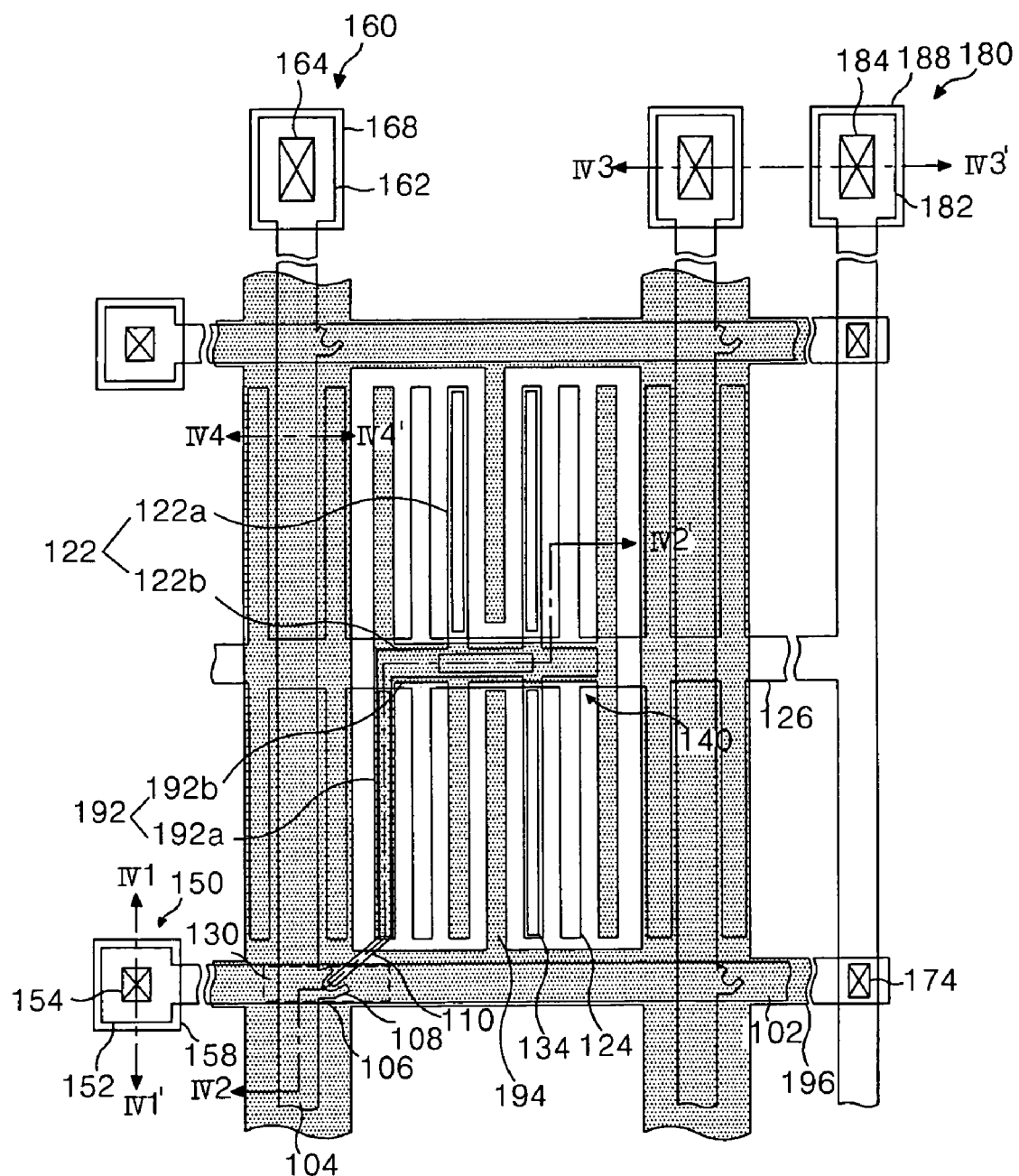
FIG. 27A and FIG. 27B are respectively a plan view and a cross-sectional view representing a third conductive pattern group formed by a fifth soft molding process in the method of fabricating the thin film transistor array substrate according to the third embodiment of the present invention.
Figure 27B:
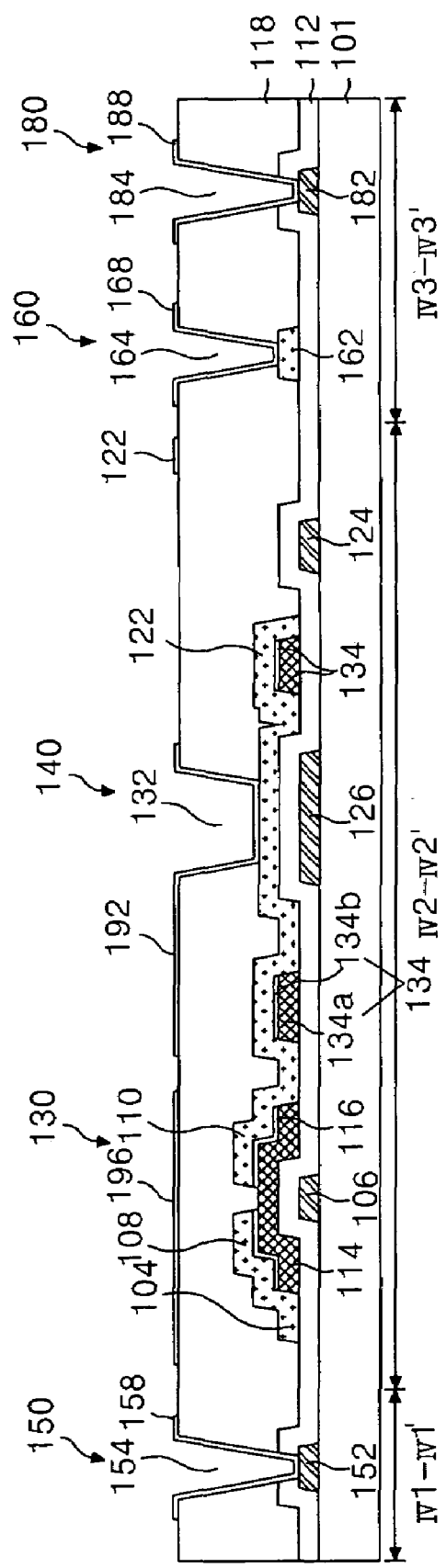

A transparent conductive film is coated onto the protective film 118 having the first to fifth contact holes 132, 154, 164, 184 and 174 by a deposition technique such as sputtering. Then, an etch resist is coated onto the transparent conductive film and a fifth soft mold is pressurized on the etch resist, thereby providing an etch resist pattern. The transparent conductive film is etched using the etch resist pattern as a mask, thereby providing a third conductive pattern group including the second pixel electrode 192, the second common electrode 194, the second common line 196, the upper gate pad electrode 158, the upper data pad electrode 168 and the upper common pad electrode 188, as shown in FIG. 27A and FIG. 27B.

Figure 28:
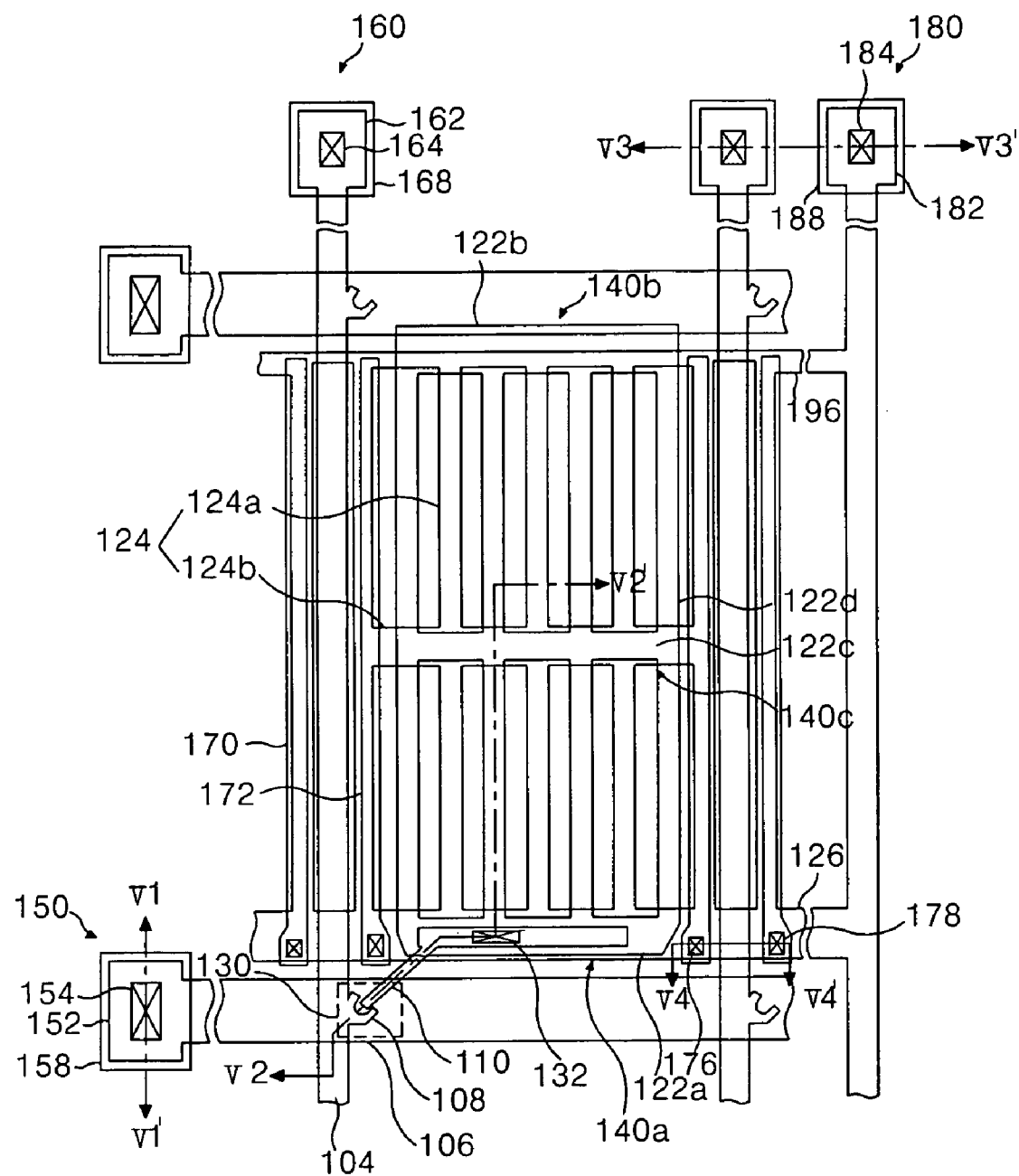
FIG. 28 is a plan view showing a structure of a thin film transistor array substrate in a liquid crystal display panel of horizontal electric field type according to a fourth exemplary embodiment of the present invention.
Figure 29:
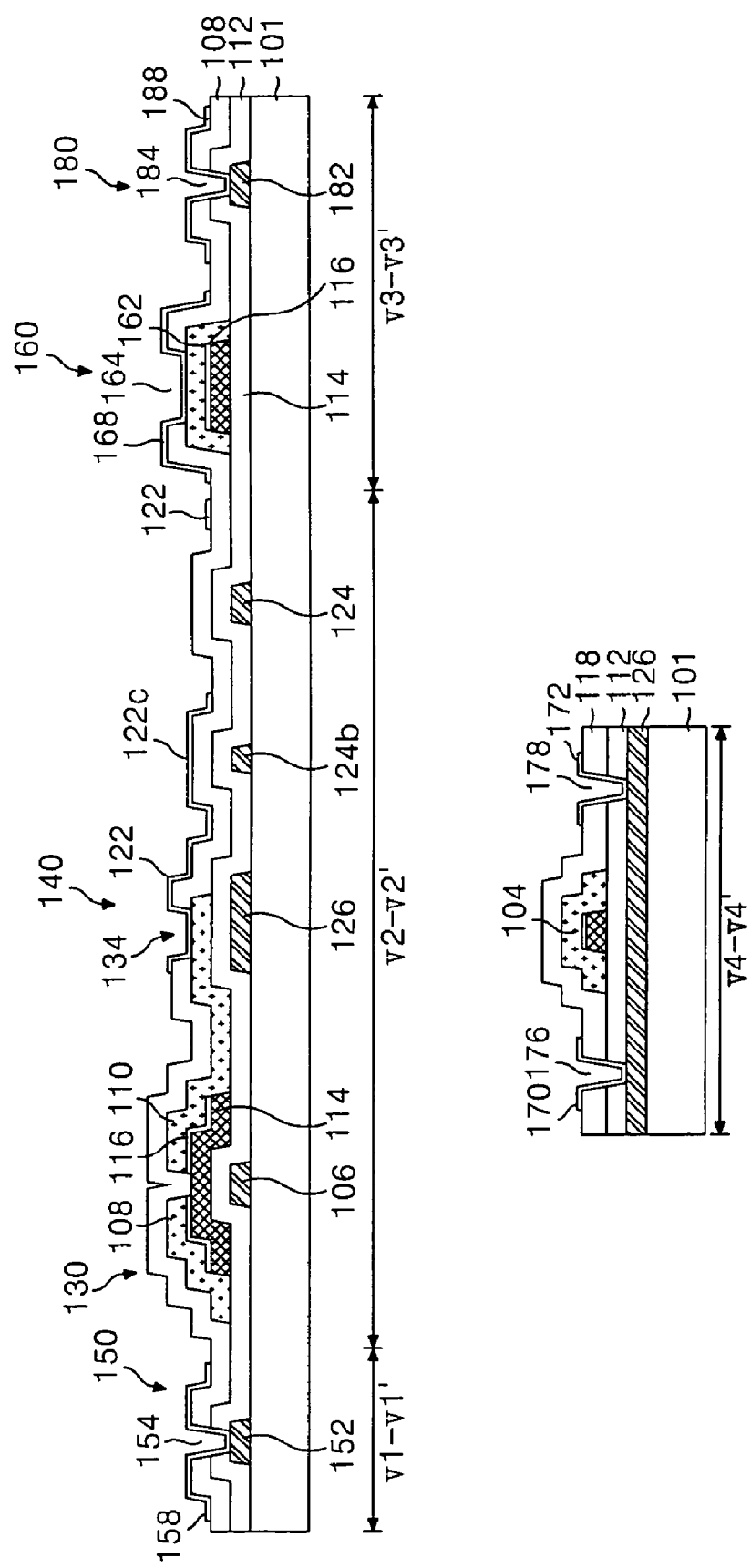
FIG. 29 is a cross-sectional view of the thin film transistor array substrate taken along lines V1-V1', V2-V2', V3-V3' and V4-V4' of FIG. 28, FIG. 30A and FIG. 30B are respectively a plan view and a cross-sectional view representing a first conductive pattern group formed by a first soft molding process in the method of fabricating the thin film transistor array substrate according to the fourth embodiment of the present invention.

FIG. 28 is a plan view showing a structure of a thin film transistor array substrate in a liquid crystal display panel of horizontal electric field type according to a fourth exemplary embodiment of the present invention, and FIG. 29 is a section view of the thin film transistor array substrate taken along lines V1-V1', V2-V2', V3-V3' and V4-V4' of FIG. 28.

Referring to FIG. 28 and FIG. 29, the thin film transistor array substrate according to the fourth embodiment of the present invention includes a gate line 102 and a data line 104 provided on a lower substrate 101 intersecting each other with a gate insulating film 112 therebetween, a thin film transistor 130 provided at each intersection, a pixel electrode 122 and a common electrode 184 provided at a pixel area defined by the intersection structure for forming a horizontal field, and a common line 186 for supplying a reference voltage to the common electrode 184. Further, the thin film transistor array substrate includes a storage capacitor 140 provided at an overlapped portion between the pixel electrode 122 and the common line (or common electrode), a gate pad 150 extended from the gate line 102, and a data pad 160 extended from the data line 104 and a common pad 180 extended from the common line 126. The gate line 102 supplied with a gate signal and the data line 104 supplied with a data signal define a pixel area. The common line for supplying a reference voltage for driving a liquid crystal includes a first common line 126 provided in such a manner to be adjacent to the current stage gate line, and a second common line 196 provided in such a manner to be adjacent to the previous stage gate line.

The thin film transistor 130 allows a pixel signal of the data line 104 to be charged and maintained in the pixel electrode 122 in response to the gate signal of the gate line 102. To this end, the thin film transistor 130 includes a gate electrode 106 included in the gate line 102, a source electrode 108 connected to the data line 104 and having at least two protrusions, and a drain electrode 110 connected, via a first contact hole 132, to the pixel electrode 122. Further, the thin film transistor 130 includes an active layer 114 overlapping the gate electrode 106 with the gate insulating pattern 112 therebetween. The active layer 114 includes a channel between the source electrode 108 and the drain electrode 110. On the active layer 114, an ohmic contact layer 116 for making an ohmic contact with the drain electrode 110 and the storage electrode 128 is further provided.

The pixel electrode 122 is connected, via a first contact hole 132, to the drain electrode 110 of the thin film transistor 130 and is provided in a mesh shape in the pixel area. To this end, the pixel electrode 122 includes a first horizontal portion 122*a* overlapping with the first common line 126 and connected to the drain electrode 110, a second horizontal portion 122*b* overlapping the second common line 196, a third horizontal portion 122*c* positioned between the first and second horizontal portions 122*a* and 122*b*, and a finger portion 122*d* provided between the first and second horizontal portions 122*a* and 122*b* crossing the third horizontal portion 122*c*. The common electrode 124 is connected to the first and second common lines 126 and 196 and is provided in a mesh shape in the pixel area. To this end, the common electrode 124 includes a vertical portion 124*a* provided parallel to the finger portion 122*d* of the pixel electrode 122 between the first and second common lines 126 and 196, and a horizontal portion 124*b* connected to the vertical portion 124*a* and overlapping the third horizontal portion 122*c* of the pixel electrode 122. Accordingly, a horizontal electric field is formed between the pixel electrode 122 to which a pixel signal is supplied via the thin film transistor 130 and the common electrode 124 to which a reference voltage is supplied via the first and second common lines 126 and 196. Liquid crystal molecules arranged in the horizontal direction between the thin film transistor array substrate and the color filter array substrate by the horizontal electric field are rotated due to a dielectric anisotropy. Transmittance of a light through the pixel area is differentiated depending upon a rotation extent of the liquid crystal molecules, thereby implementing a gray level scale.

The storage capacitor allows a pixel signal charged on the pixel electrode 122 to be stably maintained until the next pixel signal is charged. To this end, the storage capacitor includes first to third storage capacitors 140*a*, 140*b* and 140*c*. The first storage capacitor 140*a* includes the first common line 126, the drain electrode 110 overlapping the common line 126 with the gate insulating film therebetween, and the pixel electrode 122 connected, via the first contact hole 132 passing through the protective film 118, to the drain electrode 110. The second storage capacitor 140*b* includes the second common line 126*b*, and the second horizontal portion 122*b* overlapping the second common line 126*b* with the gate insulating film 112 and the protective film 118 therebetween. The third storage capacitor 140*c* includes the horizontal portion 124*b* of the common electrode, and the third horizontal portion 122*c* of the pixel electrode 122 overlapping the horizontal portion 124*b* of the common electrode with having the gate insulating film 112 and the protective film 118 therebetween.

The gate pad 150 is connected to a gate driver (not shown) to apply a gate signal from the gate driver to the gate line 102. The gate pad 150 includes a lower gate pad electrode 152 extended from the gate line 102, and an upper gate pad electrode 158 connected, via a second contact hole 154 passing through the gate insulating film 112 and the protective film 118, to the lower gate pad electrode 152. The data pad 160 is connected to a data driver (not shown) to apply a data signal from the data driver to the data line 104. The data pad 160 includes a lower data pad electrode 162 extended from the data line 104, and an upper data pad electrode 168 connected, via a third contact hole 164 passing through the protective film 118, to the lower data pad electrode 162. The common pad 180 receives a reference voltage from an external reference voltage source (not shown) to be applied to the common line 126. The common pad 180 includes a lower common pad electrode 182 extended from the first and second common lines 126 and 196, and an upper common pad electrode 188 connected, via a fourth contact hole 184 passing through the gate insulating film 112 and the protective film 118, to the lower common pad electrode 182.

The first and second transparent electrode patterns 170 and 172 are provided at each side of the data line 104, and are connected, via fifth and sixth contact holes 176 and 178, to the common electrode 124. The first and second transparent electrode patterns 170 and 172 having received a signal Via the common electrode 124 provide a horizontal electric field between the common electrode 124 and the pixel electrode 122 positioned within the pixel area.

As described above, in the thin film transistor array substrate according to the fourth embodiment of the present invention, at least one of the pixel electrode 122 and the common electrode 124 having a narrow width is formed in a mesh shape. Accordingly, even though a breakage is locally generated in any of the pixel electrode 122 and the common electrode 124 due to air bubbles produced in the course of the etch resist pattern process, a pixel voltage signal can be applied to the pixel electrode and a common voltage signal can be applied to the common electrode.

FIG. 30A to FIG. 34B are respectively a plan view and a section view showing a method of fabricating the thin film transistor array substrate shown in FIG. 28 and FIG. 29.

Figure 30A:
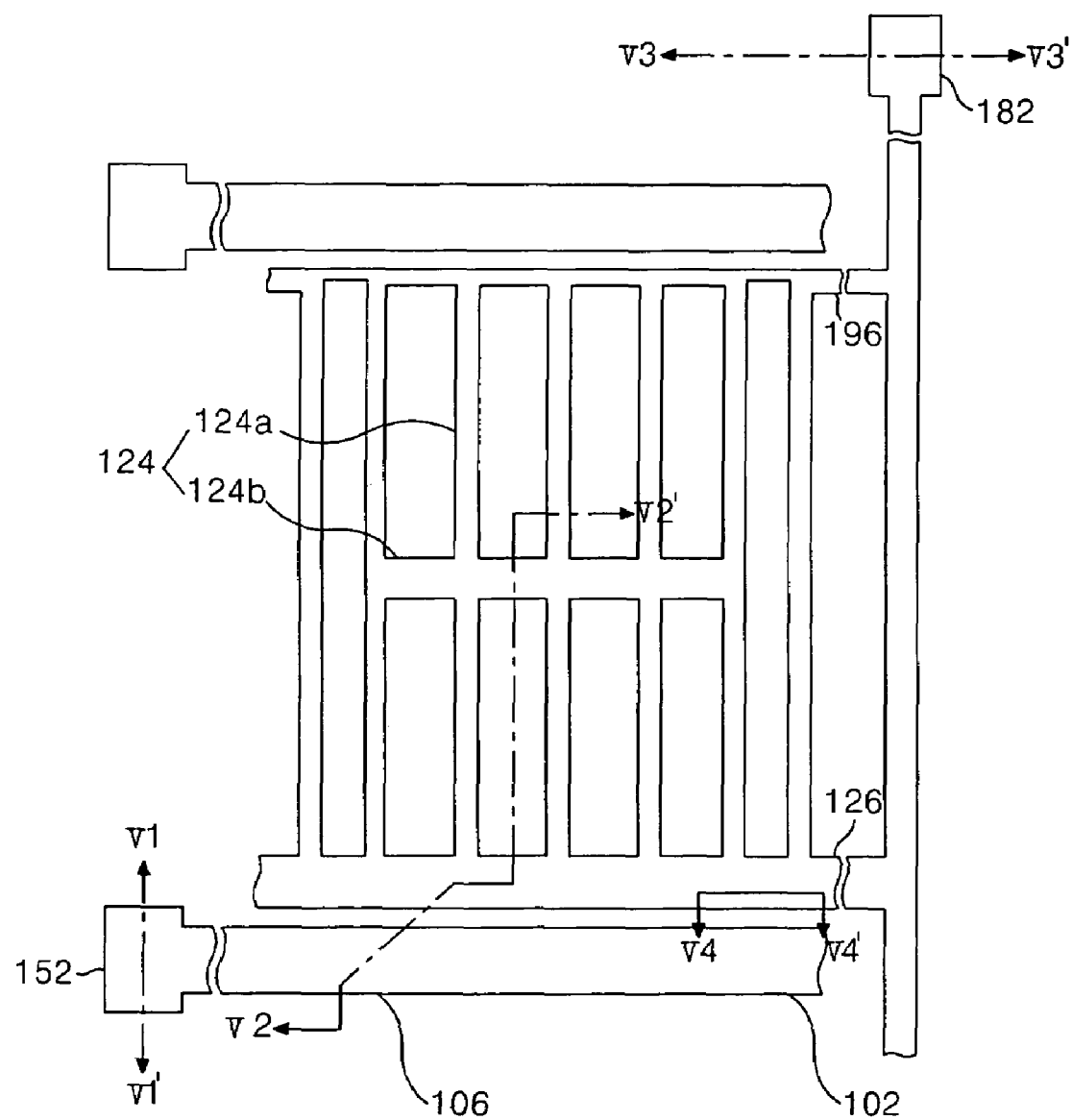
Figure 30B:
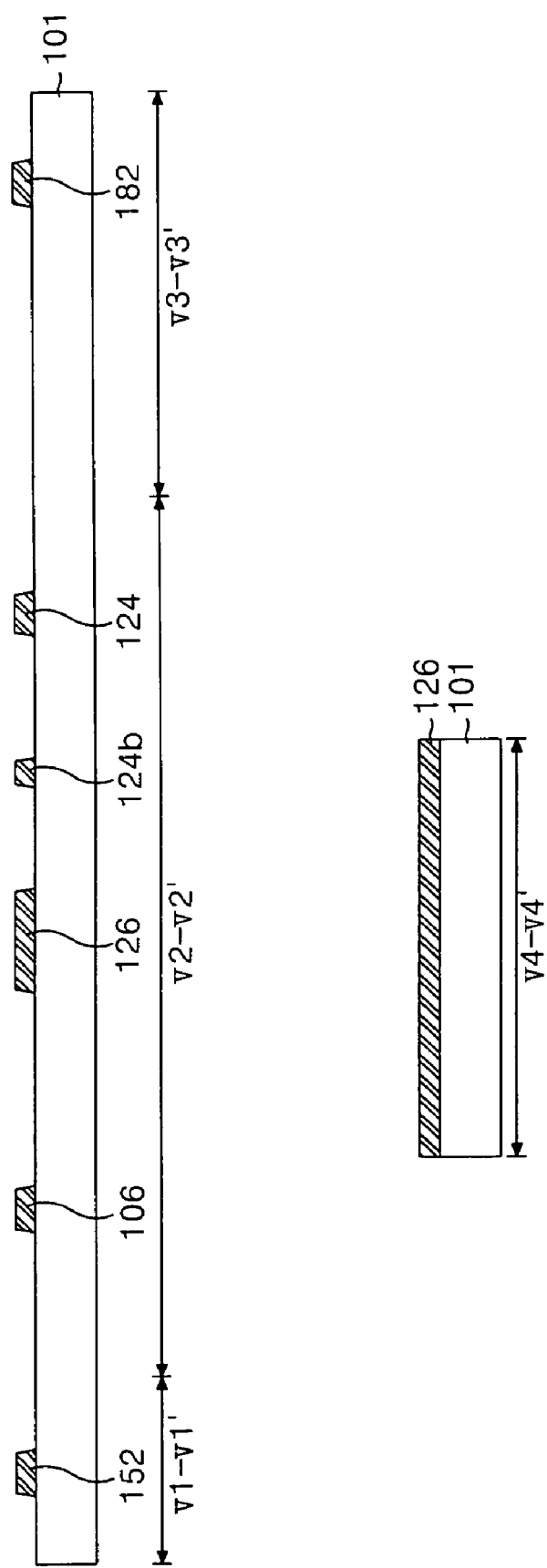

First, a gate metal film is formed on the lower substrate 101 by a deposition technique, such as sputtering. An etch resist is coated onto the gate metal film and a first soft mold is pressurized on the etch resist, thereby providing an etch resist pattern. The gate metal film is etched using the etch resist pattern as a mask, thereby forming a first conductive pattern group including the gate electrode 106, the gate line 102, the lower gate pad electrode 152, the first and second common lines 126 and 196, the common electrode 124 and the lower common pad electrode 182 on the substrate, as shown in FIG. 30A and FIG. 30B.

Figure 31A:
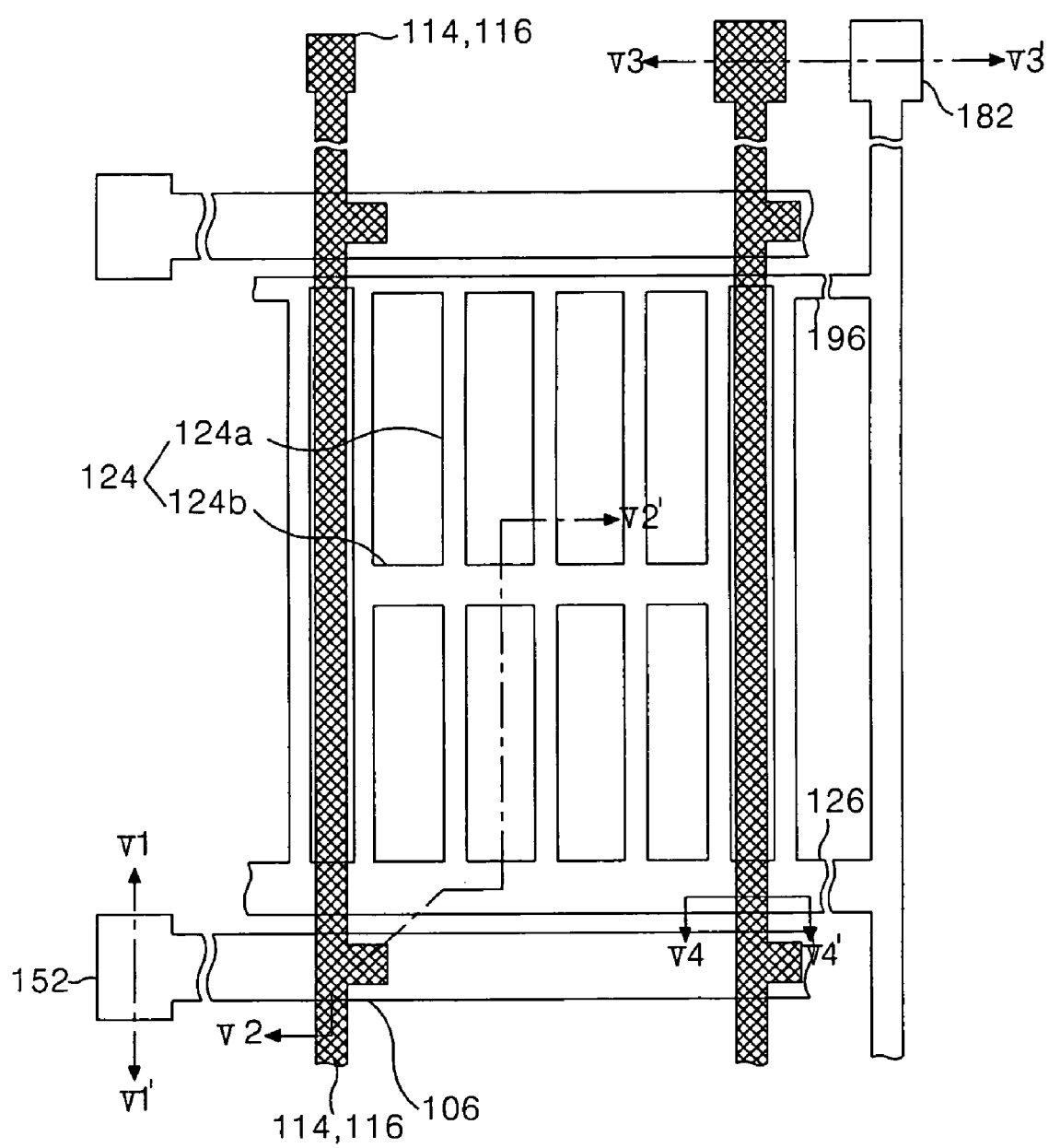

A gate insulating film 112, an amorphous silicon layer and an $n^+$ amorphous silicon layer are sequentially formed on the lower substrate 101 provided with the first conductive pattern group by a deposition technique, such as PECVD. Then, the etch resist is coated onto the $n^+$ amorphous silicon layer and a second soft mold is pressed on the etch resist, thereby providing an etch resist pattern. The amorphous silicon layer and the $n^+$ amorphous silicon layer are etched by using the etch resist pattern as a mask, thereby providing a semiconductor pattern including the active layer 114 and the ohmic contact layers 116 on the gate insulating film, as shown in FIG. 31A and FIG. 31B.

Figure 32A:
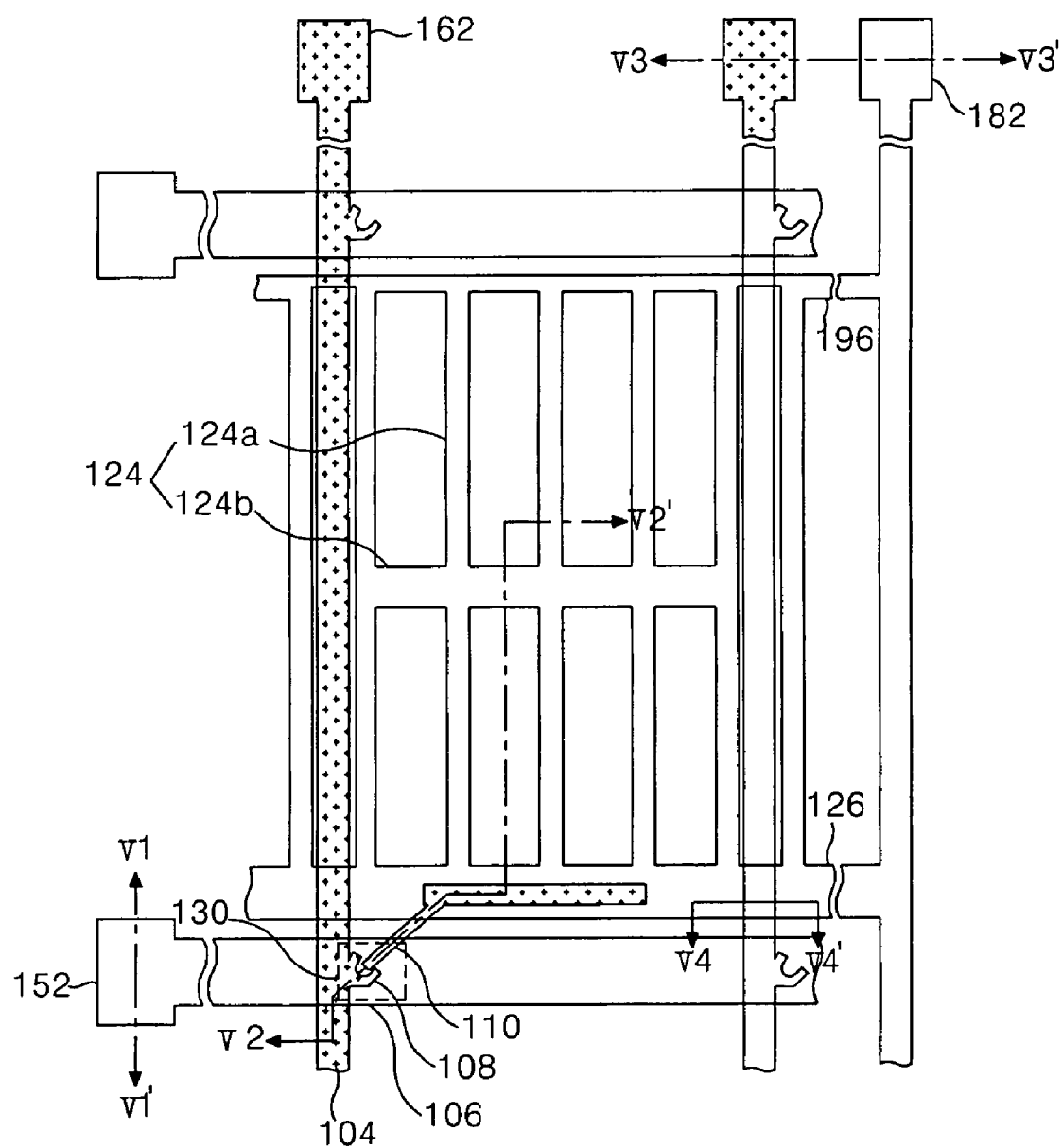
FIG. 32A and FIG. 32B are respectively a plan view and a cross-sectional view representing a second conductive pattern group formed by a third soft molding process in the method of fabricating the thin film transistor array substrate according to the forth embodiment of the present invention.
Figure 32B:
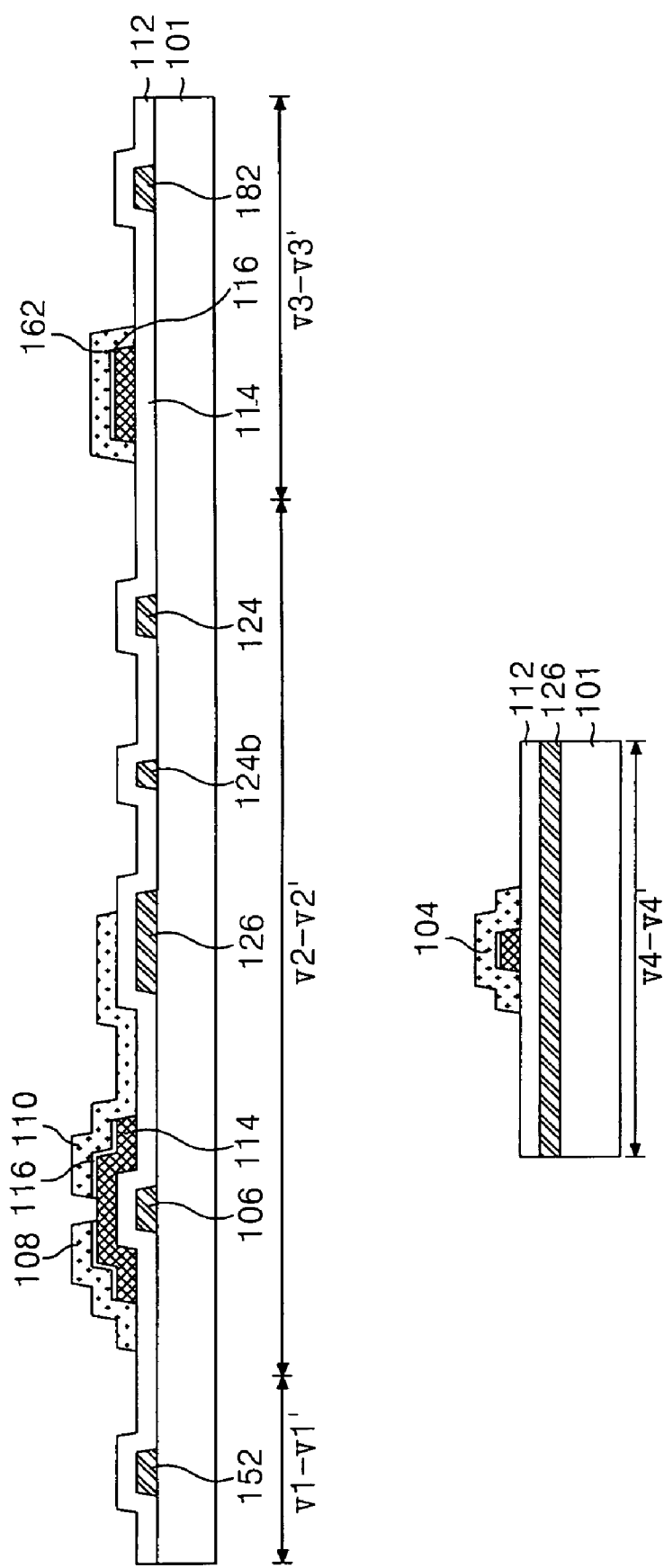

A data metal layer is formed on the gate insulating film 112 provided with the semiconductor pattern by a deposition technique, such as sputtering. Then, an etch resist is coated onto the data metal layer and a third soft mold is pressed on the etch resist, thereby providing an etch resist pattern. The data metal layer is etched using the etch resist pattern as a mask, thereby forming a second conductive pattern group including the data line 104, the source electrode 108, the drain electrode 110 and the lower data pad electrode 162, as shown in FIG. 32A and FIG. 32B. Subsequently, the exposed ohmic contact layer 116 between the source electrode 108 and the drain electrode 110 is etched using the source electrode 108 and the drain electrode 110 as a mask. Thus, the active layer 114 at the channel portion of the thin film transistor is exposed.

Figure 33A:
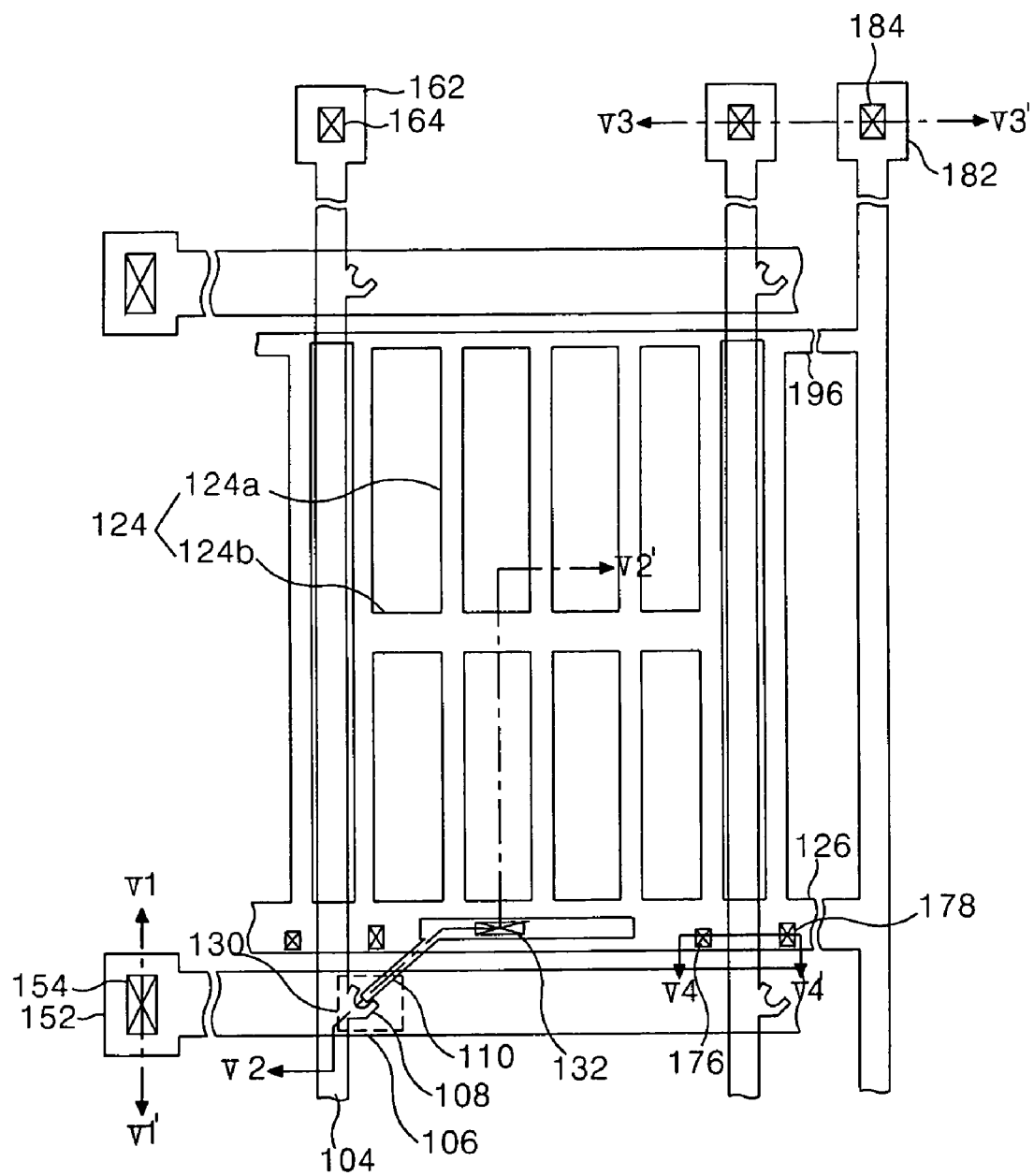
FIG. 33A and FIG. 33B are respectively a plan view and a cross-sectional view representing a protective film having contact holes formed by a fourth soft molding process in the method of fabricating the thin film transistor array substrate according to the fourth embodiment of the present invention.
Figure 33B:
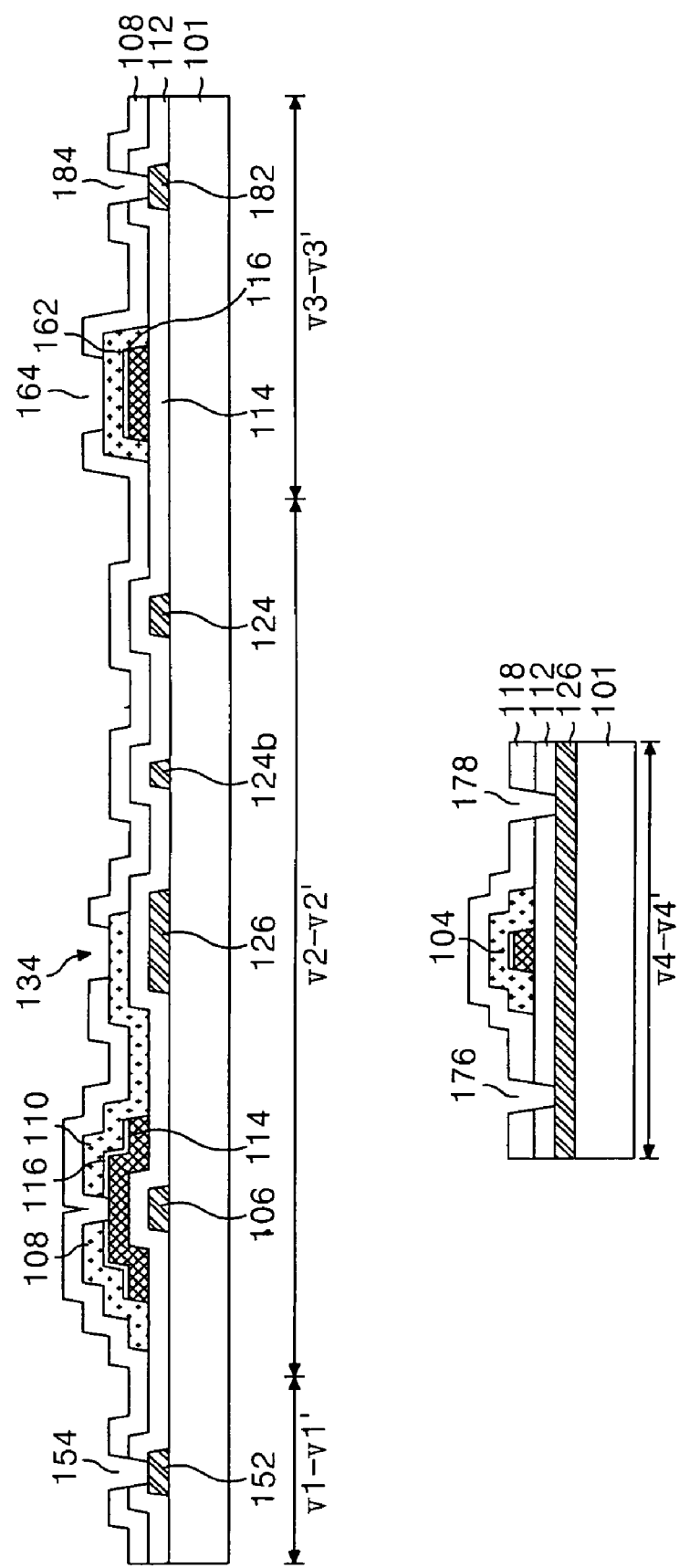

The protective film 118 is entirely formed on the gate insulating film 112 provided with the second conductive pattern group by a deposition technique, such as PECVD. Then, an etch resist is coated onto the protective film 118, and a fourth soft mold is pressurized on the etch resist, thereby providing an etch resist pattern. The protective film 118 is etched using the etch resist pattern as a mask, thereby providing first to sixth contact holes 132, 154, 164, 184, 176 and 178, as shown in FIG. 33A and FIG. 33B.

Figure 1:
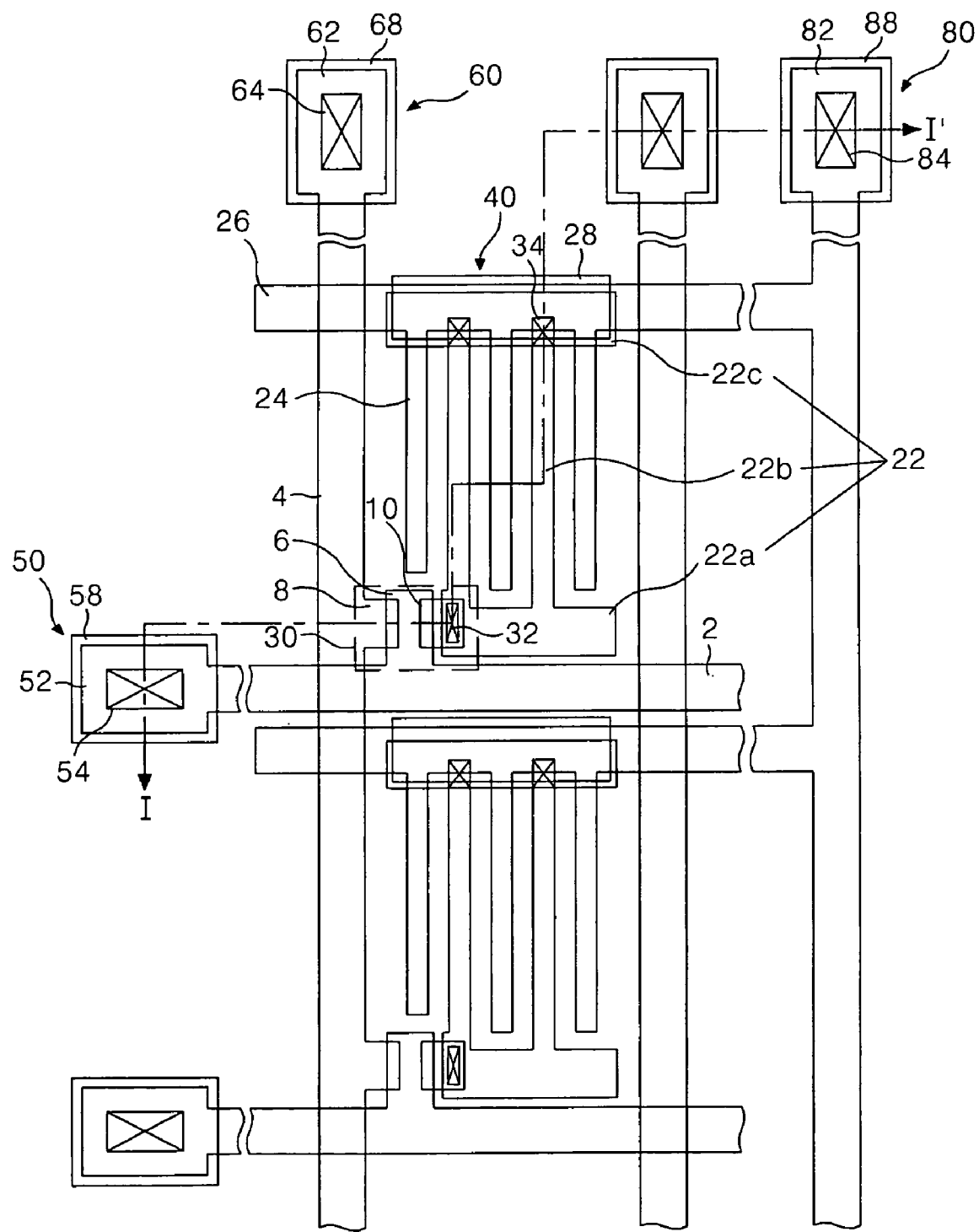
FIG. 1 is a plan view showing a structure of a thin film transistor array substrate in a related art liquid crystal display of horizontal electric field type.
Figure 2:
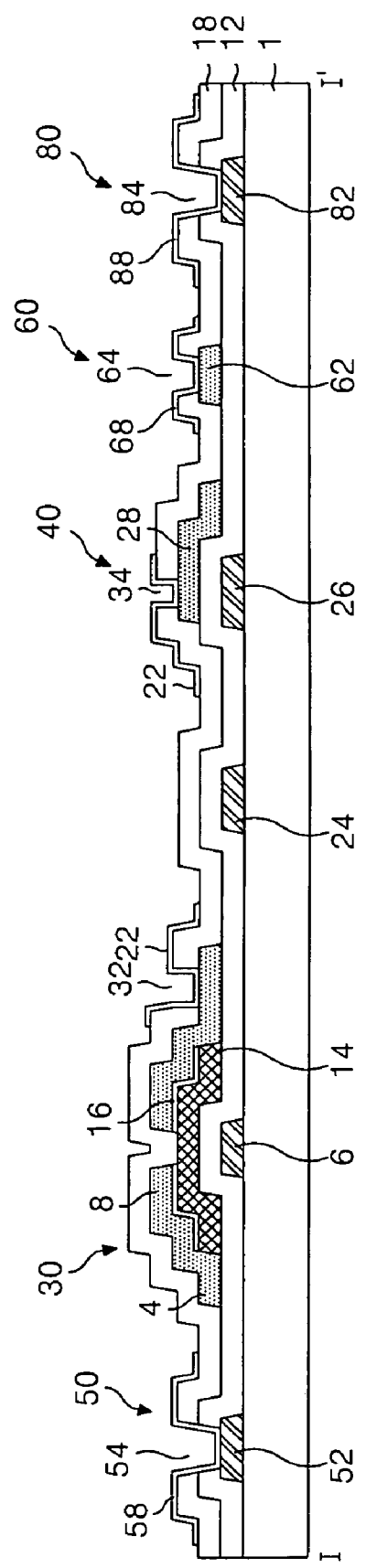
FIG. 2 is a cross-sectional view of the thin film transistor array substrate taken along line I-I' of FIG. 1, and FIG. 3A to FIG. 3J are cross-sectional views illustrating a method of fabricating the thin film transistor array substrate shown in FIG. 2.
Figure 3A:
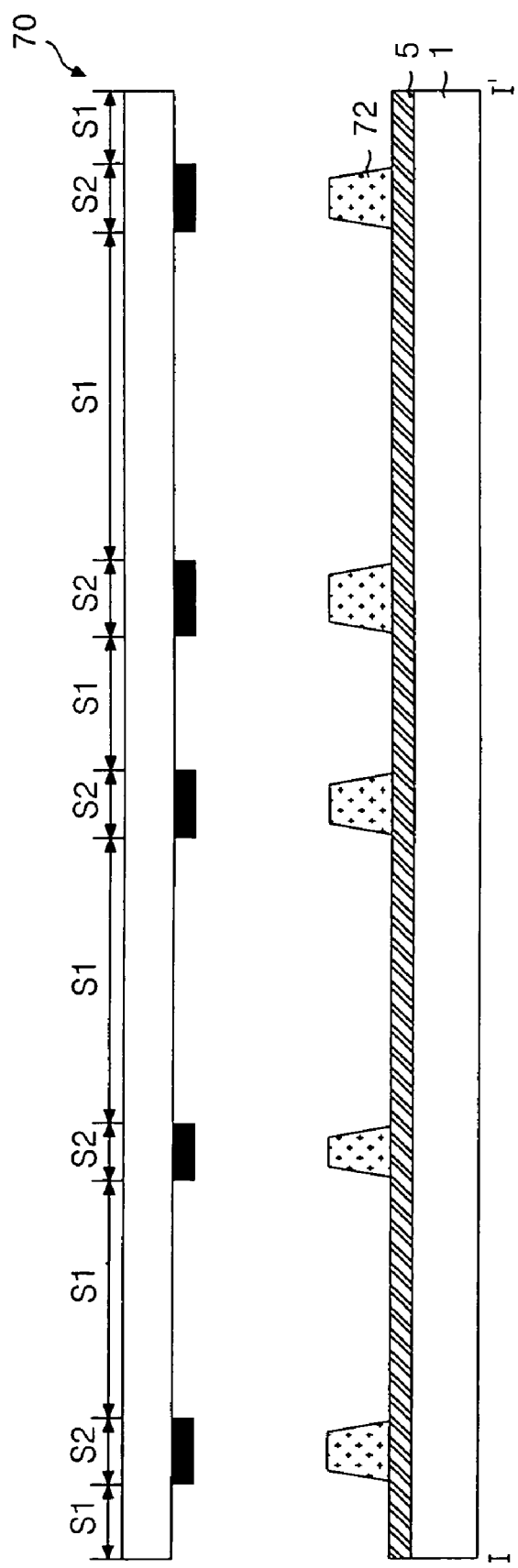
Figure 3B:
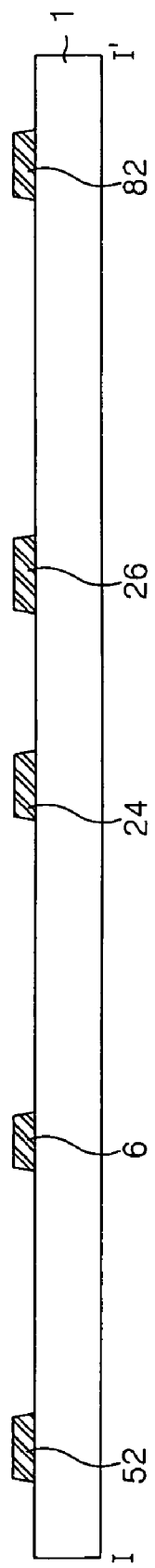
Figure 3C:
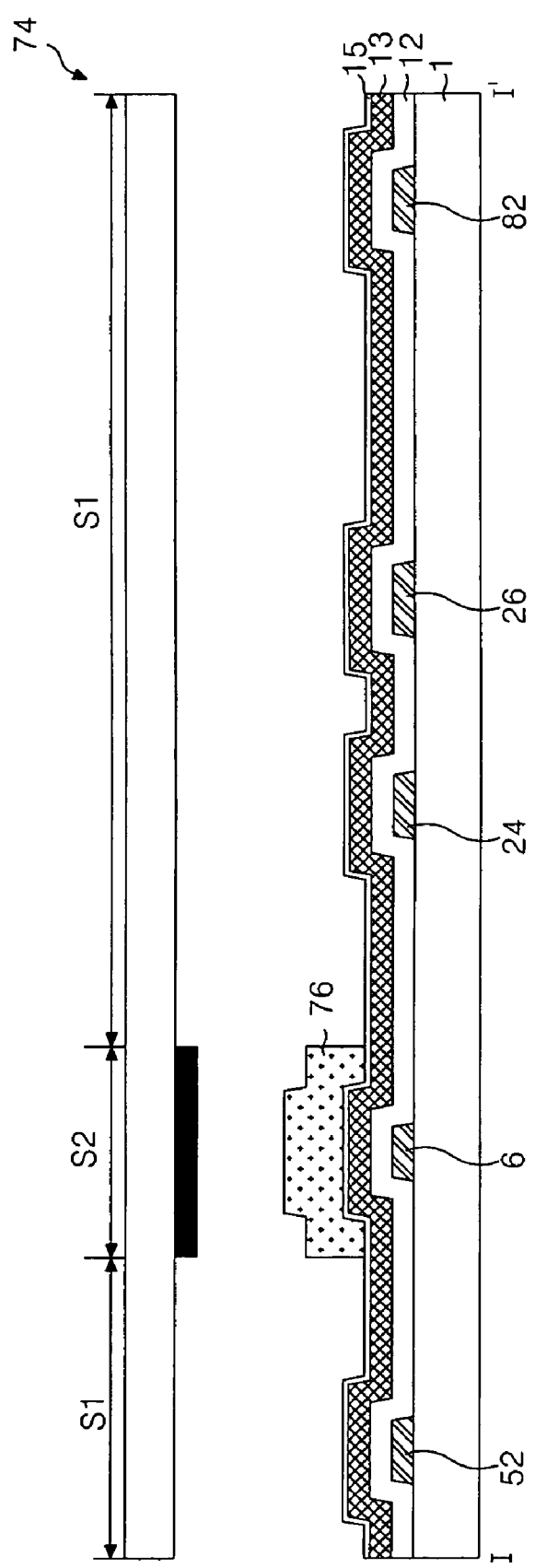
Figure 3D:
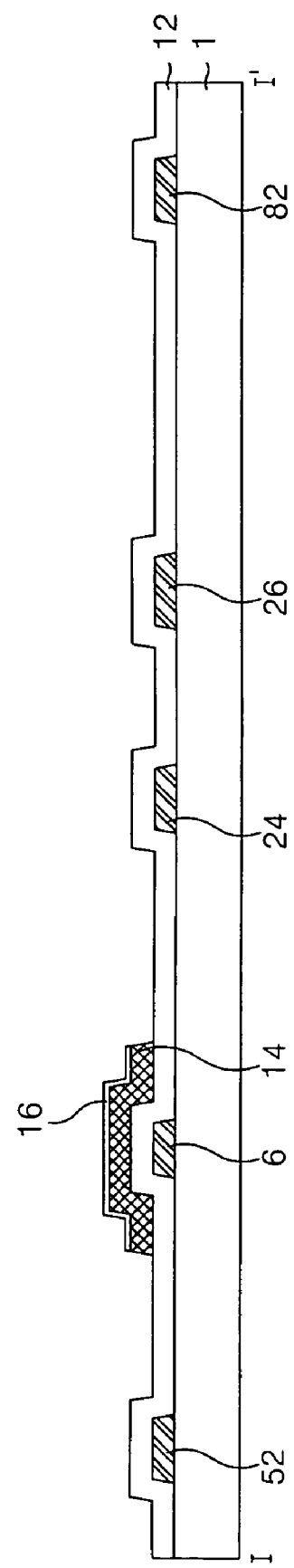
Figure 3E:
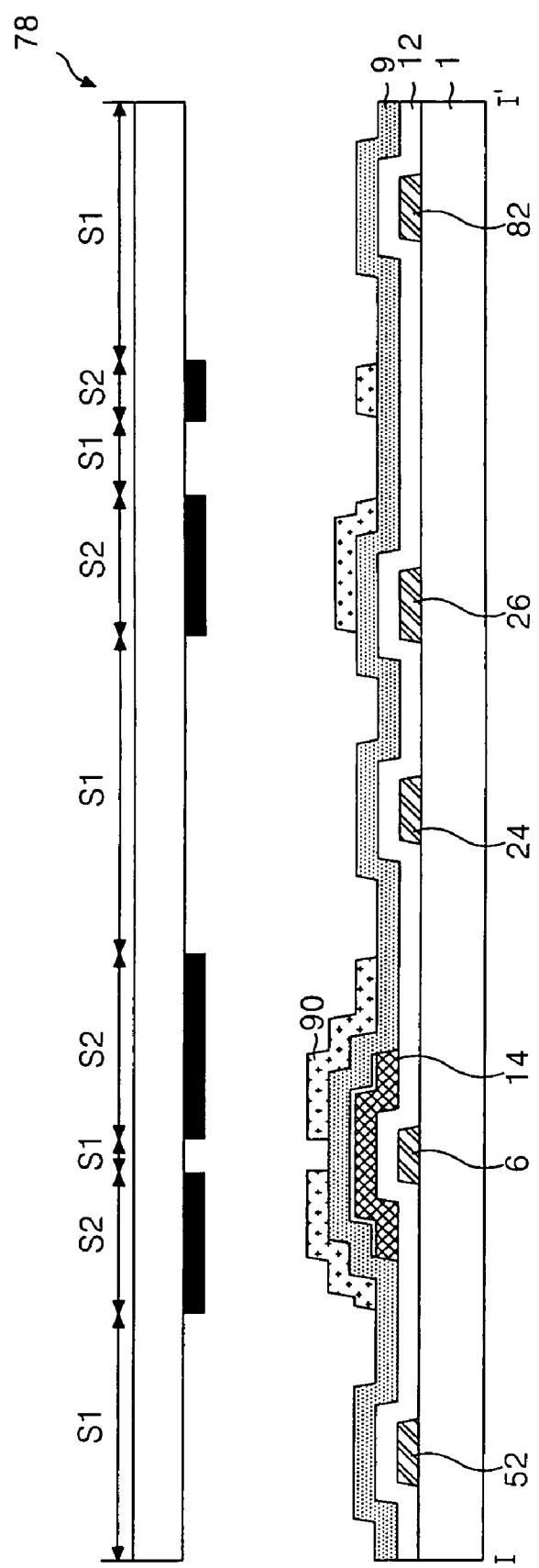
Figure 3F:
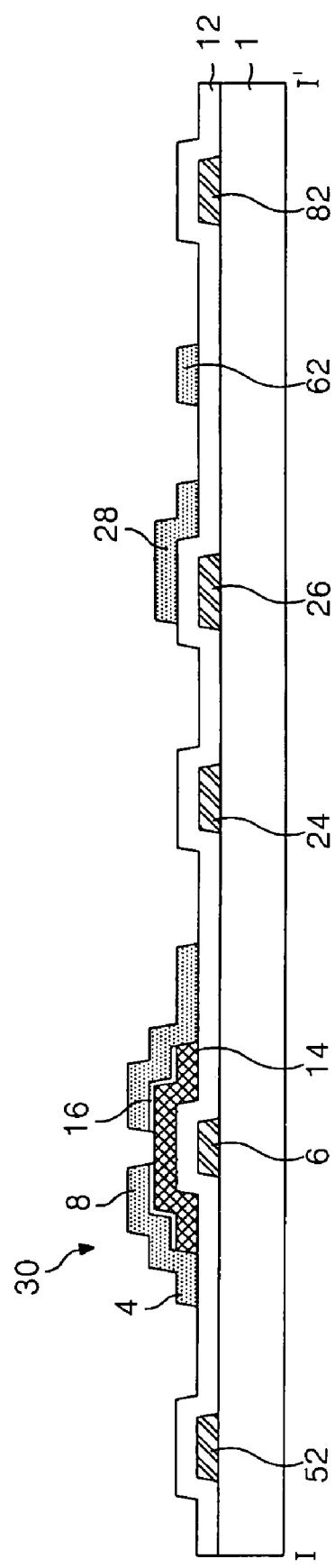
Figure 3G:
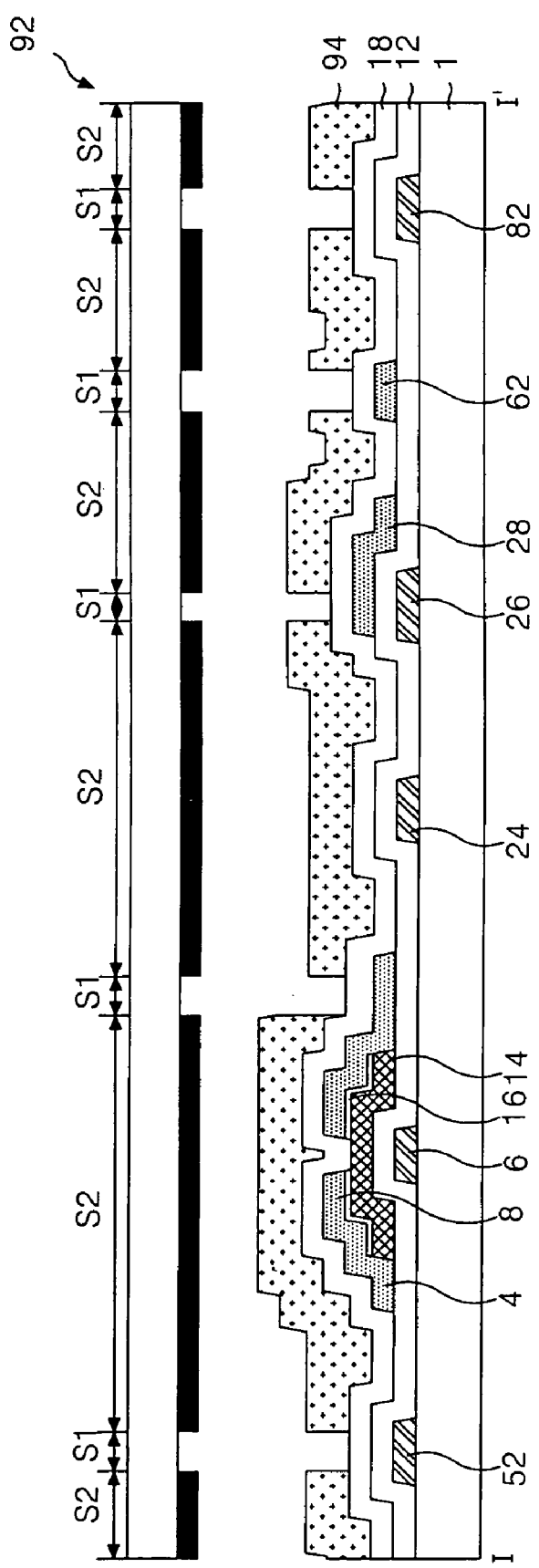
Figure 3H:
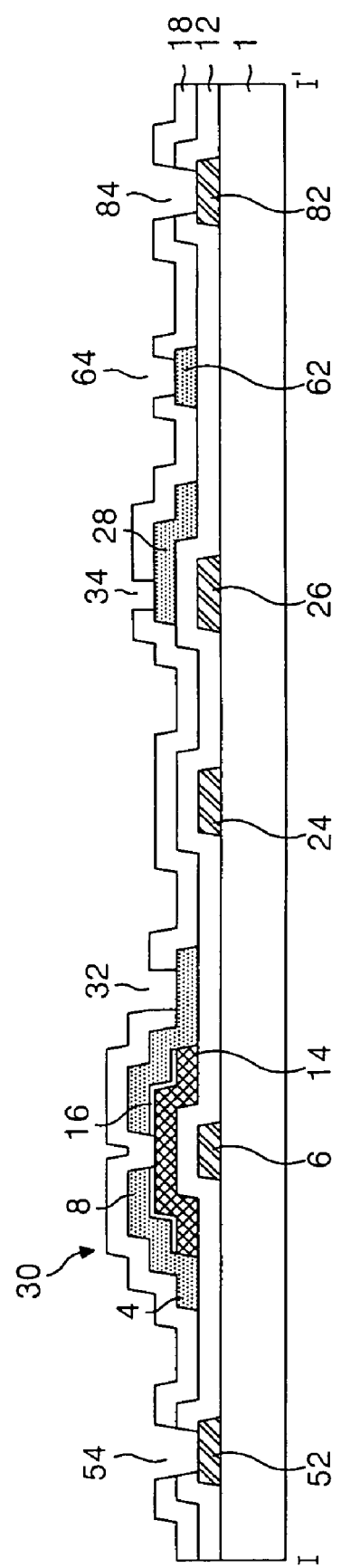
Figure 31:
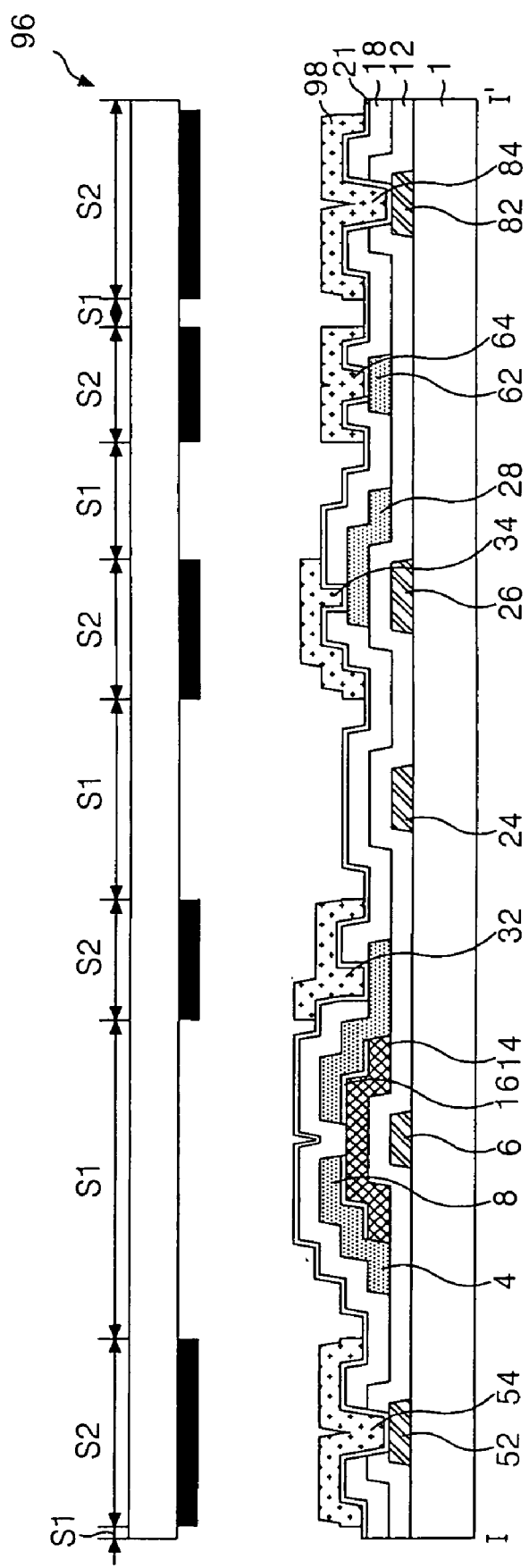
FIG. 31A and FIG. 31B are respectively a plan view and a cross-sectional view representing a semiconductor pattern formed by a second soft molding process in the method of fabricating the thin film transistor array substrate according to the fourth embodiment of the present invention.
Figure 3J:
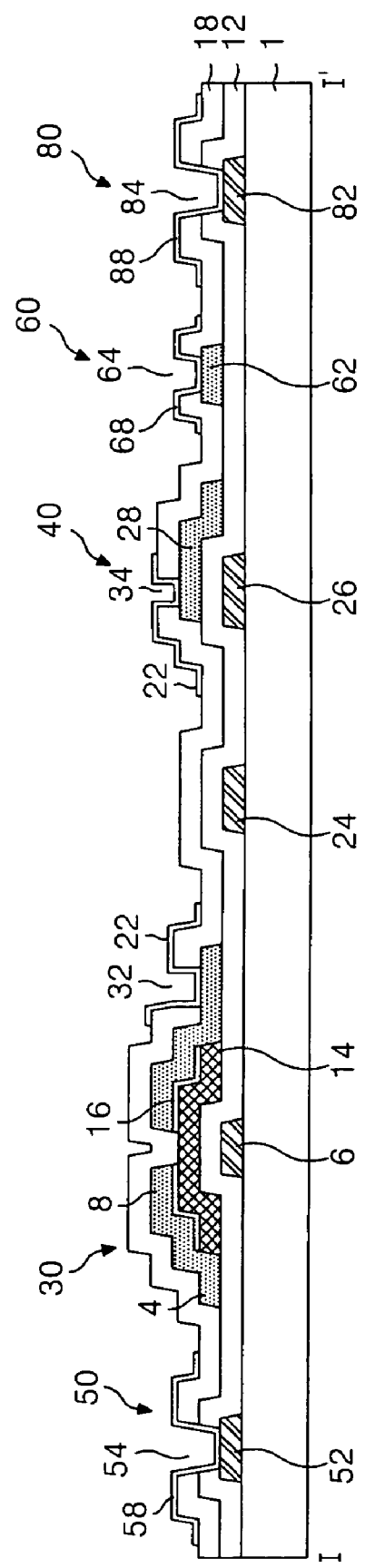
Figure 34A:
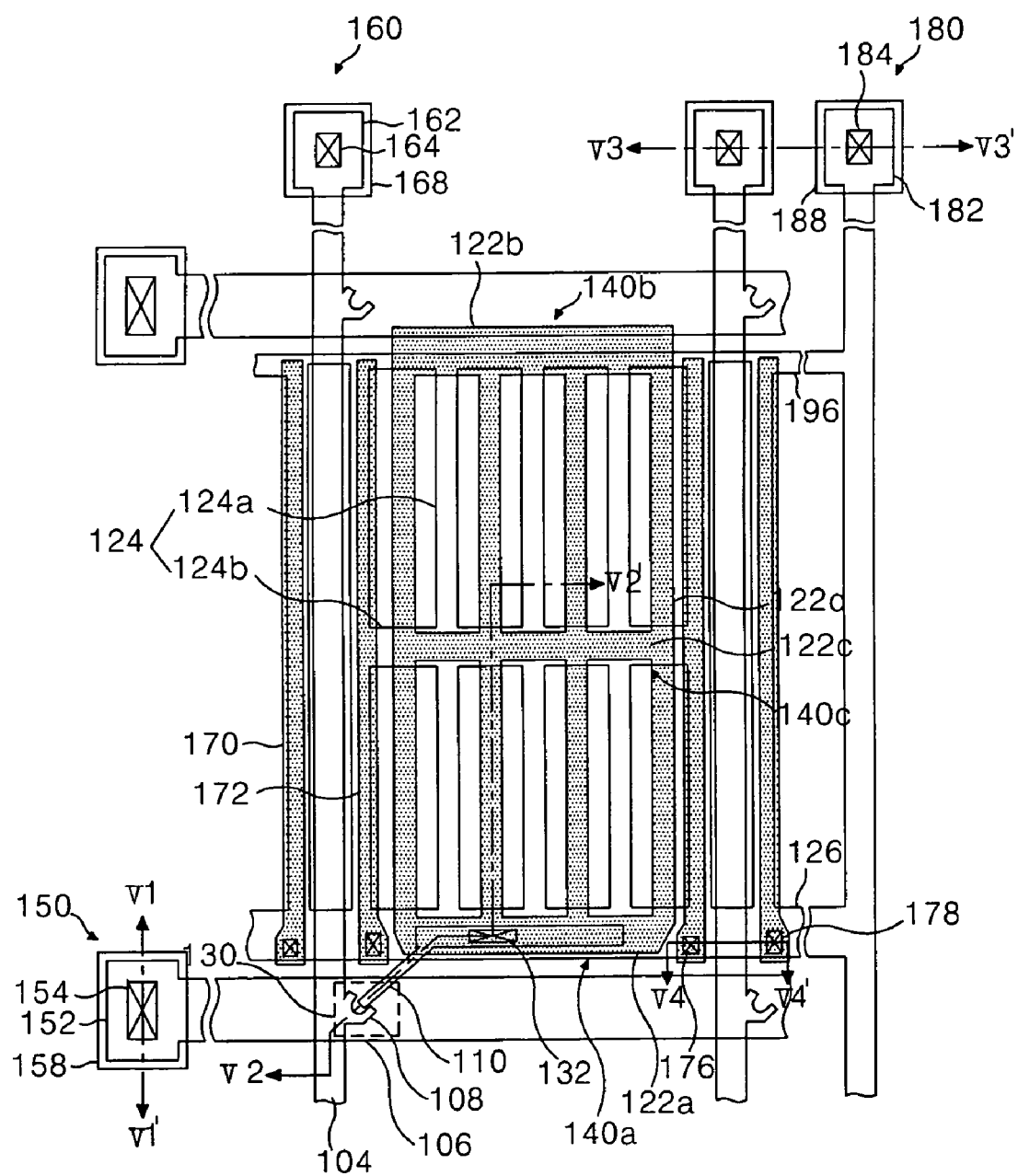
FIG. 34A and FIG. 34B are respectively a plan view and a cross-sectional view representing a third conductive pattern group formed by a fifth soft molding process in the method of fabricating the thin film transistor array substrate according to the fourth embodiment of the present invention.
Figure 34B:
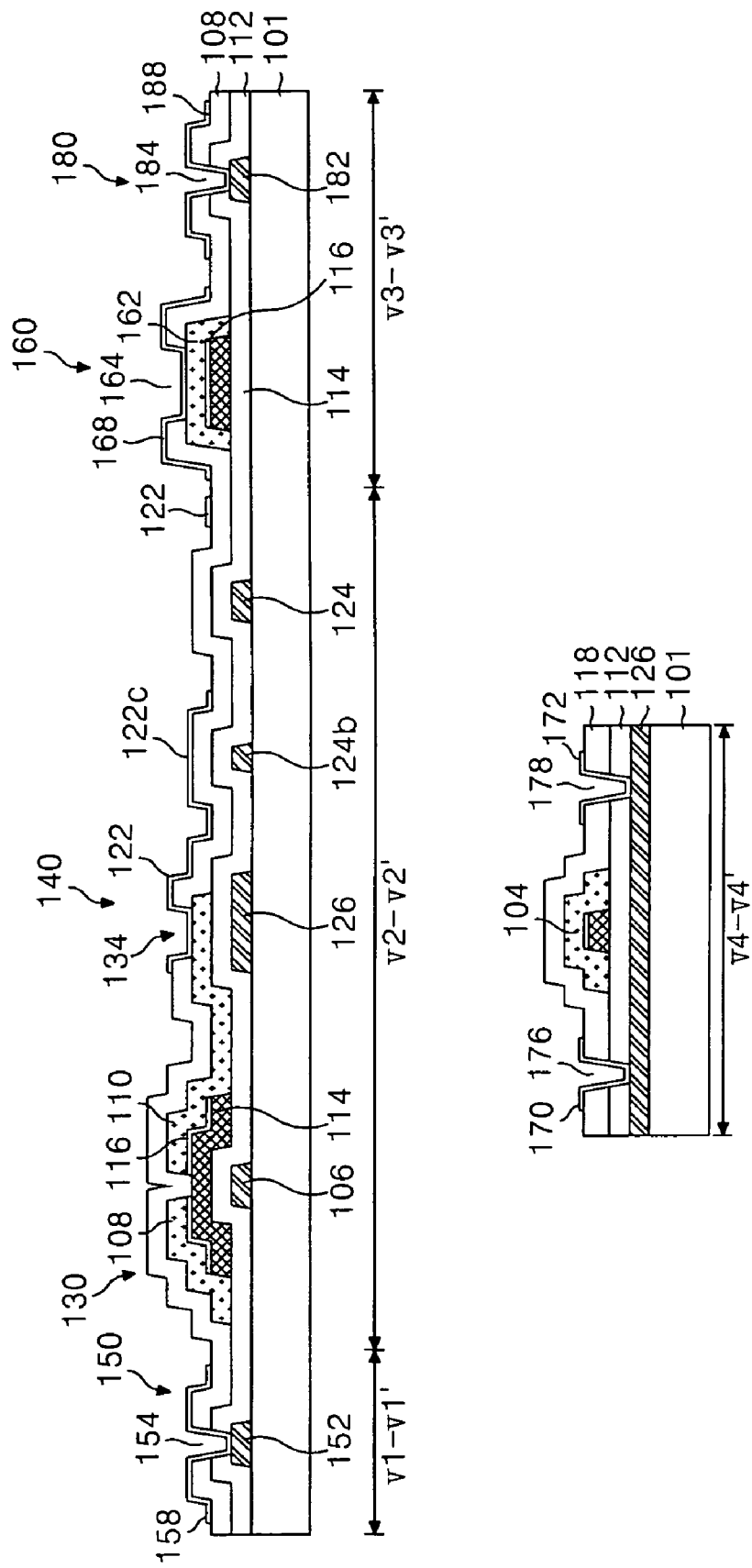

A transparent conductive film is coated onto the protective film 118 having the first to sixth contact holes 132, 154, 164, 184, 176 and 178 by a deposition technique, such as sputtering. Then, an etch resist is coated onto the transparent conductive film, and a fifth soft mold is pressed on the etch resist, thereby providing an etch resist pattern. The transparent conductive film is etched using the etch resist pattern as a mask, thereby providing a third conductive pattern group including the pixel electrode 122, the upper gate pad electrode 158, the upper data pad electrode 168, the upper common pad electrode 188 and the first and second transparent electrode patterns 170 and 172, as shown in FIG. 3A and FIG. 34B.

As described above, according to embodiments of the present invention, the thin film of the thin film transistor array substrate can be patterned with the aid of the soft mold and the etch resist without a photo process. Accordingly, expensive light-exposure equipment is not required, and the process is simplified while maintaining high precision, thereby reducing process time and improving a production yield. Furthermore, according to the present invention, a dummy pattern is provided between the patterns or other pattern is provided when a distance between adjacent patterns is wide, thereby preventing a generation of residual image. Moreover, according to the present invention, the patterns having a narrow width are formed in a mesh shape so that a signal can be easily applied to the narrow-width patterns even though a breakage is locally generated.

It will be apparent to those skilled in the art that various modifications and variations can be made in the thin film transistor array substrate and fabricating method thereof of the present invention without deportioning from the spirit or scope of the invention. Thus, it is intended that the present invention cover the modifications and variations of this invention provided they come within the scope of the appended claims and their equivalents.

What is claimed is:

1. A method of fabricating a thin film transistor array substrate, comprising the steps of:

forming a first conductive pattern group on a substrate including at least one gate electrode of a thin film transistor, at least one gate line connected to the gate electrode, a common line and a plurality of common electrodes extending in opposing directions from the common line, the common line formed across a pixel area in a direction parallel to the gate line;

forming a second conductive pattern group on the substrate including source and drain electrodes of the thin film transistor, and at least one data line crossing the gate line adjacent to the pixel area; and forming at least one pixel electrode connected to the drain electrode in the pixel area, the pixel electrode including a horizontal pixel electrode portion overlapping the common line and a plurality of vertical pixel electrode potions extending in opposing directions from the horizontal pixel electrode portion, wherein the pixel electrode is connected to the drain electrode through a contact hole formed at the horizontal pixel electrode portion.

2. The method according to claim 1, wherein a storage capacitor is formed in the overlapped portion of the horizontal pixel electrode portion, the drain electrode, and the common line.

3. The method according to claim 1, wherein the step of forming the first conductive pattern group includes the steps of:

depositing a gate metal layer on the substrate, and
    patterning the gate metal layer using a first soft mold.

4. The method according to claim 1, further comprising the steps of:

forming an amorphous silicon layer over the first conductive pattern group;
    forming an n+ amorphous silicon layer over the amorphous silicon layer; and patterning the amorphous silicon layer and the n+ amorphous silicon layer using a second soft mold to form a semiconductor pattern.

5. The method according to claim 1, wherein the step of forming the second conductive pattern group includes the steps of:
depositing a data metal layer on the substrate, and
patterning the data metal layer using a third soft mold.

6. The method according to claim 1, further comprising the step of:
forming a protective film on the substrate over the second conductive pattern group; and patterning the protective film using a fourth soft mold to form at least one contact hole through which the pixel electrode is connected to the drain electrode.

7. The method according to claim 1, wherein the step of forming the pixel electrode includes the steps of:
forming a transparent conductive film on the substrate, and
patterning the transparent conductive film using a fifth soft mold.

* * * * *